(12) United States Patent
Taylor et al.

(10) Patent No.: US 11,635,475 B2
(45) Date of Patent: *Apr. 25, 2023

(54) SYSTEMS AND METHODS FOR ASSESSING ELECTRICAL CONNECTIVITY BETWEEN ELEMENTS OF ASSAY DEVICES

(71) Applicant: ROCHE MOLECULAR SYSTEMS, INC., Pleasanton, CA (US)

(72) Inventors: Roger Harry Taylor, San Diego, CA (US); John B. Gorman, Carlsbad, CA (US); Tyler David Jensen, San Diego, CA (US)

(73) Assignee: Roche Molecular Systems, Inc., Pleasanton, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/841,515

(22) Filed: Jun. 15, 2022

(65) Prior Publication Data

US 2022/0365146 A1    Nov. 17, 2022

Related U.S. Application Data

(63) Continuation of application No. 16/995,694, filed on Aug. 17, 2020, now Pat. No. 11,391,790, which is a
(Continued)

(51) Int. Cl.
*G01R 31/68* (2020.01)
*B01L 3/00* (2006.01)

(52) U.S. Cl.
CPC ........ *G01R 31/68* (2020.01); *B01L 3/502715* (2013.01); *B01L 2200/04* (2013.01); *B01L 2200/143* (2013.01)

(58) Field of Classification Search
CPC ............... G01R 31/68; B01L 3/502715; B01L 2200/04; B01L 2200/143
(Continued)

(56) References Cited

U.S. PATENT DOCUMENTS

| 4,225,410 A | * | 9/1980 | Pace | .................... G01N 33/492 435/817 |
| 4,654,127 A | * | 3/1987 | Baker | .................... G01N 33/49 205/792 |

(Continued)

FOREIGN PATENT DOCUMENTS

DE    102005032134 A1    1/2007

OTHER PUBLICATIONS

Liang, Stephen et al., Empiric Antimicrobial Therapy in Severe Sepsis and Septic Shock: Optimizing Pathogen Clearance, Curr Infect Dis Rep., Jul. 2015, 17(7).
(Continued)

*Primary Examiner* — Christopher P McAndrew
(74) *Attorney, Agent, or Firm* — Snell & Wilmer, L.L.P.

(57) ABSTRACT

Disclosed are devices, systems and methods for assessing the integrity of electrical connections between elements of interfacing electronic devices. In some aspects, a system includes an analysis device having electronics that interface with an assay cartridge inserted into the analysis device, wherein the analysis device is configured to conduct a preflight test in which impedance values for each circuit between the assay cartridge and analysis device are rearranged and assessed to determine the electrical connection integrity of the assay cartridge to the analysis device prior to implementing the assay.

20 Claims, 40 Drawing Sheets

Related U.S. Application Data continuation of application No. 16/697,101, filed on Nov. 26, 2019, now Pat. No. 10,753,986, which is a continuation-in-part of application No. 16/448,696, filed on Jun. 21, 2019, now Pat. No. 10,564,211, which is a continuation of application No. 16/152,181, filed on Oct. 4, 2018, now Pat. No. 10,352,983.

(58) Field of Classification Search
USPC .......................................................... 324/538
See application file for complete search history.

(56) References Cited

U.S. PATENT DOCUMENTS

| | | | | |
|---|---|---|---|---|
| 5,284,568 | A * | 2/1994 | Pace | G01N 27/403 204/403.03 |
| 5,625,292 | A * | 4/1997 | Crook | G01R 31/71 324/763.01 |
| 5,781,024 | A | 7/1998 | Blomberg et al. | |
| 5,837,546 | A * | 11/1998 | Allen | G01N 33/5438 422/403 |
| 5,968,329 | A * | 10/1999 | Anderson | G01N 33/4925 204/402 |
| 6,023,961 | A * | 2/2000 | Discenzo | F16C 41/008 73/61.79 |
| 6,117,290 | A * | 9/2000 | Say | G01N 27/3271 604/181 |
| 6,244,096 | B1 * | 6/2001 | Lewis | G01N 33/0034 73/23.3 |
| 6,387,707 | B1 * | 5/2002 | Seul | H05H 3/04 422/50 |
| 6,673,533 | B1 * | 1/2004 | Wohlstadter | B01L 3/5027 436/806 |
| D669,191 | S * | 10/2012 | Handique | D24/225 |
| 8,614,087 | B2 * | 12/2013 | Drader | G01N 33/5302 435/6.1 |
| 8,709,787 | B2 * | 4/2014 | Handique | C12Q 1/686 422/537 |
| 9,254,489 | B2 * | 2/2016 | Lin | F16K 99/0015 |
| 9,498,778 | B2 | 11/2016 | Corey et al. | |
| 9,598,722 | B2 * | 3/2017 | Wright | B01F 27/11251 |
| 9,601,879 | B1 * | 3/2017 | Lin | H01R 13/7032 |
| 9,957,553 | B2 | 5/2018 | Kayyem et al. | |
| 10,184,884 | B2 * | 1/2019 | Anderson | B29C 70/504 |
| 2002/0107647 | A1 * | 8/2002 | Anderson | G06F 30/367 702/65 |
| 2002/0137238 | A1 * | 9/2002 | Mockel | G01R 31/68 438/17 |
| 2004/0009607 | A1 * | 1/2004 | Goodman | G01N 21/00 436/164 |
| 2004/0101191 | A1 * | 5/2004 | Seul | G06T 7/33 382/128 |
| 2004/0189311 | A1 * | 9/2004 | Glezer | B01L 9/527 324/444 |
| 2006/0192015 | A1 * | 8/2006 | DiGiovanna | G01R 31/68 235/472.02 |
| 2007/0143313 | A1 | 6/2007 | Cotner | |
| 2009/0117571 | A1 * | 5/2009 | Solanki | G01N 33/5438 435/287.2 |
| 2010/0010602 | A1 | 1/2010 | Wedan et al. | |
| 2010/0028984 | A1 * | 2/2010 | Duong | G01N 21/6452 435/287.2 |
| 2010/0084270 | A1 | 4/2010 | Vulto | |
| 2010/0106206 | A1 * | 4/2010 | Aghassian | A61N 1/37 607/2 |
| 2011/0160808 | A1 | 6/2011 | Lyden et al. | |
| 2011/0201099 | A1 * | 8/2011 | Anderson | G01N 1/10 422/68.1 |
| 2011/0269239 | A1 * | 11/2011 | Diessel | G01N 35/028 422/63 |
| 2012/0038477 | A1 * | 2/2012 | Torgerson | G16H 40/67 340/657 |
| 2012/0178091 | A1 * | 7/2012 | Glezer | B01L 7/525 435/6.12 |
| 2012/0182562 | A1 * | 7/2012 | Yang | G01R 31/68 356/614 |
| 2012/0282602 | A1 * | 11/2012 | Drader | G01N 33/5302 436/164 |
| 2013/0130369 | A1 * | 5/2013 | Wilson | G01F 23/26 435/289.1 |
| 2013/0257625 | A1 * | 10/2013 | Hoile | G08B 21/18 340/687 |
| 2014/0125352 | A1 * | 5/2014 | Franke | H01R 12/716 439/489 |
| 2014/0154792 | A1 * | 6/2014 | Moynihan | G01N 33/5302 422/69 |
| 2014/0170735 | A1 * | 6/2014 | Holmes | G01N 21/76 435/287.1 |
| 2014/0273187 | A1 | 9/2014 | Johnson et al. | |
| 2014/0322706 | A1 | 10/2014 | Kayyem et al. | |
| 2015/0087559 | A1 * | 3/2015 | Putnam | B01L 3/502761 422/502 |
| 2015/0184235 | A1 * | 7/2015 | Reda | B01L 3/502715 506/9 |
| 2015/0323555 | A1 | 11/2015 | Kayyem et al. | |
| 2015/0331037 | A1 * | 11/2015 | Liu | G01R 31/68 324/750.25 |
| 2016/0097764 | A1 * | 4/2016 | Taslim | G01N 1/286 422/82.01 |
| 2016/0130640 | A1 * | 5/2016 | Wright | B01L 7/525 435/306.1 |
| 2016/0169956 | A1 * | 6/2016 | Kim | G01R 31/68 307/125 |
| 2018/0095054 | A1 | 4/2018 | Huo et al. | |
| 2018/0095100 | A1 * | 4/2018 | Nguyen | G01N 35/00871 |
| 2018/0126381 | A1 * | 5/2018 | Huff | G01N 27/44721 |

OTHER PUBLICATIONS

Locharla et al., "Variable length mixed radix MDC FFT/IFFT processor for MIMO-OFDM application" IET Comput. Digit. Tech, 12(1) 9-19 (2018).

Sipherd, "The third-leading cause of death in US most doctors don't want you to know about" CNBC: Modern Medicine, Feb. 22, 2018, available at https://www.cnbc.com/2018/02/22/medical-errors-third-leading-cause-of-death-in-america.html.

Supplementary Search Report dated Mar. 25, 2022 in European Patent Application No. 19869371.5.

* cited by examiner

300

| Block 1 | Block 2 | Block 3 | ... | Block n |

|  | PP Block 1 | PP Block 2 | PP Block 3 | PP Block 4 | PP Block 5 |
| --- | --- | --- | --- | --- | --- |
| Block 1 | 10 | 20 | 14 | 130 | 11 |
| Block 2 | 30 | 15 | 17 | 14 | 47 |
| Block 3 | 2 | 44 | 80 | 18 | 48 |
| Block 4 | 120 | 16 | 84 | 66 | 56 |
| Block 5 | 111 | 120 | 16 | 90 | 78 |

| Block #1 | PP Block 1 | PP Block 2 | PP Block 3 | PP Block 4 | PP Block 5 |
| --- | --- | --- | --- | --- | --- |
| RM # | 2 | 2.3 | 3.1 | 1.5 | 1.7 |
| EM # | 2 | 2.4 | 2.5 | 2.5 | 3.8 |
| QOF # | 9 | 8 | 10 | 5 | 7.5 |

| Block #1 | PP Block 1 | PP Block 2 | PP Block 3 | PP Block 4 | PP Block 5 |
| --- | --- | --- | --- | --- | --- |
| Affinity # | 1 | 2 | 3 | 4 | 5 |

FIG. 30

SYSTEMS AND METHODS FOR ASSESSING ELECTRICAL CONNECTIVITY BETWEEN ELEMENTS OF ASSAY DEVICES

CROSS-REFERENCE TO RELATED APPLICATIONS

The application is a continuation of U.S. patent application Ser. No. 16/995,694, which is a continuation of U.S. patent application Ser. No. 16/697,101, filed on Nov. 26, 2019, now U.S. Pat. No. 10,753,986, which is a continuation-in-part of U.S. patent application Ser. No. 16/448,696 filed on Jun. 21, 2019, now U.S. Pat. No. 10,564,211, which is a continuation of U.S. patent application Ser. No. 16/152,181 filed on Oct. 4, 2018, now U.S. Pat. No. 10,352,983. The entire content of the aforementioned patent application is incorporated by reference as part of the disclosure of this patent document for all purposes.

TECHNICAL FIELD

This patent document relates to medical devices and, more particularly, to medical devices for the detection and/or analysis of target analytes from patient samples.

BACKGROUND

Preventable medical errors are now the third leading cause of death in the United States at more than 250,000 per year. For example, preventable medical errors can arise when automated detection systems for nucleic acid or other biomolecular testing do not perform accurately. But, placing strict controls on detection systems may prevent valid sample from being processed resulting in waste and time delay. This can lead to serious problems for a patient whose sample must be analyzed rapidly. For example, critical time could be lost to obtain new samples from the patient and re-run a test. In some cases, such a delay can be deadly, such as for detection systems which detect organisms that cause sepsis. Recent studies have shown that patients with severe sepsis or septic shock showed an increased likelihood of death of 7.6% for every hour in which antibiotic therapy is not applied, such as shown in Liang et al., *Empiric Antimicrobial Therapy in Severe Sepsis and Septic Shock: Optimizing Pathogen Clearance*, Curr Infect Dis Rep. 2015 July; 17(7): 493. Survival rates could increase if detection systems performed accurately.

SUMMARY

Disclosed are devices, systems and methods for assessing the integrity of electrical connections between elements of interfacing electronic devices, such as between circuits of different components, modules, units or apparatuses of an assay device for detecting a target analyte, which can include electrical connections between an assay cartridge and an instrument bay of the assay device. Assessing the integrity of electrical connections between interfacing electronic devices could increase validity rates of assay devices for detecting target analytes, which may help to reduce preventable medical error and save lives.

In some implementations, an assay test cartridge is initially inserted into analysis device and pre-examined before implementing an assay. Impedance values for one or more electrodes on the assay test cartridge are measured to generate a working impedance value (WIV) for each of the one or more electrodes. The working impedance values are then ordered to match at least one impedance reference order (RO). The RO can be determined based on a statistically representative distribution of the impedance values derived from devices of the same type as the working device. A quality of the fit (QOF) is then determined and used for validating the integrity of the assay cartridge. For example, if the quality of the fit (QOF) is above a predetermined threshold, a pass signal is generated, and the cartridge is processed by the medical device instrument; whereas, if a cartridge fails such preflight impedance testing, it is ejected and can be re-tested in the same bay or in a different bay.

In some example embodiments in accordance with the disclosed technology, a method for assessing electrical connection integrity of an assay cartridge interfaced with an assay processing device includes establishing an electrical connection between the assay cartridge and the assay processing device; measuring electrical signals to determine impedance values associated with at least two circuits between the assay cartridge and the assay processing device; organizing the impedance values to form a new data stream; analyzing the new data stream to determine a quality factor; and sending a command signal for initiating an assay procedure when the quality factor is at or above a predetermined standard.

In some example embodiments in accordance with the disclosed technology, a method for assessing electrical connection integrity of a first device and second device includes establishing an electrical connection between the first device and second device; measuring electrical signals to determine a first data block associated with at least three electrodes on the first device; organizing the first data block to form a second data block; analyzing the second data block according to a first factor; and sending a signal for initiating a procedure when the first factor is at or above a predetermined standard.

In some example embodiments in accordance with the disclosed technology, an assay processing device for assaying a patient sample, including an electronic unit that interfaces with a printed circuit board (PCB) on an assay cartridge, an impedance module, a pattern module, and a qualifier module.

In some example embodiments in accordance with the disclosed technology, an assay processing device including (i) an electronic unit that interfaces with an assay cartridge when inserted in the assay processing device, wherein the electronic unit includes a plurality of electrical conductor sites to contact at least some of a plurality of electrical interface connections of the assay cartridge, and (ii) a data processing unit to control functionality of the assay processing device and/or process acquired data to produce an output for the assay processing device, wherein the assay processing device is configured to conduct a preflight test assessing electrical connection integrity of the assay cartridge with the electronic unit, wherein, in conducting the preflight test, the assay processing device measures an electrical signal to determine an impedance value associated with at least some of the electrodes of the assay cartridge; analyzes the determined impedance value to evaluate a quality factor (also referred to as a QOF factor) of the electrical connection between the assay cartridge and the electronic unit of the assay processing device; and determines a command for initiating an assay procedure when the quality factor is at or above a predetermined standard, or determines a command for ejecting the assay cartridge from the assay processing device when the quality factor is below the predetermined standard.

In some example embodiments in accordance with the disclosed technology, a method for preflight test assessing electrical connection integrity of an assay cartridge interfaced with an assay processing device includes establishing an electrical connection between (i) an assay cartridge including a printed circuit board (PCB) having a plurality of electrical interface connections corresponding to a plurality of electrodes in the PCB and (ii) an electronic unit of an assay processing device, wherein the electronic unit includes a plurality of electrical conductor sites to contact at least some of the plurality of electrical interface connections of the assay cartridge PCB; measuring an electrical signal to determine an impedance value associated with at least some of the electrodes of the assay cartridge PCB; analyzing the determined impedance value to evaluate a quality factor of the electrical connection between the assay cartridge PCB and the electronic unit of the assay processing device; and determining a command for initiating an assay procedure when the quality factor is at or above a predetermined standard, or determining a command for ejecting the assay cartridge from the assay processing device when the quality factor is below the predetermined standard.

The subject matter described in this patent document can be implemented in specific ways that provide one or more of the following features.

BRIEF DESCRIPTION OF THE DRAWINGS

FIG. 27 shows a diagram of an example data block sequence of n data blocks formed into an array in accordance with the disclosed technology.

FIG. 28 shows a diagram of an example an affinity matrix formed in accordance with the disclosed technology.

FIG. 29 shows a diagram of an example an affinity matrix derived from the affinity matrix shown in FIG. 28.

FIG. 30 shows a diagram of an example an affinity relationship matrix derived from the affinity matrix shown in FIG. 29.

DETAILED DESCRIPTION

Figure 1:
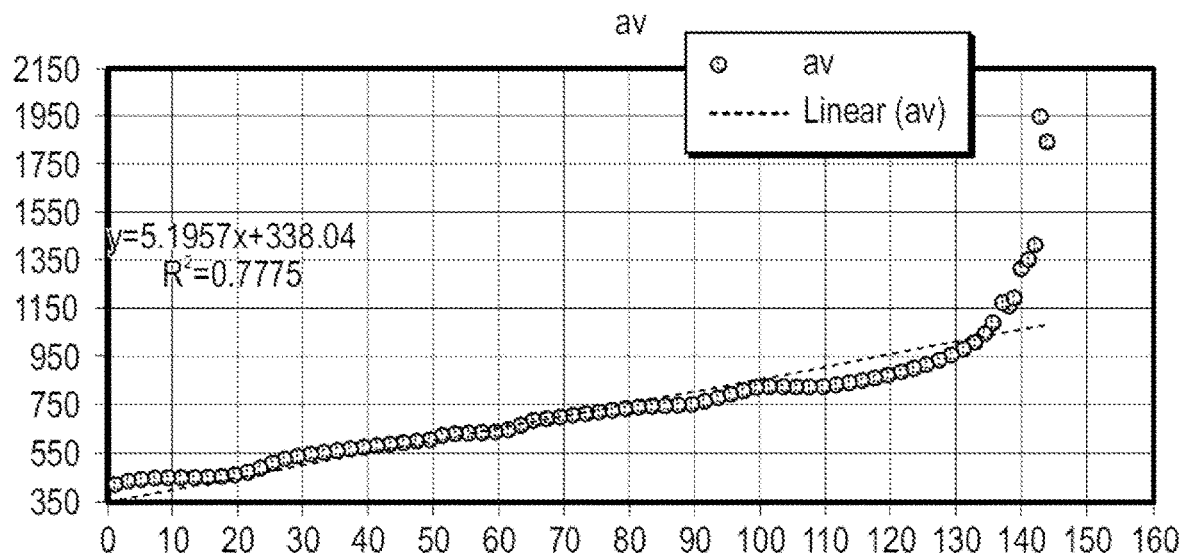
FIG. 1 shows a data plot depicting the average impedance for electrodes on PCBs of assay cartridges run in TTM-2 bays and plotted monotonically.

During the past decade or so, there has been great interest in developing microfluidic based devices, often referred to as Lab-on-a-Chip (LoC) or Micro Total Analysis Systems (μTAS), with goals of minimal reagent usage, shorter measurement turnaround time, lower experiment cost, and higher data quality, etc. Microfluidics device technology finds applications in printing, fuel cell, digital display, and life sciences, etc.

Microfluidics technology can be broadly categorized into channel-based continuous-flow systems, including droplets-in-microfluidic-channel systems or droplet actuators on electrowetting systems. Droplet actuators are used to conduct a wide variety of droplet operations. For example, a droplet actuator typically includes two plates separated by a gap. The plates include electrodes for conducting droplet operations. The space can be filled with a filler fluid that is immiscible with the fluid that is to be manipulated on the droplet actuator. The formation and movement of droplets are controlled by electrodes for conducting a variety of droplet operations, such as for droplet transport and droplet dispensing. One or both of the plates of the droplet actuator may be manufactured using a printed circuit board (PCB). The functionality of the droplet actuator is dependent on, for example, the electrical connection made between the PCB and the working device.

An assay is an analysis performed to determine the presence or amount of a substance of interest. Some assay techniques utilize microfluidics for transporting, mixing, and/or processing various fluids in the assay, including samples containing the target substance of interest. A microfluidic device is an instrument that can control the behavior of very small amounts of fluid (e.g., such as μL, nL, pL, and fL) through channels with dimensions in relatively small dimensions, e.g., the sub-millimeter range. Microfluidic devices can be implemented to obtain a variety of analytical measurements including molecular diffusion values, chemical binding coefficients, pH values, fluid viscosity, molecular reaction kinetics, etc. Microfluidic devices can be built on microchips to detect, separate and analyze biological samples, which can also be referred to as a lab-on-a-chip. For example, a microfluidic device may use biological fluids or solutions containing cells or cell parts to diagnose diseases.

Some assay devices, such as some automated electrochemical detection systems for nucleic acid or other biomolecular testing, include (a) an instrument bank that includes one or more cartridge bays having electronics that interface with an assay cartridge (also referred to as a biochip cartridge) inserted in the bay for analyzing a sample provided in the biochip cartridge, and (b) a base station that includes a processing unit to control functionality of the assay device and/or process the acquired data to produce an output for the electrochemical detection-based assay. The base station can include a user interface (e.g., display). In some implementations, the instrument bank and the base station are embodied in a single housing, whereas in other implementations the instrument bank and base station are embodied as separate or separable devices.

In some examples, a cartridge bay can include (i) an upper region comprising actuators for manipulating a liquid reagent module (LRM); and (ii) a lower region comprising a printed circuit board (PCB) having electrical connections for connecting to the biochip cartridge. Some examples of an analysis cartridge bays and base stations are described in U.S. Pat. Nos. 9,598,722 and 9,957,553, which are herein incorporated by reference in their entirety for all purposes.

In some examples, an assay (biochip) cartridge can include (i) an upper region comprising a liquid reagent module (LRM); and (ii) a lower region comprising a printed circuit board (PCB) having electrical connections for connecting to a bay and electrowetting grid and detection electrodes. Some examples of an analysis cartridge are described in U.S. Pat. Nos. 9,598,722 and 9,957,553, which are herein incorporated by reference in their entirety for all purposes.

If the electrical connections between the analysis device and cartridge do not properly connect to provide the proper signal paths in the electrowetting grid and detection electrodes on the cartridge PCB, the assay device cannot properly process the biochip cartridge and an invalid test result may be reported. Some examples of such automated electrochemical detection systems are described in U.S. Pat. Nos. 9,598,722 and 9,957,553, which are herein incorporated by reference in their entirety for all purposes.

Some examples of implementing an assay (also referred to as "processing the cartridge" or "launching the assay" or "running an assay" or "perform an assay") include one or more of the following assay processing steps: cell lysis, amplification, and detection. In various embodiments, detection is dependent on detection of color, radioactivity, fluorescence, chemiluminescence or electrochemical signals, such as in an automated electrochemical detection system. While the systems and methods are not limited to a specific cartridges/assays, exemplary processing steps are described in U.S. Pat. Nos. 9,598,722 and 9,957,553, which are herein incorporated by reference in their entirety.

In some implementations, when a biochip cartridge is loaded into the instrument bay of an analysis device, it makes contact with the bay via pogo pins. In this way, the bay can transmit data, control signals, and power to the cartridge PCB, and the cartridge PCB can transmit data to the bay. The pogo pins make electrical contact with the cartridge PCB. An example of such electrical connections using pogo pins is shown in FIG. 43 of U.S. Pat. No. 9,498,778 and FIG. 29 of U.S. Pat. No. 9,957,553, which are herein incorporated by reference in their entirety for all purposes. In some implementations, the electronics of the bay portion of the instrument bay includes a PCB that serves as a mounting surface for the circuit assembly on the insertable biochip cartridge.

Typically, when PCBs are manufactured, the electrodes are tested. Generally, the integrity of the printed circuit board is assessed based on whether the electrical connector, such as a pin or solder pad, is properly connected to an electrical signal path on the circuit assembly. For example, a PCB is tested to evaluate if the electrical connector is properly soldered to the signal path or wire trace. An improperly soldered electrical connector may result in an open circuit or a short circuit on the PCB. But, this type of testing does not measure whether there is a proper "fit" between the electronics of a cartridge for an analysis device and the electronics of the analysis device. Moreover, this type of testing also does not account for bay-to-bay variability in baseline or actual assay measurements acquired at the instrument bank of an assay device. These improper "fit" issues and bay-to-bay variability problems result in an "invalid" output, or worse, result in testing errors such that an infecting pathogen may possibly go undetected, e.g., leading to false negative results.

Thus, after a cartridge is loaded into an analysis device, the analysis device should perform a preflight test to confirm that the analysis device and cartridge are properly connected before launching the assay. A pre-flight test evaluates whether the assay cartridge is properly connected to the automated electrochemical detection system. For example, if even one electrode on the assay cartridge is not properly connected to the automated electrochemical detection system, the detection system's ability to process the sample and accurately detect an infection is hampered. Accurately catching runs with poor connections in a preflight connection analysis allows a retry of the cartridge before the sample is consumed by processing the assay, potentially increasing validity rates and preserving samples. For example, failure to conduct a preflight test to confirm that the electrical connections between the bay and cartridge (e.g., at the PCB) are properly connected could result in an assay being performed, but knowingly or unknowingly fail, e.g., because one or more electrical connections between the bay and cartridge are improper. Failure of the assay may occur in many forms. For example, the sample may not move properly in the microfluidic channels or nodes in the cartridge, may improperly mix, may suffer improper amplification and/or detection, and thereby produce a failed test result or an incorrect result (e.g., false negative).

In some implementations, a preflight test includes measurements of the impedances of the bay's electrical connections to the cartridge. One method to evaluate the connection between an assay cartridge and an analysis device is to run an impedance test and compare the impedance measurement to a predetermined threshold (referred to as the impedance threshold method). However, Applicants have discovered that the variation of trace impedance between two analysis devices can be significant because of bay-to-bay variability, cartridge-to-cartridge variability, along with measurement variability. This variability can lead to assay cartridges with poor connections being processed leading to incorrect results (e.g., false negatives or invalids).

In some examples, the pre-flight impedance measurements are scattered data, e.g., the impedance value from electrode 1 bears no relation to the impedance value from electrode 2. As such, the impedance measurements must be compared against expected ranges for each electrode (e.g., electrode 1 compared to expected data for electrode 1, and electrode 2 compared to expected data for electrode 2). For example, an impedance measurement reported at a higher value than expected may occur due to a poor connection to an electrode resulting from an "open" circuit connection, and an impedance measurement reported at a lower value than expected may occur due to a poor connection to an electrode resulting from an "short" circuit connection. If any measurement indicates a poor connection, the bay should not start the assay in that bay. This ensures that sample is not wasted on a run which cannot produce a valid result. For example, the problem may be due to a user error in inserting the cartridge into the bay; the cartridge may be pre-flight tested again upon a repeated insertion into the bay. Or for example, since the problem may be due to the electronics of that bay, the cartridge which was not processed can be loaded and retested in another bay of the instrument bank.

When a PCB is loaded into a testing device, it cannot be assumed that it is loaded and connected properly each time. For example, impedance measurements during pre-flight analysis of the cartridges have significant target impedance variability. In this context, the term "target" is used because, in reality, some amount of variation around the nominal impedance occurs due to process variations in the manufacture of the bay and the PCBs and loading techniques. Currently, such impedance variations may be controlled to within +/−10% of the target impedance. Applicants discovered that the target/impedance limit changed over the course of the year. In some cases, for example, the upper and lower limit widened and in other cases they narrowed (data not shown).

However, relying on "target" impedance measurements has proven to be prone with false failures and false passes because of bay-to-bay variability, cartridge-to-cartridge variability, along with measurement variability. For example, a good connection between one cartridge/bay pair may produce an impedance measurement that is equal to an impedance measurement from another cartridge/bay pair with a poor connection. Thus, the connection between a cartridge/bay may be characterized as good or poor if a different bay, a different cartridge, or a different cartridge and different bay are used. This inaccuracy has allowed runs with poor connections to be processed and has prevented runs with good connections from being processed, e.g., resulting in waste, time delay, and increased risk to the patient. Accurately catching runs with poor connections in a preflight connection analysis allows a retry of the cartridge before the sample is consumed by processing the sample, potentially increasing validity rates and preserving samples.

Disclosed are devices, systems and methods for assessing the integrity of electrical connections between elements of interfacing electronic devices. The disclosed methods can be implemented by a variety of electronic systems that electrically interface different circuits, electronic components, modules, units or apparatuses. While implementations of the disclosed technology are suitable for a variety of applications, the following disclosure describes several embodiments of the disclosed methods, systems and devices for assay systems capable of detecting a target analyte, which include assessing the electrical connections between an assay cartridge and an instrument bay of the assay device.

Example embodiments and implementations of the devices, systems and methods are described for an automated electrochemical detection assay device to characterize the impedance of electrical connections corresponding to an electrode of an assay sample cartridge and an electrode of an assay processing bay of an analysis device. In some implementations, the characterized impedance of the electrical connections between the electrodes of the analysis device and cartridge is used to determine whether to conduct the assay using the sample cartridge in the processing bay. In some implementations, the characterized impedance of the electrical connections between the electrodes of the analysis device and cartridge is used to affect the implementation of the assay, e.g., such that only cartridge/bay pairs with good connections are processed, and assays associated with cartridge/bay pairs characterized with bad connections are not started. For example, implementations of the disclosed technology are envisioned to produce higher validity rates for assays, which in turn can result in better patient care. The disclosed technology can be used in life science related fields, the immediate applications include drug screening, medical diagnostics, environmental monitoring, and pandemics prevention, etc.

In some embodiments, the disclosed methods include a self-order process evaluation (SOPE) method for assessing the integrity of electrical connections. In some implementations of the SOPE method, for example, a first electronic device (e.g., an assay cartridge) is interfaced with a second electronic device (e.g., analysis device), in which the impedance between an electrode or electrodes of the first and the second electronic device is measured. The impedance values are ordered from lowest to highest or highest to lowest (e.g., plotted monotonically), e.g., to form a straight line. The monotonically plotted impedance values are then analyzed to see if they fit predefined parameter(s). For example, if there is sufficient fit to the predefined parameter(s), the method allows the electronic device (e.g., cartridge) to be processed; if not, the device is ejected.

In some embodiments, the disclosed methods include a reference-order process evaluation (ROPE) method for assessing the integrity of electrical connections. In some implementations of the ROPE method, for example, a first electronic device (e.g., an assay cartridge) is interfaced with a second electronic device (e.g., analysis device), in which the impedance between an electrode or electrodes of the first and the second electronic device is measured. The impedance values are reordered according to a predefined order (reference order). The reordered impedance values are then analyzed to see if they fit predefined parameter(s). For example, if there is sufficient fit to the predefined parameter(s), the method allows the electronic device (e.g., cartridge) to be processed; if not, the device is ejected.

In some embodiments, the disclosed methods include a prior-order process evaluation (POPE) method for assessing the integrity of electrical connections. In some implementations of the POPE method, for example, a first electronic device (e.g., an assay cartridge) is interfaced with a second electronic device (e.g., analysis device), in which the impedance between an electrode or electrodes of the first and the second electronic device is measured. In some implementations of the POPE method, the impedance values are not reordered. The measured impedance values are compared to prior impedance values obtained from a previous qualified run of the electronic device, e.g., such as the last qualified (valid) run of a previous cartridge on that particular bay. For example, if the measured impedance values from the first electronic device (e.g., cartridge's PCB) match or are within a tolerable threshold, the cartridge is processed; if not, the cartridge is ejected. In some implementations of the POPE method, the impedance values are ordered. For example, $R^2$, RFT and EFT values processed from the run can be compared to prior $R^2$, RFT and EFT values from a previous run, e.g., the last qualified (valid) run on that bay. In such implementations, if the $R^2$, RFT or EFT values of the first electronic device match a set of prior $R^2$, RFT or EFT obtained from a previously successful run, or are within a tolerable threshold, the device is processed; if not, the device may be ejected.

In these examples, the SOPE method measures and reorganizes the working impedance values monotonically, and the reorganized values are evaluated to determine the integrity of electrical connections. The ROPE method measures and reorganizes working impedance values according to a reference order (RO), and the reorganized values are evaluated to determine the integrity of electrical connections. The POPE method measures working impedance values and compares them to a reference (e.g., such as prior impedance values obtained from a previous qualified run), and, based on the comparison the device is determined to pass or fail and/or the working impedance values are re-ordered and compares them to a reference and subsequently determined to pass or fail.

Figure 20:
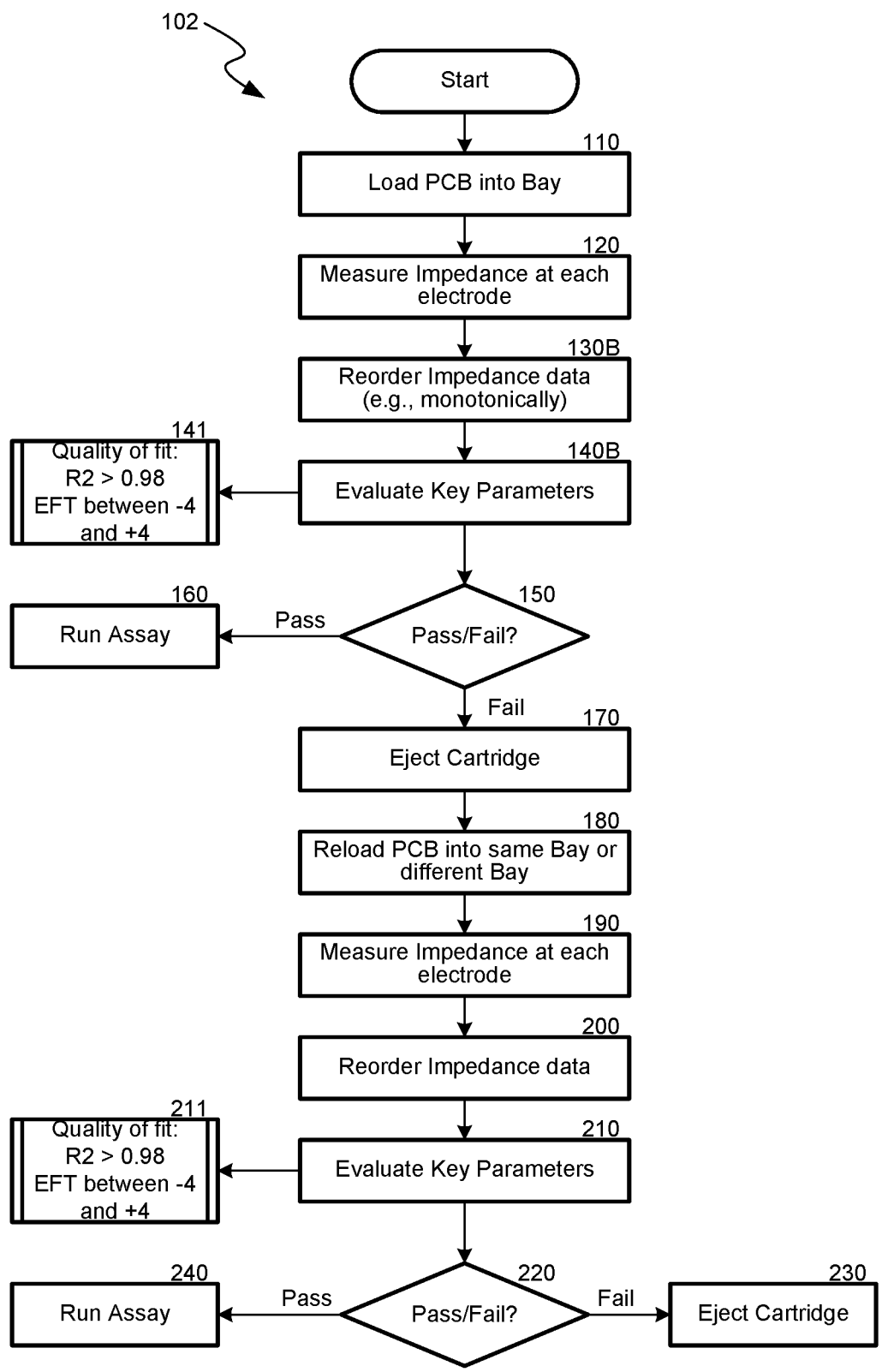
Figure 31A:
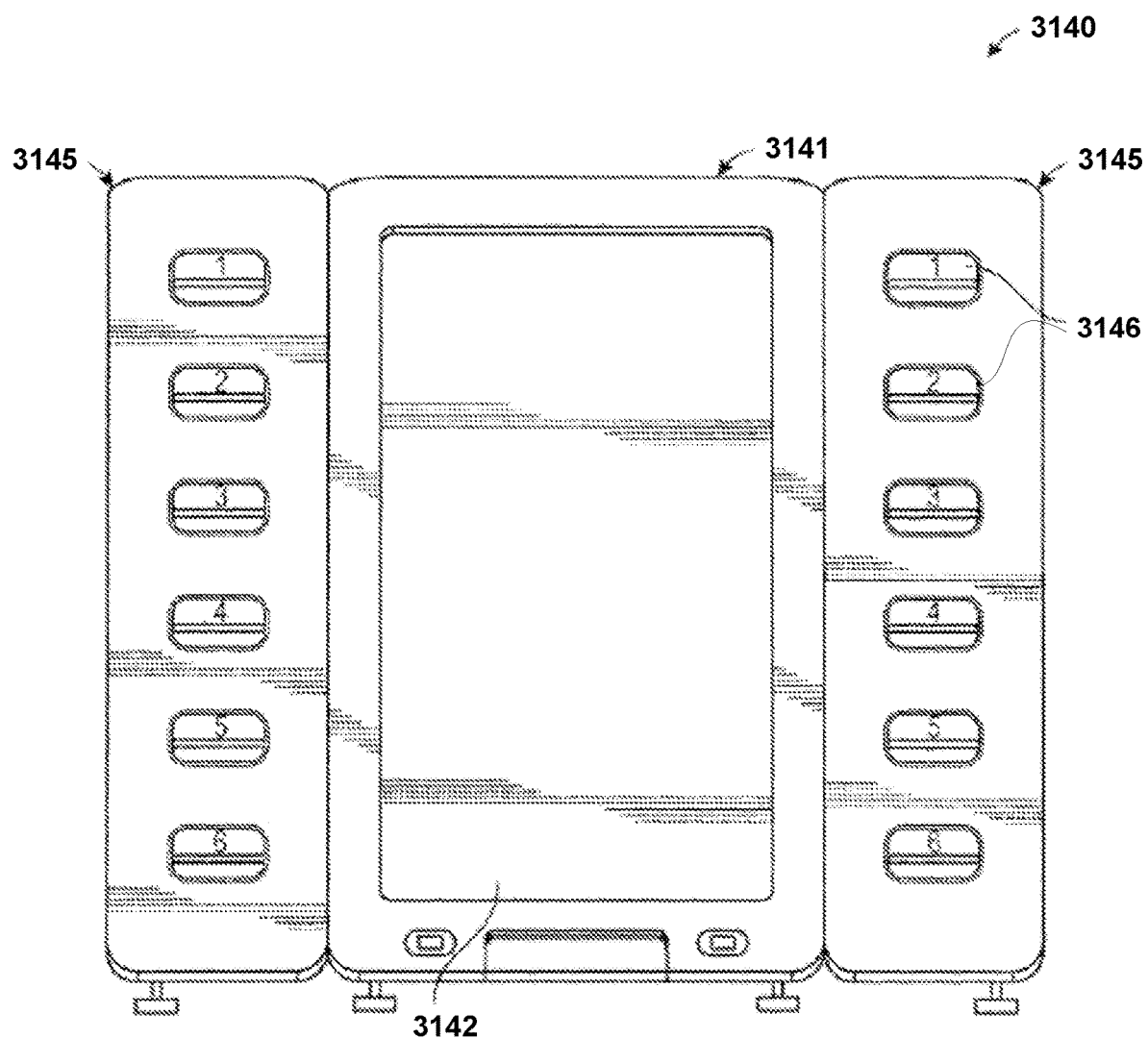
FIG. 31A shows a schematic illustration of an example embodiment of an analysis device of an assay system in accordance with the present technology.
Figure 31B:
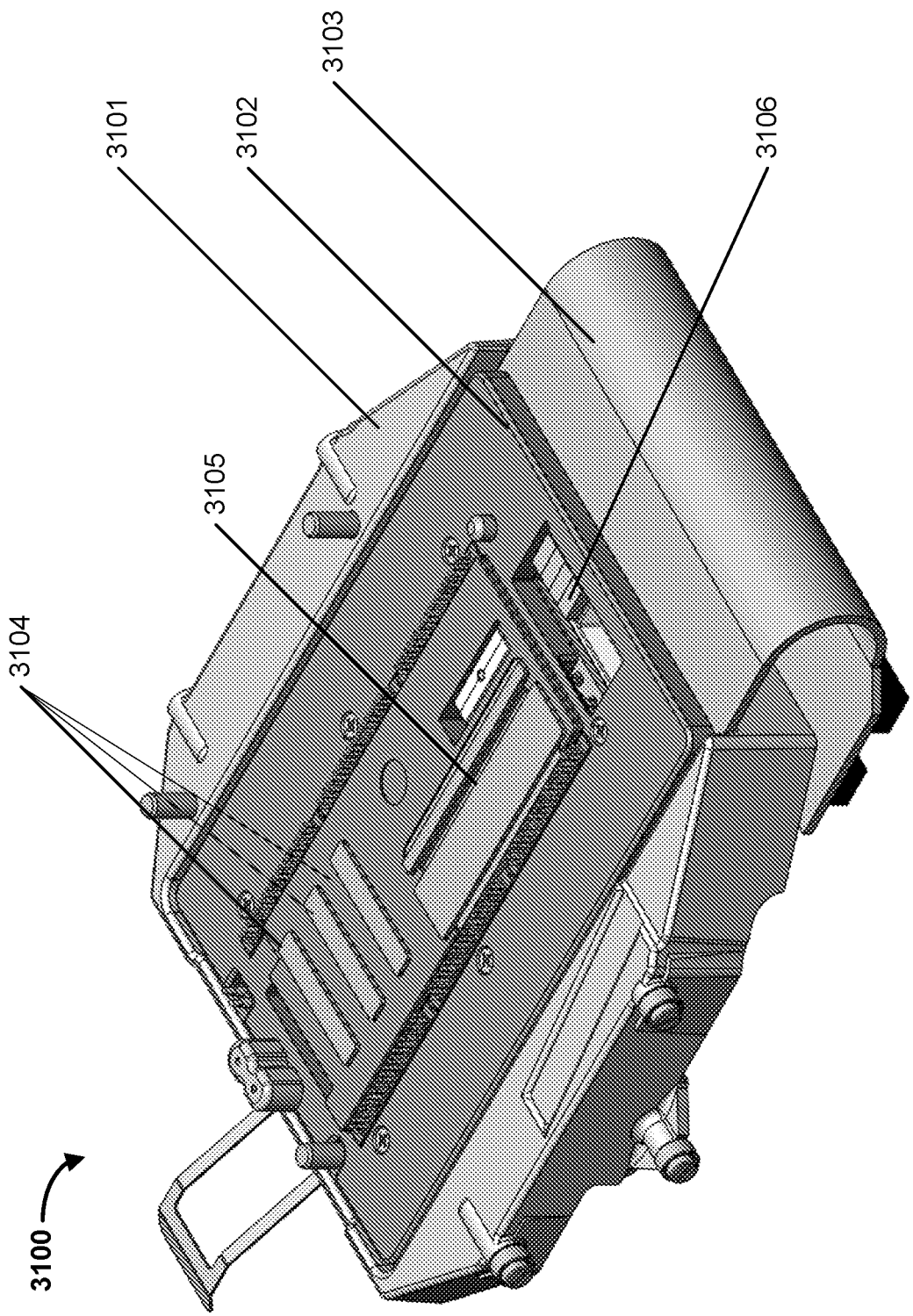
FIGS. 31B-31D show schematic illustrations depicting portions of an example electronic device for an assay cartridge processing bay and of an example PCB in electrical connection.

The example SOPE, ROPE and POPE methods may be implemented using an automated electrochemical detection assay device to characterize the impedance of electrical connections corresponding to an electrode of an assay sample cartridge and an electrode of an assay processing bay of an instrument bank. For example, the assay sample cartridge may be any device comprising electrodes. Some example embodiments of the cartridge include those disclosed in U.S. Pat. Nos. 9,498,778 and 9,957,553. One example is shown in FIG. 20 of U.S. Pat. No. 9,957,553, which shows a schematic top perspective view of a cartridge that can be used in implementations of the disclosed SOPE, ROPE and POPE methods. Another example is shown in FIG. 1 of U.S. Pat. No. 9,498,778, which shows a schematic top perspective view of a cartridge that can be used in implementations of the disclosed SOPE, ROPE and POPE methods. FIG. 31B of this application shows a connector board assembly, FIG. 31C of this application shows a connector board assembly with a transparent assay cartridge FIG. 31D of this application shows a connector board assembly with an assay cartridge over the top.

Similarly, for example, the analysis device, also referred to as a "working device," can be any instrument that processes the cartridge PCB, such as an instrument bay. Some example embodiments of the instrument bays as a "working device" include those disclosed in U.S. Pat. Nos. 9,498,778 and 9,957,553. An example is shown in FIGS. 31A and 31B of U.S. Pat. No. 9,957,553, which shows a front and side view of the instrument that can be used in implementations of the disclosed SOPE, ROPE and POPE methods. In these examples, the cartridge is loaded into a "bay." Each instrument can comprise more than one bay. The bay provides the electrical connection between the instrument and cartridge. These electrode connectors connecting the cartridge PCB and the working device are referred to as connection circuitry. A circuit corresponds to the contacts between the cartridge and bay. For example, a circuit is typically formed by two electrodes/pads on the cartridge and two electrodes on a bay form a circuit. But, a circuit can be formed between three electrodes, either two on the cartridge and one on the bay or one on the cartridge and two on the bay. Thus, a circuit requires at least 3 electrodes. One electrode/pad on the cartridge is always the same and one in unique, the unique electrode/pad is assigned the impedance value. Thus, no matter what electrode/pad (1, 2, 3, etc.) is being tested on the cartridge the current is also run though the same electrode/pad on the cartridge (pad 137).

The bays may or may not have been manufactured according to the same protocol. For example, it was observed that bays manufactured with even slight variations have very different abilities to properly connect to cartridges.

As such, before a cartridge is processed (e.g., a sample is assayed for a target analyte), it is pre-tested to make sure that there are no electrical opens or shorts, i.e., that the cartridge PCB properly connect to the electrodes in the instrument. This is referred to as a preflight test. If even one electrode on the PCB is not connected, the ability of the cartridge to give a valid result is hampered. Therefore, ensuring that all the electrodes on the PCB are connected to the bay is a critical step in achieving reliable, high-speed signaling. However, detection of an open or shorted electrode is not readily achieved using conventional capacitive opens or impedance measurement techniques because, as discussed above, bay-to bay variability can effectively mask the open/shorted connections or call open/shorted connections good when they are not.

These and other shortcomings to operate a device with two interfacing circuits, particularly for conducting a test with an analysis device, would benefit from data processing techniques, like those disclosed, to confirm the electric connection of the two interfacing circuits. The disclosed techniques can be especially beneficial when there is device variability, PCB variability and/or measurement variability. Moreover, the disclosed techniques provide additional advantages in the capability to be applied across a variety of devices, circuits (e.g., PCBs) without modifying or adding any physical components to the two interfacing circuits, such as between an instrument bay and a test cartridge.

Accordingly, provided are enhanced apparatuses, systems and methods for testing the integrity of a connection between, for example, an electrode on a cartridge PCB and a working device. Example implementations of systems and methods are disclosed herein for determining whether connection pins of a component of the assembly (instrument) are properly connected to the circuit assembly (PCB).

Example Systems for Assessing Electrical Connection Integrity

Example embodiments of SOPE, ROPE and POPE systems and methods are described generally and with respect to specific examples of instrumentation and techniques in various implementations.

Example data and results of example implementations of the disclosed systems and methods are shown in FIGS. 1-17, which are discussed in further detail later in this disclosure.

Figure 18A:
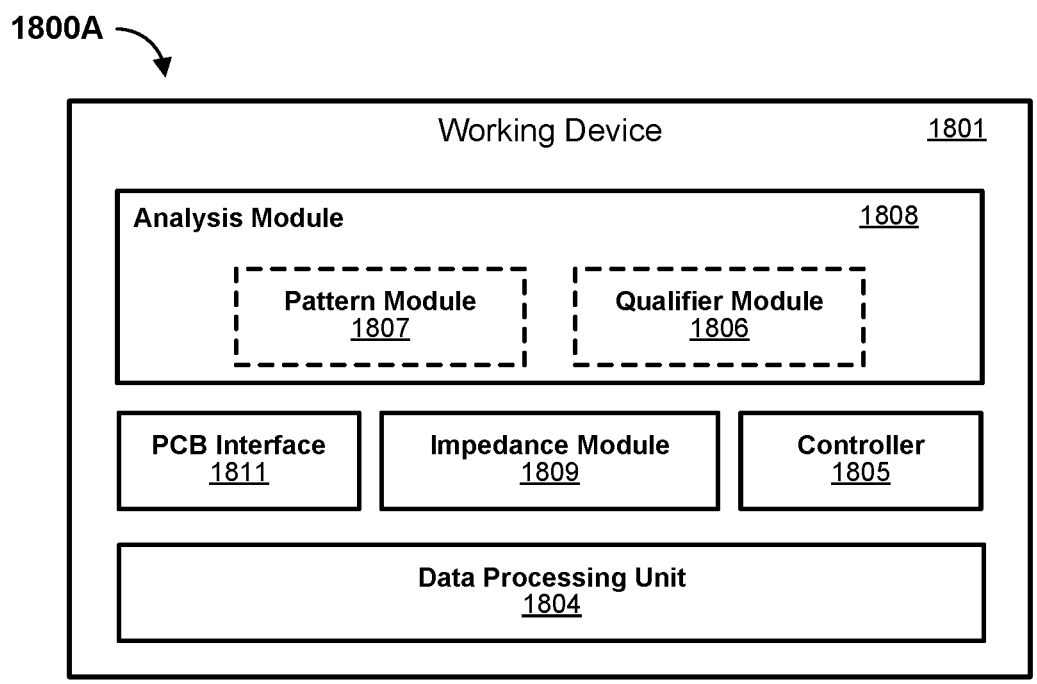
FIGS. 18A and 18B show diagrams of example embodiments of a system for assessing electrical integrity between interfacing devices, such as a PCB of an assay cartridge electronically connected to an analytical instrument.
Figure 18B:
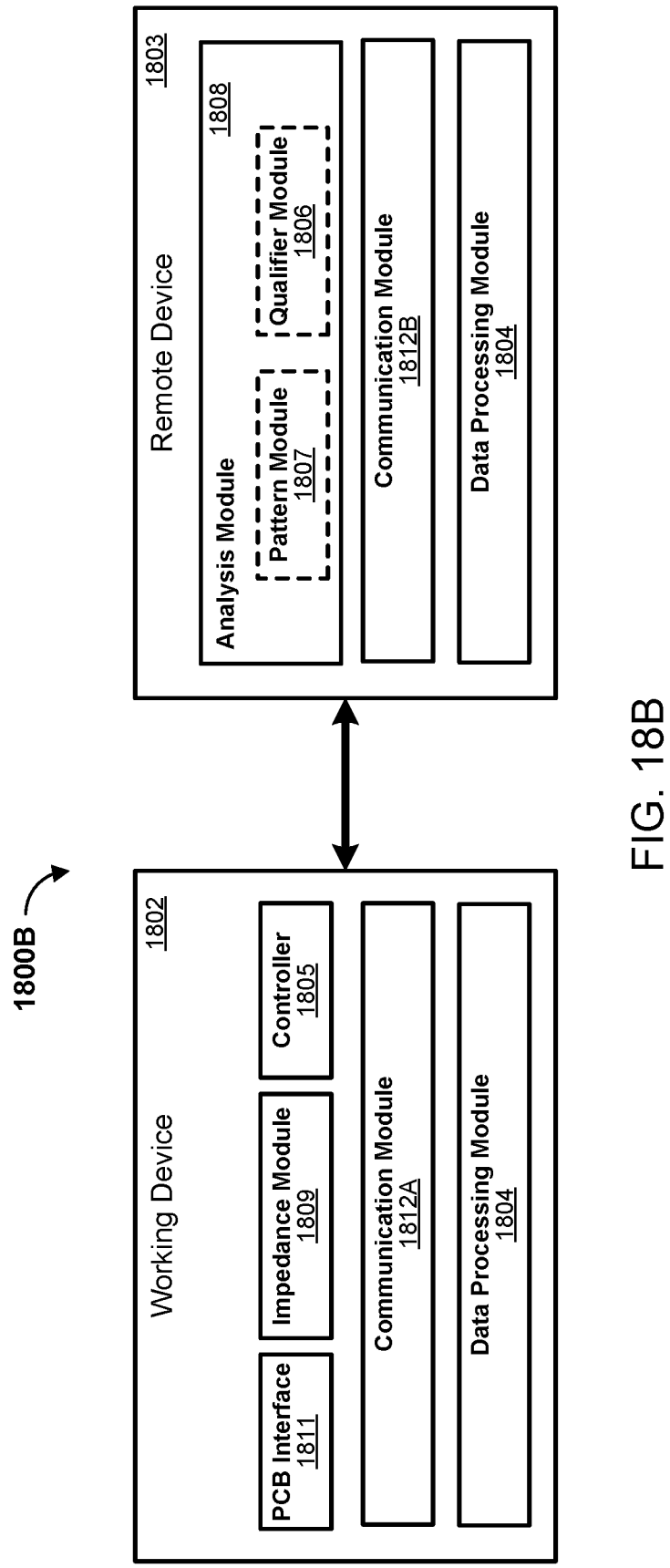

FIGS. 18A and 18B show diagrams of example embodiments of a system 1800A and 1800B, respectively, for assessing electrical integrity between interfacing devices, such as a PCB of a cartridge connected to a circuit of an analytical instrument (e.g., "working device" or "working instrument"). The system 1800A shown in FIG. 18A is an example where the system is resident on the working device, labeled 1801, to measure and process working impedance value or values (WIV) in implementations of the SOPE, ROPE or POPE methods. A working impedance value is the impedance value obtained from the circuit connecting a first electronic device having electrical connections interfaced to corresponding electrical connections of a second electronic device, e.g., such as the impedance values obtained for electrodes on a PCB of an assay cartridge that is inserted into a bay of an assay processing device. The system 1800B shown in FIG. 18B is an example where a portion of the system is resident on a remote device 1803 and on the working device, labeled 1802, which are in data communication with one another to measure and process WIV(s) in implementations of the SOPE, ROPE or POPE methods.

The diagrams of FIGS. 18A and 18B show example architectures of the respective systems 1800A and 1800B for assessing an electrical connection between interfacing circuits. The architecture includes various software and hardware modules organized and operable to execute an assessment of the electrical connections between the interfacing devices. The software modules can include a computer program having instructions (e.g., code) for executing the data processing steps of the particular software module. The software modules can be embodied as part of a software application stored in memory of one or both of the interfacing devices. Similarly, in some embodiments, for example, the software modules can be embodied as part of a data processing system resident on cloud computer(s) that are in communication with the working instrument. In some embodiments, the software modules can be embodied as part of the software app and the data processing system in the cloud, e.g., in which some or all of the modules of the software architecture are shared or divided among the app and the data processing system. Example embodiments including hardware modules of the systems 1800A and 1800B are typically resident of the working instrument, but may also be resident of the other device, such as a test cartridge.

In various embodiments, the systems 1800A and 1800B include analysis module 1808 configured to analyze measured impedance values acquired from an impedance module 1809 operable to measure impedance values across electrodes interfaced between the two circuits of two devices, for example, the PCB of a cartridge and interfacing connections of the working instrument (working device 1801 or 1802). In some implementations, the analysis module 1808 is configured to re-order the impedance values, exclude impedance values from certain electrodes, adjust the index of impedance values and/or determine an integrity state for the electrical connection interface, which can include producing a pass/fail output for some or each electrode or for the cartridge as a whole. The analysis module 1808 may also be referred to as a "memory processor" of the systems 1800A and 1800B. In some embodiments, the analysis module 1808 includes a pattern module 1807 configured to analyze the measured impedance values. In some implementations, the pattern module 1807 assigns each impedance value a first location for a data block sequence, re-orders the impedance values (e.g., creating a new data block for the particular impedance value associated with a particular electrode), and may exclude impedance values and/or adjust the index of impedance values. In some embodiments, the analysis module 1808 includes a qualifier module 1806 configured to qualify the impedance data. The qualifier module 1806 may also be referred to as a pass/fail module for certain implementations.

The systems 1800A and 1800B include controller module 1805 resident on the working instrument, e.g., working device 1801 and 1802, respectively, configured to control one or more functions of the working instrument, respectively, e.g., such as eject the cartridge inserted into a bay of the working instrument. The systems 1800A and 1800B include data processing module 1804 resident on the working instrument, e.g., working device 1801 and 1802, respectively, configured to control data processing of the circuit assembly interfaced with the working instrument, such as executing control signals to the PCB of the assay cartridge to implement the assay. The systems 1800A and 1800B include impedance module 1809 resident on the working instrument, e.g., working device 1801 and 1802, respectively.

In some embodiments, the impedance module 1809 includes a signal generator (not shown) and an impedance measurement apparatus (not shown). In implementations, for example, the signal generator generates and emits a current pulse or a sequence of current pulses. The impedance measurement apparatus measures the electrical signal and determines the impedance value (working impedance value) at each electrode (discussed in more detail below). The impedance module 1809 receives an input data stream comprising at least one data block. In some cases, for example, the data block is a WIV for a particular electrode (where the electrodes from the assay cartridge and assay device form a circuit) of the cartridge PCB; whereas in other cases, for example, the data block includes another data type, such as current, voltage, time, weight, brightness, distance or combinations thereof associated with the particular electrode of the cartridge PCB. Once the impedance module 1809 obtains an impedance measurement for each electrode it sends the data block (e.g., WIV and/or other data type associated with a particular measured electrode) to the analysis module 1808. For example, the impedance module 1809 obtains the impedance measurement values when the cartridge PCB interfaces with the cartridge PCB interface 1811 of the working device 1801 or 1802, and the signal generator applies an electrical signal to the cartridge circuit board through the PCB interface 1811.

The analysis module 1808 may be included in the working device 1801, as shown in FIG. 18A, or the analysis module 1808 may be included in the remote device 1803, as shown in FIG. 18B. In implementations of the system 1800B where the analysis module 1808 is on the remote device 1803, the data obtained by the impedance module 1809 is sent to the remote device 1803 via a communication module 1812A of the working device 1802 and is received by the remote device 1803 via a communication module 1812B. The data received at the remote device 1803 is provided to the analysis module 1808 for data analysis in accordance with the SOPE, ROPE or POPE methods. The communication module, e.g., communication modules 1812A and 1812B, can include a wired communication system (e.g., such as ethernet, cable network, or other) or a wireless communication system (e.g., such as WIFI, LAN, USB, satellite). The communication system may be configured to transmit and receive a signal from another communication system.

In some implementations, at the analysis module 1808, the pattern module 1807 assigns each impedance value (e.g., WIV or data block) to a first location in a first data block sequence. In some embodiments, the pattern module 1807 re-orders the data blocks. The re-ordered data blocks create a new (second) data block in a new (second) data block sequence. The pattern module 1807 then sends the new data block sequence to the qualifier module 1806. The qualifier module 1806 can evaluate whether the data is within acceptable thresholds. In some implementations, the qualifier module 1806 may form an affinity array such that each element in the affinity array comprises an affinity number based on one or more quality of the fit (QOF) parameters. For example, if the QOF parameters (also referred to as the quality factor(s) or QOF factor(s)) are not within acceptable thresholds, the qualifier module 1806 sends a fail signal to the controller module 1805 to command the working instrument to eject the cartridge. Alternatively, for example, if the QOF parameters are within acceptable thresholds, the qualifier module 1806 sends a pass signal to the data processing module 1804 to process the cartridge. Similarly, if the analysis module 1808 is on the remote device 1803, e.g., of system 1800B, the qualifier module 1806 sends the output signal to the working device 1802 via a communication module 1812B to communication module 1812A, which is transferred to the controller 1805 if a fail signal or to the data processing module 1804 if a pass signal.

Figure 18C:
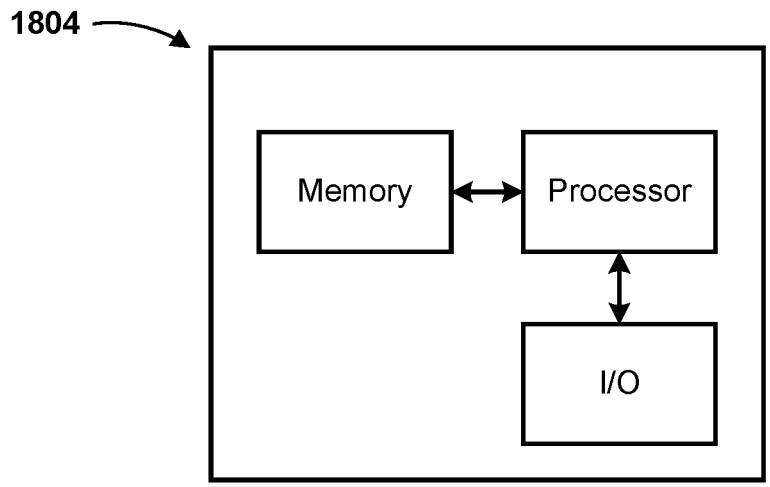
FIG. 18C shows a diagram of an example embodiment of the data processing module shown in FIGS. 18A and 18B.

FIG. 18C shows a diagram of an example embodiment of the data processing module 1804. The data processing module 1804 includes a processor to process data, a memory in communication with the processor to store data, and an input/output unit (I/O) to interface the processor and/or memory to other modules, units or devices of the system 1800A or 1800B or other devices. In some examples, the processor can include, but is not limited to, a microprocessor, a microcontroller, a complex instruction set computing (CISC) microprocessor, a reduced instruction set computing (RISC) microprocessor, a very long instruction word (VLIW) microprocessor, explicitly parallel instruction computing (EPIC) microprocessor, a graphics processor, a digital signal processor (DSP), or any other type of processor or processing circuit. The processor can include embedded controllers, such as generic or programmable logic devices or arrays, application specific integrated circuits, single-chip computers, smart cards, and the like. In some examples, the memory can include and store processor-executable code, which when executed by the processor, configures the data processing module 1804 to perform various operations, e.g., such as receiving information, commands, and/or data, processing information and data, and transmitting or providing information/data to another device. In some implementations, the data processing module 1804 can transmit raw or processed data to a computer system or communication network accessible via the Internet (referred to as 'the cloud') that includes one or more remote computational processing devices (e.g., servers in the cloud).

To support various functions of the data processing module 1804, the memory can store information and data, such as instructions, software, values, images, and other data processed or referenced by the processor. A variety of computer-readable media may be stored in and accessed from the memory, such as volatile memory and non-volatile memory, removable storage and non-removable storage. Computer memory can include any suitable memory device(s) for storing data and machine-readable instructions, such as read only memory (ROM), random access memory (RAM), erasable programmable read only memory (EPROM), electrically erasable programmable read only memory (EEPROM), hard drive, removable media drive for handling compact disks (CDs), digital video disks (DVDs), diskettes, magnetic tape cartridges, memory cards, Memory Sticks™, and the like; chemical storage; biological storage; and other types of data storage.

In some embodiments, for example, the data processing module 1804 includes a wireless communications unit (not shown) to receive data from and/or transmit data to another device. In some implementations, for example, the wireless communications unit includes a wireless transmitter/receiver (Tx/Rx) unit operable to transmit and/or receive data with another device via a wireless communication method, e.g., including, but not limited to, Bluetooth, Bluetooth low energy, Zigbee, IEEE 802.11, Wireless Local Area Network (WLAN), Wireless Personal Area Network (WPAN), Wireless Wide Area Network (WWAN), WiMAX, IEEE 802.16 (Worldwide Interoperability for Microwave Access (WiMAX)), 3G/4G/5G/LTE cellular communication methods, NFC (Near Field Communication), and parallel interfaces.

The I/O of the data processing module 1804 can interface the data processing module 1804 with the wireless communications unit and/or a wired communication component of the systems 1800A and 1800B to utilize various types of wireless or wired interfaces compatible with typical data communication standards. The I/O of the data processing module 1804 can also interface with other external interfaces, sources of data storage, and/or visual or audio display devices, etc. For example, the systems 1800A and 1800B can be configured to be in data communication with a visual display and/or additional audio displays (e.g., speakers) of other devices, via the I/O, to provide a visual display, an audio display, and/or other sensory display, respectively.

Machine-readable instructions stored on any of the above-mentioned storage media are executable by the processor of the data processing module 1804. For example, a computer program may comprise machine-readable instructions capable of encoding according to the disclosed embodiments. In some embodiments, a computer program may be included on a CD-ROM and loaded from the CD-ROM to a hard drive in non-volatile memory. Example encoding techniques include modular and flexible in terms of usage in the form of a "distributed configurable architecture". As a result, portions of the analysis module 1807 may be placed at different points of a network, for example, depending on the model chosen. For example, the analysis module 1807 can be deployed in a server and the predefined parameters or QOF parameters streamed over from a client to the server and back, respectively. The analysis module 1807 can also be placed on each client, with the database management centralized. Such flexibility allows faster deployment to provide a cost-effective solution to changing business needs.

Example Methods for Assessing Electrical Connection Integrity

Figure 18D:
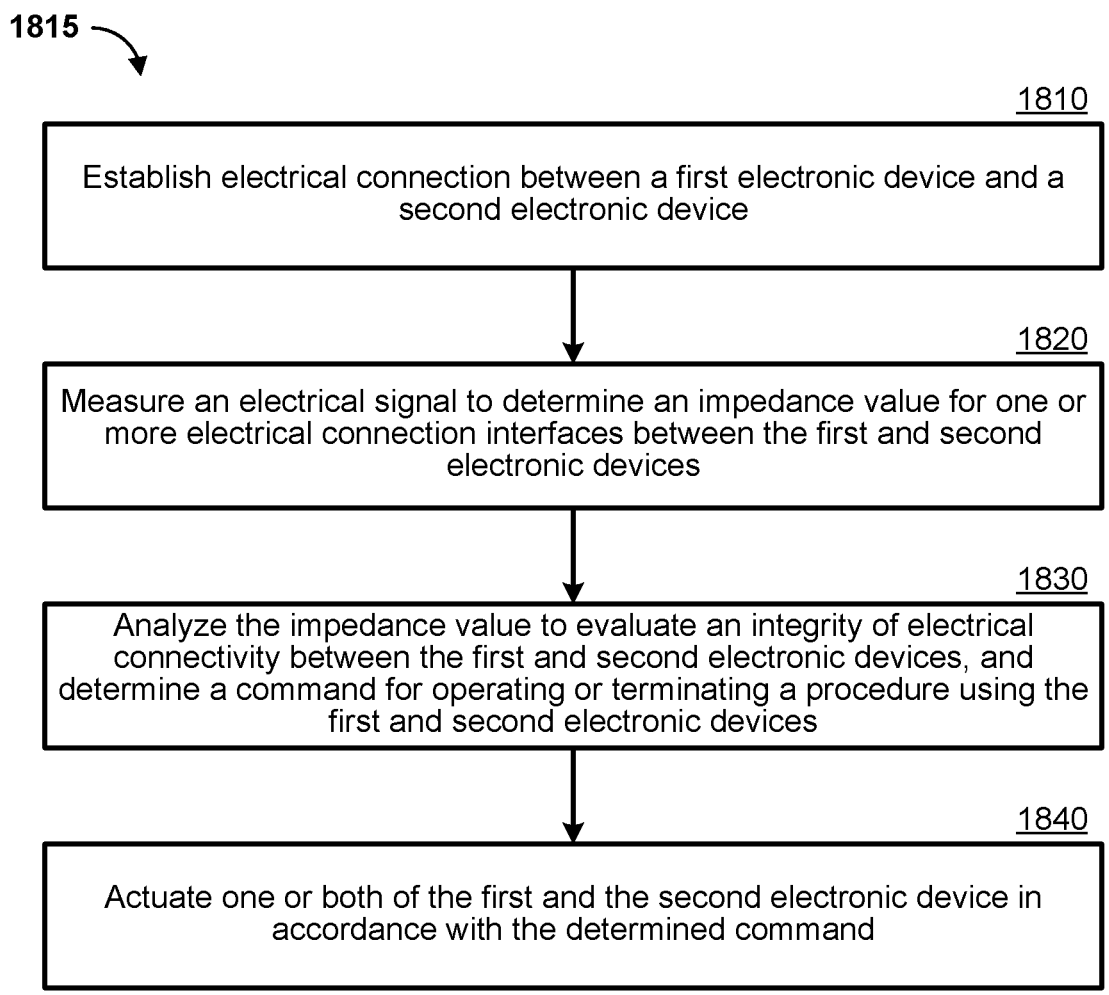
FIG. 18D shows a diagram of an example method for assessing electrical connection integrity of interfacing electronic devices in accordance with the disclosed technology.

FIG. 18D shows a diagram of an example method 1815 for assessing electrical connection integrity of interfacing electronic devices. The method 1815 includes a process 1810 to establish electrical connection between a first electronic device and a second electronic device. For example, in some implementations, the process 1810 can include loading an assay cartridge into an instrument bay of an automated electrochemical detection system such that the PCB of the assay cartridge is in electrical contact with an electrical circuit of the instrument bay. The method 1815 includes a process 1820 to measure an electrical signal to determine an impedance value for one or more electrical connection interfaces between the first and second electronic devices. For example, in some implementations, the process 1820 can include measuring one or multiple impedance values for some or each electrode of the cartridge PCB connected with electrodes on the instrument bay. The method 1815 includes a process 1830 to analyze the impedance value to evaluate the integrity of electrical connectivity between the first and second electronic devices, and determine a command for operating or terminating a procedure using the first and second electronic devices. For example, in some implementations, the process 1830 can include assigning the impedance values into data blocks based on the electrode to which the values were measured or obtained; conducting an organization and/or analysis of the data blocks in accordance with the analysis processing techniques of the SOPE, ROPE and/or POPE methods, described below; determine the quality of the analyzed data indicative of the integrity of the electrical connections between the cartridge PCB and the circuit of the instrument bay; and generating a command for actuating a function of the detection system. The method 1815 includes a process 1840 to actuate one or both of the first and the second electronic device in accordance with the determined command. For example, in some implementations, the process 1840 can include executing the assay when the integrity of electrical connections is determined to be of an acceptable standard, or ejecting the assay cartridge from the instrument bay when they are determined to be of an unacceptable standard.

Example implementations of the described methods can result in an increased rate of cartridges ejected from the analysis device, which is referred to as "do not start" (DNS) errors or DNS failures. Even though the DNS error rate increases, the system failure rate (e.g., false negatives and invalids) should decrease because bad cartridges and/or cartridges with poor connections to the analysis device are not processed. Moreover, it is incredibly challenging to increase validity rates when validity rates are already very high, e.g., 95% or higher. Notably, increasing the validity rate of existing, FDA approved assay systems, such as GenMark's ePlex® system, for example, is extremely challenging because any increase to the validity rate must be achieved without any changes to the cartridge or assay system components. It is therefore unexpected that increasing the DNS failure rate can cause an increase in the validity rate.

Figure 18E:
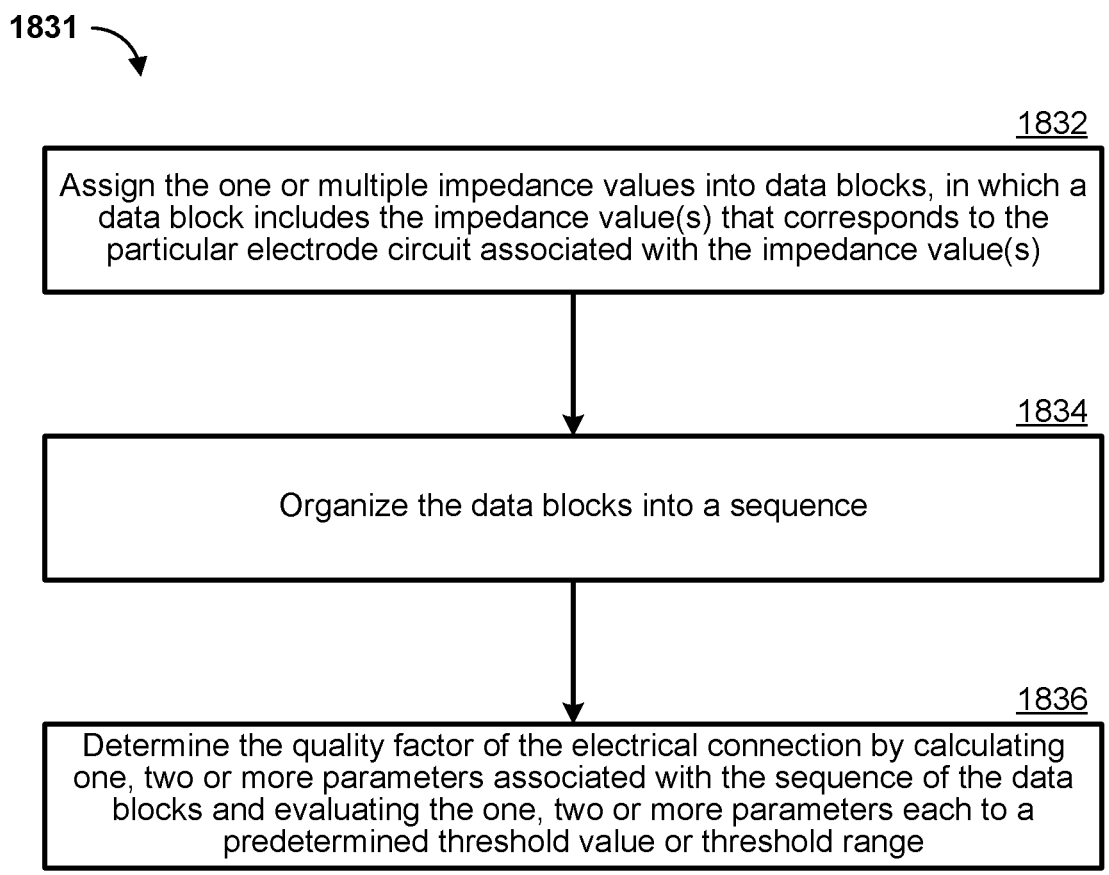
FIG. 18E shows a diagram of an example method for analyzing impedance values to evaluate a quality factor of electrical connection between interfacing electronic devices in accordance with the disclosed technology.

FIG. 18E shows a diagram of an example embodiment of a method 1831 for analyzing impedance values to evaluate a quality factor of electrical connection between the first electronic device and the second electronic device. In some implementations, for example, the method 1831 can be implemented at the process 1830 of the method 1815. The method 1831 includes a process 1832 to assign the one or multiple impedance values into data blocks, in which a data block includes the impedance value (or values) that corresponds to the particular electrode circuit associated with the impedance value (or values). The method 1831 includes a process 1834 to organize the data blocks into a sequence. The method 1831 includes a process 1836 to determine the quality factor of the electrical connection by calculating one, two or more parameters associated with the sequence of the data blocks and evaluating the one, two or more parameters each to a predetermined threshold value or threshold range. In some implementations of the process 1834, the data blocks are organized by reordering the data blocks into a monotonical sequence, which can include a lowest-to-highest monotonical sequence or a highest-to-lowest monotonical sequence. In some implementations of the process 1834, the data blocks are organized by reordering the data blocks based on a predetermined reference order (RO), which in some cases creates a monotonic sequence of the reordered data blocks and on other cases does not. In some embodiments of the method 1831, prior to the process 1834, the method includes comparing the impedance values to prior impedance values obtained from one or more previous preflight tests using the cartridge bay of the assay processing device, and the process 1834 can include organizing the data blocks by reordering the data blocks based on a prior reference order (PRO) at least partially determined by an average of prior valid runs of prior assay cartridges. In some implementations of the method 1831, the one, two or more parameters include any combination of the following: a correlation coefficient ($R^2$), a scaled error of fit for an electrode fit test (EFT), a standard error of fit for a run fit test (RFT), and a tolerance difference value includes a difference of an $R^2$ associated with a different assay cartridge and the $R^2$ associated with the assay cartridge, or a difference of an RFT associated with a different assay cartridge and the RFT associated with the assay cartridge.

Example embodiments of the SOPE, ROPE and POPE including techniques for identifying expected order of electrodes.

Self-Order Process Evaluation (SOPE) Method

In some embodiments of the method 1815, a self-order process evaluation (SOPE) method is implemented at the process 1830 to determine the working impedance values and organize them in a monotonic order, upon which the organized data are examined according to statistical techniques to determine the integrity of the electrical connections. The SOPE method can be implemented at the analysis module 1808, including the pattern module 1807 and the qualifier module 1806.

In determining the working impedance values, the measured impedance values are assigned to a data block associated specifically to an electrode. For example, in a PCB having five electrodes, the analysis module 1808 assigns the one or more measured WIVs measured for the electrode-1 to a first data block, assigns the one or more measured WIVs measured for the electrode-2 to a second data block, and so forth. In example implementations when one or more WIVs are measured at an electrode circuit, the analysis module 1808 can organize them into an array of values, which may also be processed to consolidate, select, or average values for remaining analysis processes of the SOPE method. Such processing may also be implemented for additional data types associated with the electrode, e.g., voltage data, current data, temperature data, etc. Each data block includes (1) one or more data elements associated directly with the electrical connection point (e.g., circuit) between the first and second electronic devices (e.g., electrode of a cartridge PCB and electrodes of the analysis device), and (2) an index number, e.g., so that the data blocks may be referenced based on any organization or reordering scheme.

In determining the order of the data blocks, the pattern module 1807 compares each data block to one another and assigns each data block a first location in a first data block sequence. The data blocks are then reordered from lowest WIV to highest WIV (i.e., plotted monotonically), or from highest WIV to lowest WIV (i.e., plotted monotonically), to form a new data block sequence (also referred to as a reordered WIV or R-WIV). In some implementations, each data block of the first data block sequence is assigned a second location identifier for the second (new) data block sequence also referred to as organized data blocks or organized data block sequence. In some implementations, a second (new) set of data blocks is created to store the data in the first set of data blocks, which is organized monotonically in the second data block sequence. Each new data block is given a second location as a function of the re-order. For example, in implementations of the detection system using the assay cartridges, preferably the second location for each data block identifies the location of the corresponding electrode on the PCB of the cartridge and electrode on the analysis device. The reordered data blocks (R-WIV) is further analyzed to evaluate key parameters. Notably, in the SOPE method, the data blocks (of WIVs associated with the particular electrodes) are not re-ordered according to a predefined pattern, but rather the reordering pattern is based on the determined WIV values themselves.

In some implementations, the new data block sequence produces a straight line based on the monotonical plotting of WIVs. In some implementations of the SOPE method, for example, prior to rearranging or after rearranging, certain data blocks can be excluded. As discussed in more detail below, data blocks may be excluded because (1) the electrode is highly variable run-to-run or (2) the electrode's impedance measurement is too high or too low.

In some implementations, the new data block may exclude some electrodes or adjust the fit to improve linearity or combinations thereof. In some implementations, certain data blocks are excluded and the index of each ordered electrode is adjusted.

In evaluating the integrity of the electrical connections, the organized data blocks are provided to the qualifier module 1806 (e.g., also referred to as the pass/fail module for some implementations) to qualify the new data blocks in the organized data blocks sequence. In some implementations, for example, to qualify the new data blocks, the organized data blocks sequence is analyzed according to one parameter: correlation coefficient ($R^2$), EFT, RFT, intercept of the fitted line or slope of the fitted line. In some implementations, for example, to qualify the new data blocks, the organized data blocks sequence is analyzed according to two parameters: correlation coefficient ($R^2$) and an electrode fit test (EFT). In some embodiments, the organized data blocks sequence is analyzed according to a plurality of parameters: correlation coefficient ($R^2$), EFT, RFT, intercept of the fitted line and/or slope of the fitted line.

Equation 1 is shown for the correlation coefficient, $R^2$:

$$\mathrm{Correl}(X,Y) = \frac{\sum (x-\bar{x})(y-\bar{y})}{\sqrt{\sum (x-\bar{x})^2 \sum (y-\bar{y})^2}} \quad (1)$$

where $\bar{x}$ and $\bar{y}$ are the sample means AVERAGE(array1) and AVERAGE(array2), and where X corresponds to the index and Y corresponds to the impedance measurements.

Equation 2 is shown for the standard error of the predicted fit (RFT):

$$\sqrt{\frac{1}{(n-2)}\left[\sum (y-\bar{y})^2 - \frac{\left[\sum (x-\bar{x})(y-\bar{y})\right]^2}{\sum (x-\bar{x})^2}\right]} \quad (2)$$

where x and y are the sample means AVERAGE (known_x's) and AVERAGE(known_y's), and n is the sample size. x and y are the index and impedance for each point. "x-bar" and "y-bar" are the averages of each; and the sums go over all the points.

Equation 3 is shown for the scaled error of the linear fit for each electrode (EFT).

EFT=scaled error=(((index*slope)+intercept)−impedance)/RFT  (3)

In some example implementations of the SOPE method, the organized data blocks sequence is analyzed according to two parameters: correlation coefficient ($R^2$) and an electrode fit test (EFT). For the first parameter, for example, the impedance values in each data block are examined collectively in their organized data blocks sequence to determine the correlation coefficient ($R^2$). Preferably, for example, $R^2$ is about 1. In some implementations, acceptable $R^2$ values may be between about 0.8 and 1, or at least about 0.9, or between 0.98 to 1. For the second parameter, for example, each individual electrode is examined individually to determine the scaled error of the fit, referred to as the "electrode fit test" or EFT. Preferably, for example, the EFT for each electrode is less than about 4 (for an open). Preferably, for example, the EFT for each electrode is greater than about −4 (for a short). Preferably, for example, the EFT for each electrode is between −4 and +4 (for an open and short). Preferably, for example, the EFT for each electrode is less than about 3 (for an open). Preferably, for example, the EFT for each electrode is between about 0 and less than 4 (for an open). Preferably, for example, the EFT for each electrode is between about 0 and less than 5 (for an open). Preferably, for example, the EFT for each electrode is greater than about −3. Preferably, for example, the EFT for each electrode is between about 0 and greater than −4 for short. In some implementations, the EFT for each electrode is between about 0 and greater than −5 for short. Using the two evaluated parameters, the SOPE method can determine a command for operating the electronic devices.

In some implementations, if any one parameter does not meet a predetermined threshold the cartridge fails the preflight test and is ejected.

In some implementations, if $R^2$ is not between 0.95 and 1, then the preflight test fails and the cartridge is ejected. In some implementations, if any EFT is too far from the fitted prediction (e.g., has a value greater than 4 (open) or less than −4 (short), the preflight test fails and the cartridge is ejected. In some implementations, if both the $R^2$ is not between 0.95 and 1 and if any EFT has a value greater than 4 (open) or less than −4 (short), the preflight test fails and the cartridge is ejected.

In some implementations, if $R^2$ is between 0.95 and 1, the preflight test passes and the cartridge is processed. In some implementations, if all of the EFTs have a value less than 4 (open) or greater than −4 (short) the preflight test passes and the cartridge is processed. In some implementations, if both the $R^2$ is between 0.95 and 1 and all of the EFTs have a value less than 4 (open) or greater than −4 (short), the preflight test passes and the cartridge is processed.

For example, by first plotting impedance values monotonically and/or excluding some electrodes and/or adjusting the fit to improve linearity, and second measuring the $R^2$ to ensure it is between 0.8 and 1 and/or measuring the EFT to ensure it is between 0 and less than 5, e.g., preferably between 0 and less than 4 (open) or between 0 and greater than −4 (short), a proper connection between a bay and PCB can be identified. By first plotting impedance values monotonically and/or excluding some electrodes and/or adjusting the fit to improve linearity, and second measuring the $R^2$ to ensure it is between 0.8 and 1 and/or measuring the EFT to ensure it is between 0 and less than 5, e.g., preferably between 0 and less than 4 (open) or between 0 and greater than −4 (short) an improper connection between a bay and PCB can be identified.

In some implementations, the qualifier module 1806 is configured to pass or fail the cartridge based on the evaluated, reorganized data blocks. For example, in the case of a fail, the qualifier module 1806 produces an output indicating that the cartridge and bay are not properly connected, e.g., producing an error message sent to the controller module 1805, from which the controller module 1805 ejects the cartridge. For example, in the case of a pass, the qualifier module 1806 produces an output indicating that the cartridge and bay are properly connected, e.g., producing a pass message sent to the data processing module 1804, e.g., which can be resident on the analysis instrument or remote instrument, to initiate processing of the cartridge.

In some embodiments, the analysis module 1808 including the pattern module 1807 and qualifier module 1806 are resident in an instrument bank of the example automated electrochemical detection system, whereas in some embodiments, the analysis module 1808 is resident in the base station. In some embodiments, the analysis module 1808 is resident in a remote instrument in data communication with the working instrument. In some embodiments, portions of the analysis module 1808 is resident in a combination of any of the instrument bank, base station or remote instrument.

Reference-Order Process Evaluation (ROPE) Method

In some embodiments of the method 1815, a reference-order process evaluation (ROPE) method is implemented at the process 1830 to determine the working impedance values and organize them in a particular order based on a reference order, upon which the reference-organized data are examined according to statistical techniques to determine the integrity of the electrical connections. The ROPE method can be implemented at the analysis module 1808, including the pattern module 1807 and the qualifier module 1806.

In the above described SOPE method, the re-ordered impedance values are based on the impedance values obtained from the cartridge PCB being processed, i.e., the WIV. In contrast, the ROPE method uses reordered impedance values based on one or more reference orders (RO). For example, the ROPE method can include a review of internal and external data that define a pattern. The pattern can be the predetermined expected sequence of electrodes that yields a monotonic plot of impedance values.

For example, the ROPE method is designed to identify electrical connection integrity issues observed for cartridge-working device interfaces where different iterations of the connector board (e.g., different designs, different suppliers, different material or combinations thereof) showed different impedance patterns when plotted monotonically; however, the monotonic plots proved sufficiently consistent across multiple connector boards to allow each type of connector board (type 1, type 2, type 3 . . . type n) to use the same monotonic plot, i.e., same order of electrodes. Thus, the ROPE method relies on impedance values following a consistent pattern run-to-run. The ROPE method fits the current impedance data to a pattern or patterns, thereby reducing the effect of run-to-run variability.

This characterization of bays helps identify different bay types that have different expected patterns. The ROPE method may identify which group a bay belongs to by applying the different patterns and selecting the pattern that gives the best fit to the working impedance measurements.

In determining the working impedance values, the measured impedance values are assigned to a first data block associated specifically to an electrode circuit. This is similar, for example, to what is described above with respect to the SOPE method. The analysis module 1808 assigns the one or more measured WIVs measured at each electrode to a corresponding data block. For example, in example implementations when one or more WIVs are measured at an electrode circuit, the analysis module 1808 can organize them into an array of values, which may also be processed to consolidate, select, or average values for remaining analysis processes of the ROPE method. Such processing may also be implemented for additional data types associated with the electrode, e.g., voltage data, current data, temperature data, etc.

In determining the order of the data blocks, the pattern module 1807 assigns each data block a first location in a first data block sequence. The pattern module 1807 then reorders the WIVs to match a reference order (RO) to form a new data block sequence (also referred to as a reference-ordered WIV sequence or RO-WIV sequence or ordered data block sequence or second data block sequence). In some embodiments, the RO can be the order of data blocks defined by the SOPE method. For example, the method 1810 can implement the process 1830 associated with the SOPE method to determine an RO for subsequent implementations of the process 1830 in accordance with the ROPE method. In some embodiments, the predefined order is an order in which the impedance values are ordered from lowest to highest to form a straight line (i.e., plotted monotonically) for another cartridge/bay connection. Each new data block is given a second location as a function of the reorganizing. If more than one RO is known, the first sequence of data blocks (e.g., the determined WIV from the process 1820) can be reordered to match some or each of the previous determined ROs. For example, the reordering of the data blocks to match more than one RO can produce a plurality of new, reordered data block sequences. Each reordered data block (new data block 1, new data block 2, new data block 3 . . . new data block n) in the new data block sequence is given a new location as a function of the reorganizing (new location 1, new location 2, new location 3 . . . new location n).

In some implementations, prior to rearranging or after rearranging, certain data blocks can be excluded. As discussed below, data blocks may be excluded because (1) the electrode is highly variable run-to-run or (2) the electrode's impedance measurement is too high or too low. In some implementations, the index of each ordered electrode is adjusted. As such, the new data block may exclude some electrodes or adjust the fit to improve linearity or combinations thereof. In some implementations, the new data block sequence implemented the ROPE method results in a straight line (i.e., plotted monotonically). In other implementations, the ROPE method does not result in a straight line. The goal is to find the RO such that the WIVs when reordered are plotted monotonically.

In establishing the RO, the pattern module 1807 of the analysis module 1808 is used to generate the RO, which can be established prior to the process 1810 (e.g., loading the cartridge into the instrument). For example, different iterations of the connector boards (e.g., different designs, different suppliers) showed different impedance patterns; however, the pass/fail limits proved sufficiently consistent across them to allow each pattern to use the same pair of limits. ROs can be based on recognizing these patterns at the pattern module 1807.

In some implementations of the ROPE method, the RO is based on prior runs performed on previous working devices that is the same type as the working device used in the method, which is referred to as the RO establishment device. In some implementations, for example, the RO establishment device is a device(s) in the field, a test device(s) or combinations thereof. In some implementations, for example, the RO establishment device has the same design, same supplier, same material or combinations thereof as the working device. In some implementations, for example, the RO is based on prior runs performed on the working device.

In some implementations, for example, the RO is based on a cartridge that ran in a RO establishment device that resulted in a valid run/result, e.g., it did not have a preflight test error, operation error, or a detection error. In some implementations, for example, the RO is based on a cartridge that ran in a RO establishment device that resulted in an invalid run/result but not because of a connection error, e.g., it did not have a preflight test error.

The RO establishment device(s) can generate a RO working impedance value (RO-WIV) or RO data block. The expected order (EO) or Reference Order (RO) may be generated from the RO-WIV. In some implementations, the RO is created from the RO-WIV plotted monotonically. In some implementations, for a plurality of working impedance values from a plurality of runs using the RO establishment device(s), the RO is created from the average impedance value at each electrode circuit from prior RO establishment device(s) reordered monotonically. In some implementations, the RO is created from the average of the highest and lowest impedance value at each electrode circuit from prior RO establishment device(s) reordered monotonically. In some implementations, the RO is created from the mean impedance value at each electrode circuit from prior RO establishment device(s) reordered monotonically. In some implementations, the RO is created from impedance values at each electrode circuit from prior RO establishment device(s) wherein some RO data blocks are excluded. As discussed below, in some examples, RO data blocks may be excluded because (1) the electrode is highly variable run-to-run or (2) the electrode's impedance measurement is too high or too low.

In some implementations, the index of each ordered electrode from the RO data block is adjusted. As such, the new RO data block may exclude some electrodes or adjust the fit to improve linearity or combinations thereof. In some embodiments, certain RO data blocks are excluded and the index of each ordered electrode is adjusted. In some implementations, the new RO data block is a straight line (i.e., plotted monotonically).

When applying the RO method, the electrode order (RO) from the RO establishment device(s) may be applied to the impedance values (e.g., WIVs) from the working device.

In some embodiments, the ROPE method is based on frequency patterns. In some implementations, the frequency pattern is generated by taking the average impedance value for each electrode across several RO establishment device runs and ordering them monotonically. The frequency pattern may also exclude some electrodes as discussed above, e.g., such as excluding electrodes with high variability or excluding electrodes with high impedance values or low impedance values. The frequency pattern may be adjusted to fit a line.

Each RO that has been determined is applied to each data block. Thus, each data block is re-ordered n times. Specifically, the pattern module re-orders the WIV to fit the first RO pattern. If more than one RO pattern is available, the WIV is re-ordered again according to each RO pattern and the quality of each fit of each RO-WIV is analyzed. In other implementations, the RO-WIV is evaluated and if it passes the cartridge is processed, if it fails a second RO-WIV is evaluated until the cartridge passes or until no RO-WIV is found that passes and the cartridge is ejected.

After the impedance module 1809 determines the WIV and sends it to the pattern module 1807 of the analysis module 1808, which creates the new data block(s) based on the RO(s), the pattern module 1807 sends the new data blocks to qualifier module 1806 (e.g., also referred to as the pass/fail module for some implementations) to qualify the new data blocks in the RO sequence, e.g., evaluating certain parameters of the new re-ordered data blocks.

Determining the Best Fit Using One or Both of $R^2$ and RFT

In some embodiments of the ROPE method, the best first is based on one predefined parameter. In some embodiments of the ROPE method, the best first is based on two predefined parameters. In some embodiments of the ROPE method, the best first is based on a plurality of predefined parameters.

In some embodiments of the ROPE method, the predefined parameters are the correlation coefficient ($R^2$), the standard error of the fit called the run fit test (RFT), or both. Run Fit Test (RFT) is the standard error of the linear fit for all the electrodes analyzed.

For the first parameter, for example, the impedance values in each data block are examined collectively in their data block sequence to determine the correlation coefficient ($R^2$). Preferably, for example, $R^2$ is about 1. In some implementations, acceptable $R^2$ values may be between about 0.8 and 1, or at least about 0.9, or between 0.98 to 1. For the second parameter, for example, all the electrodes are examined collectively to determine the RFT. Preferably, for example, the RFT for each electrode is less than 30. In some implementations, acceptable RFT for each electrode is less than 28. In some implementations, acceptable RFT for each electrode is between 10 and 35.

If one RO is available, for example, a best fit includes the new data block with an $R^2$ between 0.98 and 1 or a RFT between 10 and 35 or both. If more than one RO is available, for example, the $R^2$, the RFT, or both are generated for each RO and compared to each other. This may be referred to as RO-1, RO-2, RO-3 . . . RO-n. This may be referred to as $R^2$-1, $R^2$-2, $R^2$-3 . . . $R^2$-n. This may be referred to as RFT-1, RFT-2, RFT-3 . . . RFT-n.

In some implementations, the best fit means the new data block has the highest $R^2$ or the lowest standard error of the linear fit (RFT), or both, compared to the new data blocks for each of the other ROs analyzed. Some examples are described below for determining the best fit.

In some implementations, the RO pattern with the lowest RFT is used to determine if the cartridge passes the preflight test. In some implementations, the RO pattern with the highest $R^2$ is used to determine if the cartridge passes the preflight test. In some implementations, the RO pattern with both the lowest RFT and highest $R^e$ is used to determine if the cartridge passes the preflight test. In some implementations, the RO pattern with both the highest RFT and lowest $R^2$ is used to determine if the cartridge fails the preflight test. In some implementations, if no RO pattern gives both the lowest RFT and highest $R^2$, the method fails the preflight test. In some implementations, the RO pattern with either the lowest RFT or highest $R^2$ is used to determine if the cartridge passes the preflight test. In some implementations, the RO pattern with either the highest RFT or lowest $R^2$ is used to determine if the cartridge fails the preflight test. In some implementations, if the RO pattern gives an unacceptable RFT but acceptable $R^2$, the RO pattern fails the preflight test. In some implementations, if the RO pattern gives an acceptable RFT but unacceptable $R^2$, the RO pattern fails the preflight test.

In some implementations, the RO-WIV with the lowest RFT is applied to determine if the cartridge passes the preflight test. In some implementations, the RO-WIV with the highest $R^2$ is applied to determine if the cartridge passes the preflight test. In some implementations, the RO-WIV pattern with both the lowest RFT and highest $R^2$ is applied to determine if the cartridge passes the preflight test. In some implementations, the RO-WIV pattern with the lowest RFT or highest $R^2$ or both is applied to determine if the cartridge fails the preflight test. In some implementations, if no RO-WIV gives both the lowest RFT and highest $R^2$, the method fails the preflight test. In some implementations, if the RO-WIV gives an unacceptable RFT but acceptable $R^2$, the RO-WIV fails the preflight test. In some implementations, if the R-WIV gives an acceptable RFT but unacceptable $R^2$, the RO-WIV fails the preflight test. In some implementations, the RO-WIV must have both the lowest RFT and highest $R^2$, to pass the preflight test.

Requiring both extremes (e.g., lowest RFT and highest $R^2$) to come from the same pattern increases the confidence that the method chose the correct pattern. Patterns that give nearly identical values might allow for relaxing this dual requirement. In cases where more than one pattern appears acceptable, the pattern with the most number of electrodes analyzed may be selected. In some implementations, the RO-WIV must have both an acceptable RFT and an acceptable $R^2$, and at least 100 electrodes to pass the preflight test.

In some implementations, the RO-WIV with the most electrodes and an acceptable RFT and acceptable $R^2$ is needed to pass the pre-flight test.

In some implementations, the qualifier module 1806 is configured to pass or fail the assay cartridge based on the evaluated, organized new data blocks. In some implementations, for example, once the best fit using the $R^2$ and RFT parameters is determined, the cartridge can be further evaluated for pass/fail by evaluating each individual electrode to determine the scaled error of the electrode fit test (EFT). In some embodiments, expected pass/fail criteria for each electrode may be generated that accounts for acceptable variation in actual measurement values recorded for that working electrode. Preferably, for example, the EFT for each electrode is less than about 4 (open) or greater than −4 (short). In some implementations, the EFT for each electrode less than about 3. In some implementations, the EFT for each electrode is between −5 and 5. The error threshold may differ for different electrodes. In some implementations, the error threshold is the same for every electrode on the cartridge PCB. The RFT fits the data to a line (modeling) and because it looks at all of the electrodes collectively, it's possible that large scaled errors could pass under the RFT test. In contrast, the EFT analysis is a point-by-point measurement, and should identify if any single electrode circuit is above a threshold.

By plotting impedance values monotonically and excluding some electrodes or adjusting the fit to improve linearity or combinations thereof, a proper connection between a bay and cartridge PCB can be identified. Conversely, by plotting impedance values monotonically and excluding some electrodes or adjusting the fit to improve linearity or combinations thereof, an improper connection between a bay and cartridge PCB can be identified.

If the pass/fail module determines that the cartridge and bay are not properly connected, for example, the qualifier module 1806 produces an error message sent to the controller module 1805, from which the controller module 1805 ejects the cartridge. If the pass/fail module determines that the cartridge and bay are properly connected, for example, the qualifier module 1806 produces a pass message sent to the data processing module 1804 to initiate processing of the cartridge.

Prior-Order Process Evaluation (POPE) Method

In some embodiments of the method 1815, a prior-order process evaluation (POPE) method is implemented at the process 1830 to determine the working impedance values into data blocks and compare them to predetermined values, upon which the working impedance values can be re-organized data and/or are examined according to statistical techniques to determine the integrity of the electrical connections. The POPE method can be implemented at the analysis module 1808, including the pattern module 1807 and the qualifier module 1806.

In determining the working impedance values, the measured impedance values are assigned to a data block associated specifically to an electrode, e.g., which is also referred to as the first data block or a current data block or a working data block.

In the POPE method, the pattern module 1807 assigns each data block a first location in a data block sequence.

In some embodiments of the POPE method, the pattern module 1807 does not reorder the data blocks. Instead, each data block is compared to an impedance value from a prior run or an average of prior runs implemented on the working device. In some implementations, prior to the comparison of the impedance values to the prior run or average of prior run values, the pattern module 1807 organizes the data blocks into a sequence associated with the corresponding electrodes, e.g., such as an electrode number or series of operation, and not the impedance values.

In some embodiments of the POPE method, the pattern module 1807 then reorders the WIVs to match a prior-reference order (PRO) to form a new data block (also referred to as a prior-reference-ordered WIV or PRO-WIV). Each new data block is given a second location as a function of the reorganizing. However, in the POPE method, as compared to the ROPE method, the POPE method PRO is based on a prior valid run on the working device. In some implementations, for example, the PRO is based on an average of 2-100 prior valid runs on the working device.

In some implementations of the POPE method, prior to or after the reorganizing with respect to the prior reference order, certain data blocks can be excluded. For example, data blocks may be excluded because (1) the electrode is highly variable run-to-run or (2) the electrode's impedance measurement is too high or too low.

In some implementations, the index of each ordered electrode is adjusted. As such, the new data block may exclude some electrodes or adjust the fit to improve linearity or combinations thereof. In some implementations, the new data block is a straight line (e.g., plotted monotonically).

After the impedance module 1809 determines the WIV and sends it to the pattern module 1807 of the analysis module 1808, which in some implementations creates a sequence of new data block(s) based on the PRO(s), the pattern module 1807 sends the data blocks to qualifier module 1806 (e.g., also referred to as the pass/fail module for some implementations) to qualify the data blocks, e.g., evaluating certain parameters of the new data blocks.

In the example embodiments of the POPE method where the data is not re-ordered, the WIV is compared to the prior reference WIV, and if it is within a tolerable variance, the cartridge passes or fails.

In some embodiments of the POPE method, the best first is based on one predefined parameter. In some embodiments of the POPE method, the best first is based on two predefined parameters. In some embodiments of the POPE method, the best first is based on a plurality of predefined parameters.

In the example embodiments of the POPE method where the data is re-ordered, determining the best fit is based on tolerable difference parameters: tolerable difference for the $R^2$ and/or RFT and/or EFT between a prior run and the present run $R^2$ and/or RFT and/or EFT.

For example, the qualifier module 1806 makes the determinations in consideration of whether the difference between a previous run $R^2$ and/or RFT and/or EFT and the present run $R^2$ and/or RFT and/or EFT is greater than a difference tolerance threshold.

In the example embodiments of the POPE method where the data is re-ordered, determining the best fit is based on three sets of parameters: (1) correlation coefficient ($R^2$); (2) standard error of the fit for the run fit test (RFT); and (3) tolerable difference for the R2 and/or RFT between a prior run and the present run $R^2$ and/or RFT.

For example, the qualifier module 1806 makes the determinations in consideration of all the impedance values together, e.g., determining whether the $R^2$ for the present run exceeds the $R^2$ threshold; determining whether the RFT for the present run exceeds the RFT threshold; and (3) determining whether the difference between a previous run $R^2$ and/or RFT and the present run $R^2$ and/or RFT is greater than a difference tolerance threshold.

For the tolerable difference parameter, if the difference is too great, the cartridge fails. As an example, the prior run $R^2$ could be 0.98 (acceptable) and the current R2 could be 0.92 (acceptable), but because the difference between the prior run $R^2$ and current $R^2$ is greater than 0.05, the difference is considered to great and the cartridge fails. In some implementations, tolerable differences between $R^2$ values is between 0.0 and 0.4; and intolerable differences between $R^2$ values is between 0.5-1. In some implementations, tolerable differences between RFT values is between 1-5; and intolerable differences between RFT values is between 5-28.

In some implementations, once the quality of the fit is determined at the qualifier module 1806, the cartridge is evaluated for pass/fail by evaluating each individual electrode to determine the scaled error of the fit also referred to as the electrode fit test (EFT). In some implementations, the qualifier module 1806 can then determine if a tolerable difference is present between the current value for EFT compared to the prior run value for EFT. For example, the prior run EFT could be 1.8 (e.g., acceptable) and the current EFT could be 3.5 (e.g., acceptable), but because the difference between the prior run EFT and current EFT is greater than 1.5, the difference is considered too great and the cartridge fails. In some implementations, for example, tolerable differences between EFT values is between 0-1.5; and intolerable differences between EFT values is between 1.5-4.

Alternatively, the tolerable difference can be determined based on the difference between the ratio of the current value for $R^2$, RFT, or EFT compared to a goal value (e.g., max or minimum value), compared to the ratio of the prior run value for $R^2$, RFT, or EFT compared to a goal value (max or minimum value). For example, the prior run $R^2$ could be 0.98/28 (acceptable) and the current $R^2$ could be 0.92/28 (acceptable), and because the difference between the prior run $R^2$ and current $R^2$ is less than 0.05/28, the difference is considered small and the cartridge passes.

In some implementations, the qualifier module 1806 is configured to pass or fail the example assay cartridge based on the evaluated, reorganized data blocks. If the pass/fail module determines that the cartridge and bay are not properly connected, for example, a case of a fail, the qualifier module 1806 produces an error message sent to the controller module 1805, from which the controller module 1805 ejects the cartridge. If the pass/fail module determines that the cartridge and bay are properly connected, for example, a case of a pass, the qualifier module 1806 produces a pass message sent to the data processing module 1804 to initiate processing of the cartridge. In some implementations, expected pass/fail criteria for each electrode may be generated that accounts for acceptable variation in actual measurement values recorded for that working electrode. For example, the EFT for each electrode is preferably less than 4 (open) or greater than −4 (short), where is some examples, the EFT for each electrode is preferably less than 3, where is some examples, the EFT for each electrode is preferably between 0 and less than 5. The error threshold may differ for different electrodes. In some implementations, the error threshold is the same for every electrode on the PCB.

Further discussion pertaining to example implementations of the processes of the method 1815 and the method 1831 are discussed below, including in relation to the processes of the SOPE, ROPE and POPE methods.

Measuring Working Impedance

Example embodiments of the process to measure working impedance values of an interfaced device, such as a PCB of an assay cartridge and electronic connections of an assay device, are described below.

Typically, a PCB include a laminate of a conductive material, e.g., copper, as well as an insulating dielectric substrate. The traces formed by the copper material provide signaling paths for communication between the cartridge PCB and the electronic device on the working instrument. These traces can act like electrical transmission lines.

Impedance is a measure of passive opposition to the flow of current along the trace. Impedance includes resistance (to direct current), reactance (to alternating current), inductance and capacitance. The length and width of each trace, its proximity to other traces, and the number of board layers are among the many factors affecting trace impedance in PCBs. Generally, wider traces have lower impedances, where other factors are equal. An impedance mismatch is the discontinuity between the impedances of two communicating components, e.g., such as between the electrical connections of the cartridge PCB and the interfacing conductive paths of the working instrument circuit, e.g., a PCB of the working instrument. When an impedance mismatch is present, reflection along the signal trace can occur. The reflected signal will add to or subtract from the original signal being transmitted between the components, thereby causing a distortion and, possibly, a failure of the transmission.

Generally, PCB boards are manufactured to meet certain trace impedances, within some tolerance. Thus, where a 50-ohm PCB is specified, plus or minus fifteen percent, the impedance of all traces on the PCB will be between 42.5 and 57.5 ohms. A single PCB can simultaneously include traces of different widths, such as 50-ohm traces and 60-ohm traces, for example. This enables signal groups with different impedance requirements to simultaneously occupy the PCB. A memory interface may have a 60-ohm impedance requirement while a processor interface, located on the same PCB, has a 50-ohm impedance requirement.

Despite having a board with a known trace impedance, it is important to assess and qualify the connection between two interfacing PCB boards. Qualifying the connection between two interfacing PCBs improves signal integrity, reduces reflections and ringing along the trace that may adversely affect system performance.

Applicants have discovered that the variation of trace impedance between two working instruments can be significant such that valid cartridges are discarded leading to waste and/or invalid cartridges are processed leading to false negatives/invalids. In particular, for example, the same electrode from a cartridge on two different working instruments may have a variation in the trace impedance of about 5%, or 10% or 20% or 30% or 40% or 50% between 1-50% in various implementations.

In some implementations, the working device is programed to send a voltage of a defined size and frequency to the cartridge PCB. The working device measures the circuit resistance (e.g., real impedance component) and capacitance and inductance of each electrode on the cartridge. The results depend on circuit parameters, particularly open, closed or shorts.

In some embodiments of the disclosed methods for assessing electrical connection integrity, the process for measuring impedance is achieved by: (1) applying a voltage between or among two PCB electrodes at a given frequency (or multiple frequencies, or having specific voltage waveform) and monitoring the electrical current through said electrodes at the frequency (or multiple frequencies, or having specific waveform), dividing the voltage amplitude value by the current amplitude value to derive the impedance value; and/or (2) applying an electric current of a single frequency component (or multiple frequencies or having specific current wave form) through said electrodes and monitoring the voltage resulted between or among said electrodes at the frequency (or multiple frequencies, or having specific waveform), dividing the voltage amplitude value by the current amplitude value to derive the impedance value. Other techniques can also be employed to measure or determine electric impedance. Note that in the description above regarding "dividing the voltage amplitude value by the current amplitude value to derive the impedance value," the "division" is done for the values of current amplitude and voltage amplitude at the same frequencies.

Insofar as conventional printed circuit board design techniques indicate that the connection of two PCB boards together should work in an acceptable manner, the failure of the components to work together has given rise to the need for determining why the unacceptable errors are occurring, and, if the cause of the unacceptable errors can be determined, providing a connection specific method such that the performance of the electronic system, such as an automated electrochemical detection system connected to a cartridge, is acceptable without any design changes to the PCB of either interfaced devices, e.g., an assay cartridge PCB and instrument bay.

In some embodiments of the impedance module 1809, the signal generator is operable as an impedance signal source that provides an impedance signal. The impedance module 1809 is coupled to the PCB interface 1811 that includes the electrical connection structures of the working instrument that electrically connect to the corresponding electrical connection structures of the cartridge PCB. The signal generator applies an electrical signal to the cartridge circuit board through the bay PCB interface location. In some embodiments, the signal generator is part of the working device 1801 or 1802 (e.g., instrument bay assembly) and is implemented as part of the normal functional circuitry of the bay assembly. For example, the signal generator may include a microprocessor, a microprocessor-based integrated circuit, an oscillator, or an IC supporting Boundary Scan. The signal generator generates the impedance signal at a predetermined frequency. The predetermined frequency of the impedance signal is preferably harmonically unrelated to the frequency of any other signal associated with the device. For example, this helps to avoid false detections and false integrity indications. An electrical signal path connects the output of the signal generator to an electrical connection on the PCB assembly. Preferably, this signal path is the same path that implements the normal function of the working device 1801 or 1802 (e.g., instrument bay of the automated electrochemical detection system) during normal operation of the circuit assembly/cartridge. The signal generator is therefore able to apply the impedance signal to the electrical connection without having to probe an electrical signal path or the electrical connection.

In some embodiments of the impedance module 1809, the impedance measurement apparatus, also referred to as an impedance sensor or an impedance detector, is configured to detect the impedance signal from the electrical connection. The impedance sensor is positioned proximately near the electrical connection so that the sensor can detect the amplitude of the impedance signal passing through the electrical connection.

In conventional impedance detection systems, for example, the detected amplitude is compared to a threshold value, and the comparison of the detected amplitude to the threshold value is indicative of the integrity of the electrical connection between two interfacing devices. In other words, the comparison indicates whether the electrical signal path is properly connected between two interfacing devices. But, as discussed above, comparing the detected impedance amplitude to the threshold impedance value results in runs with poor connectivity to pass and runs with good connectivity to fail.

The disclosed systems include an impedance module that provides a detection signal to an analysis module indicating a detected value of the impedance signal, e.g., such as the magnitude and/or phase of the impedance signal.

Analyzing the Detected Impedance Signal

Once the analysis module 1808 has received the detection signal from the impedance module, the analysis module 1808 analyzes the measured impedance values acquired from an impedance module 1809 in accordance with the SOPE, ROPE and/or POPE methods. For example, in the SOPE method, the analysis module 1808 re-orders the WIVs either from highest to lowest WIV values or lowest to highest WIV values. For example, in the ROPE method, the analysis module 1808 utilizes the pattern module 1807 to reorganize the WIVs according to a reference order (RO). For example, in the POPE method, the analysis module 1808 does not re-order the WIVs and compares the impedance value of each electrode (where the electrodes from the assay cartridge and assay device form a circuit) to a prior valid run. This comparison (e.g., to a predetermined pattern or prior valid run as compared to a threshold) is an improved indicator of the integrity of the electrical connection. The integrity of the electrical connection is typically considered to be whether the electrical signal path, such as a wire trace on the printed circuit assembly, is properly connected to the working device.

Assigning and/or Reordering Impedance Values by the Pattern Module

Figure 19:
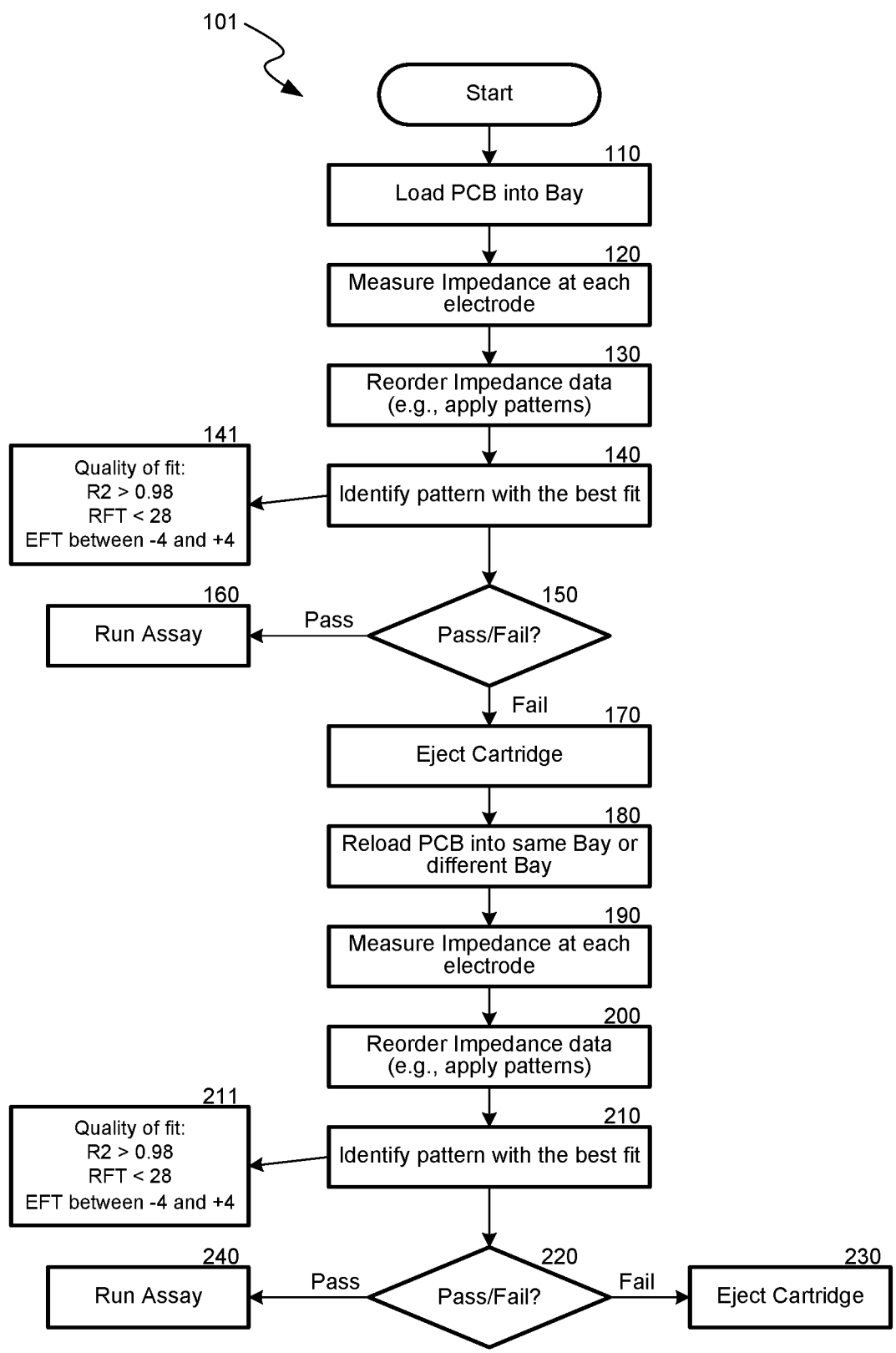
FIGS. 19-22 show diagrams of example embodiments of a method for assessing electrical connections based on rearrangement of an input data stream in an analysis system, such as an assay cartridge qualification system.

FIG. 19 illustrates an example method 101 for assessing electrical connections based on rearrangement of an input data stream in an analysis system, such as an assay cartridge qualification system. At step 110 of method 101, a circuit assembly of a first device (e.g., assay cartridge) is loaded into a second device (e.g., instrument bay), such that the circuit assembly of the first device electrically interfaces with a circuit assembly of the second device. At step 120 of the method 101, an input data stream including impedance data blocks is collected. The input data stream can include data elements, such as charge data blocks, amplitude data blocks, impedance data blocks, current data blocks, volts data blocks, time data blocks, weight data blocks, brightness data blocks, distance data blocks or combinations thereof. In some embodiments, the input data stream comprises a sequence of bytes and/or pixels. In some embodiments, the input data stream may be divided into a sequence of n data blocks, where each data block represents a different electrode. For example, Block 1, Block 2, Block 3, . . . , Block n corresponds to electrode 1, electrode 2, electrode 3, . . . , electrode n.

FIG. 27 shows a diagram of an example data block sequence of n data blocks formed into an array, labeled 300.

Referring back to FIG. 19, at step 130 of the method 101, each identified data block is reordered in accordance with the ROPE method. For example, in implementations of the step 130, the data blocks are reordered to match a reference order (RO), which can be based on a pattern determined from analyzing a predetermined number of previously processed data blocks. The reordering of the data blocks based on the RO form a new data stream or new data block sequence.

In some embodiments of the method 101, the predetermined number of previously processed data blocks are identified before the start of the operation.

FIG. 28 shows a diagram of an example predetermined number of previously processed data blocks, formed as an array or matrix labeled 301. In the example of FIG. 28, the previously processed data blocks (PP Block) include PP Blocks 1, 2, 3, . . . n. The values given represent the second location (new order) for the new data block.

For example, the new data blocks are formed by repositioning the input data blocks according to the reference order of the previously processed data block. The above illustrated new data blocks can also be arranged using other relationships between the blocks. For example, any value that can be measured such as $R^2$, EFT, RFT, charge, current, volts, number of electrodes analyzed or combinations thereof.

Determining the Quality of the Fit

The amount any impedance value from an electrode (where the electrodes from the assay cartridge and assay device form a circuit) varies from its expected value is determined by the quality of the fit (QOF). This determination might be different for different electrodes, and it might be normalized by the standard error of the fit.

Referring back to FIG. 19, in accordance with the ROPE method at step 140 of the method 101, each re-ordered data block (new data block sequence) is compared to how well the new data block fits a line per the quality of fit (QOF) parameters, such as $R^2$, EFT, RFT or combinations thereof. For example, in some implementations, the re-ordered data block sequence is compared to a line and if the new data blocks match or are within some tolerable threshold, they are considered a match. For example, in some implementations, the re-ordered data block sequence is compared to the QOF parameters, as illustrated in sub-step 141, and if the data blocks match or are within some tolerable threshold, they are considered a match.

The method 101 includes a step 150 to determine whether the evaluated new data block sequence meets a threshold with respect to the QOF parameters to pass, and subsequently implement step 160 to run the application of the analysis system, e.g., such as run the assay. Yet, if the evaluated block sequence does not meet the threshold with respect to the QOF parameters and thereby fails, the method can implement a series of steps 170-220 to retest the first device (e.g., cartridge), or simply permanently fail the test by implementing the process 230.

For example, some embodiments of the method 101 includes a step 170 to initially eject the first device (e.g., assay cartridge); a step 180 to reload the first device into the second device (e.g., reload the cartridge in the bay (same bay or in a different bay) to interface the circuit assembly of the cartridge with the electronics of the bay); a step 190, similar to step 120, to re-measure the impedance for each electrode; a step 200, similar to step 130, to reorder the impedance data in accordance with the ROPE method; a step 210, similar to step 140, to identify the pattern with the best fit including evaluating a quality of fit (at sub-step 211); and a step 220, similar to step 150, to determine whether the re-evaluated new data block sequence passes or fails; after which, the method 101 includes running the application at step 240 if a pass, or ejecting the first device at step 230 if it fails.

FIG. 20 illustrates an example method 102 for assessing electrical connections based on the rearrangement of an input data stream in an analysis system, such as an assay cartridge qualification system. The method 102 includes the steps 110, 120 and 150 of the method 101. In the method 102, at step 130B, each in accordance with the SOPE method. For example, in implementations of the step 130, the data blocks are reordered monotonically. As step 140B, each re-ordered data block (new data block sequence) is compared to how well the new data block fits a line per the key parameters. The re-ordered data block is compared to the key parameters and if the data blocks match or are within some tolerable threshold, they are considered a match. The example key parameters may include the $R^2$, EFT, RFT or combinations thereof. The method 102 can also include the steps 170-220 of the method 101.

Figure 21:
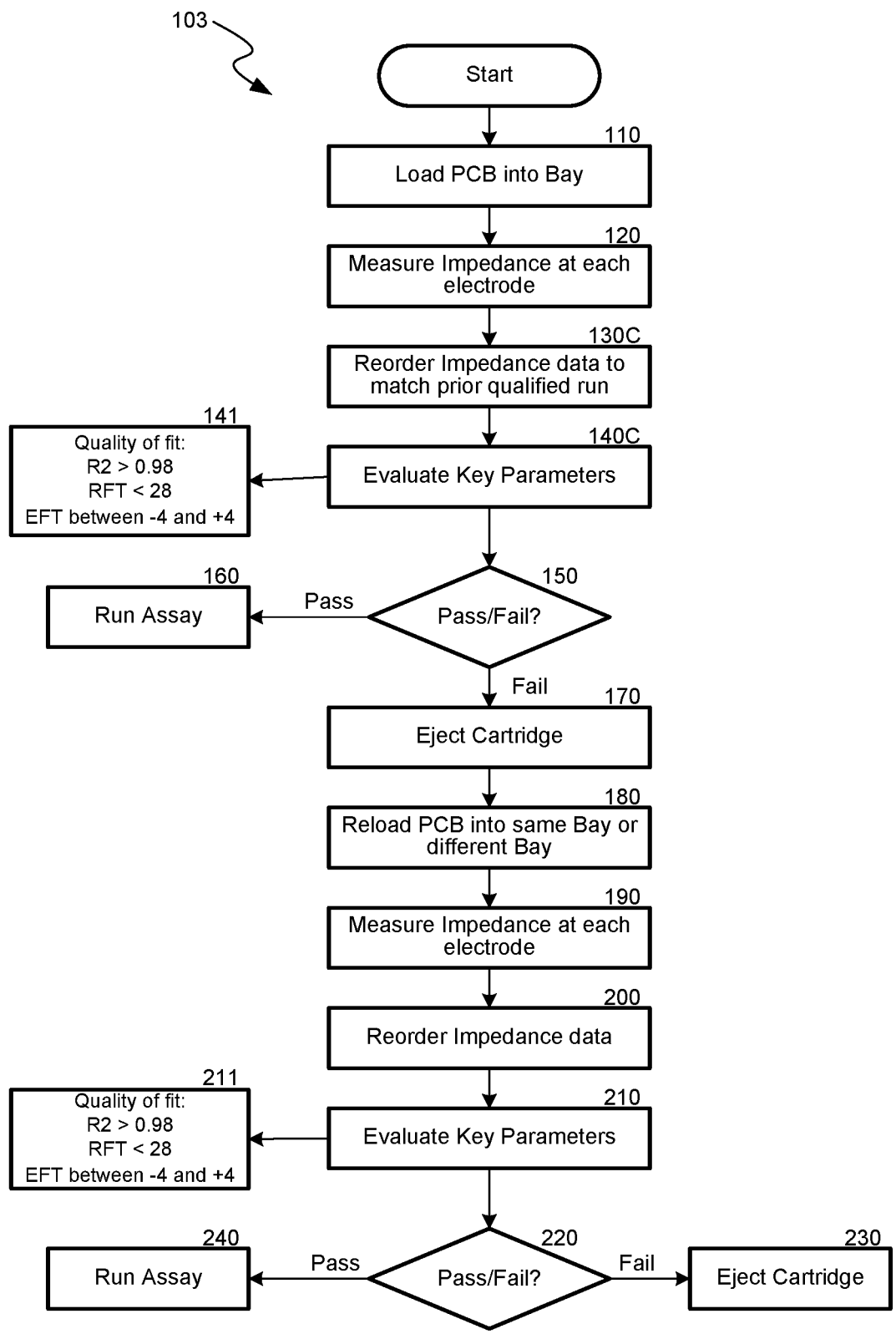

FIG. 21 illustrates an example method 103 for assessing electrical connections based on rearrangement of an input data stream in an analysis system, such as an assay cartridge qualification system. The method 103 includes the steps 110, 120 and 150 of the method 101. In the method 103 at step 130C, each in accordance with the POPE method. For example, in implementations of the step 130C, each impedance value is compared to a previously processed data block (e.g., the impedance values from a prior qualified run). In some implementations of the step 130C, the data blocks may also be re-ordered monotonically. At step 140C of the method 102, each re-ordered data block (new data block sequence) is compared to how well the new data block fits a line per the predefined parameters. The re-ordered data block sequence is compared to a line and if the new data blocks match or are within some tolerable threshold, they are considered a match. The re-ordered data block sequence is compared to the predefined parameters and if the data blocks match or are within some tolerable threshold, they are considered a match. In some embodiments of the method 103, the predefined parameters are the $R^2$, EFT, RFT or combinations thereof. The method 103 can also include the steps 170-220 of the method 101.

Other factors that can be evaluated in the QOF for the SOPE, POPE, and ROPE methods are the intercept and/or slope. For example, in some implementations, every time data is fitted to a line, two data points are generated the slope of the line and the intercept of the line. Intercept is also referred to as the offset. The intercept is where the fitted line crosses the Y intercept. In some implementations, for example, the intercept can be between 0-2000 units, e.g., preferably between 200-500 units. In some implementations, the slope of the fitted line can be between 1.5-10, e.g., preferably between 2-6. In some implementations, if the slope of the line is less than 2 the cartridge is failed.

Finding the Best Pattern: Run Matching Characteristics

In implementations of the ROPE method, once the patterns are determined, for example, the qualifier module 1806 analyses the patterns to find the best pattern. The qualifier uses the quality of the fit (QOF) to determine whether the connections are good.

In such implementations, the qualifier module 1806 may implement a search operation for identifying an acceptable match. In some implementations, a previously processed data block that fits the current data block acceptably is identified. In some implementations, the search operation can include seeking an acceptable match. In some implementations, the previously processed data block that does not fit the current data block acceptably is identified. In some implementations, the search operation can include seeking an unacceptable match. In some implementations, the search operation can include seeking an acceptable and unacceptable match. In some implementations, the previously processed data block that best matches the current data block is identified. In some implementations, the search operation can include seeking a best possible match as defined by the QOF parameters.

In some implementations, the run match characteristics are the predefined parameters. In some implementations, run matching characteristics are the same and, in some implementations, they are different. In some implementations, the number of run match characteristics is always the same and, in some implementations, they are different. For example, in some implementations, the run match characteristic is the RFT or $R^2$. In some implementations, the run match characteristic is the RFT and $R^2$. In some implementations, the first RO has a first set of run matching characteristics (such as RFT and $R^2$) while a second RO has a second set of run matching characteristics (such as RFT or $R^2$). Characteristics that can be matched include impedance, $R^2$, RFT, EFT, and combinations thereof.

In some implementations, each run match characteristic is given a run match number. In some implementations the run match number is the QOF number or the predefined parameter number. For example, a run that has a match for $R^2$ will be given a first run match number and if the run also has a match for RFT it will be given a second run match number and then the first run match number and second run match number will be given a total run match number. In some implementations, a "pass" signal is generated if the total run match number is greater than or equal to a threshold. In some implementations, a "fail" signal is generated if the total run match number is less than or equal to a threshold.

If the circuit assembly fails, for example, the steps 120-150 of the method shown FIG. 19, 20 or 21 can be repeated for a next match location (e.g., such as with a different working device).

In other implementations, each run match number is analyzed to determine "pass" or "fail", e.g., a total run match number is not generated. For example, in some implementations, a "pass" signal is generated if all the run match numbers are greater than or equal to a threshold. In some implementations, a "fail" signal is generated if all the run match numbers are less than or equal to a threshold. In some implementations, a "pass" signal is generated if one run match number is greater than or equal to a threshold. In some implementations, a "fail" signal is generated if one run match number is less than or equal to a threshold.

As alluded to above, identifying an acceptable match can take more than one route. In some implementations, the connection assessment depends on how well each electrode's impedance meets expectations—if any impedance is too far from the fitted prediction, the preflight fails. Review of internal and external data provides the basis to define the ranges and the limits, for example.

In some implementations, the run match characteristic is $R^2$. In some implementations, the $R^2$ must be acceptable. In some implementations, an acceptable $R^2$ is between 0.5-0.99. In some implementations, the run match characteristic is the RFT. In some implementations, the RFT must be acceptable. In some implementations, an acceptable RFT is between 20-30. In some implementations, the run match characteristic is $R^2$ and RFT. In some implementations, the $R^2$ and the RFT must be acceptable. In some implementations, the $R^2$ must be the highest compared to other RO models and RFT must be the lowest compared to other RO models.

In some implementations, the run match characteristic is the EFT. In some implementations, the EFT must be acceptable. In some implementations, an acceptable EFT is between −5 and +5. In some implementations, the run match characteristic is $R^2$, RFT and EFT. In some implementations, the $R^2$, the RFT, and the EFT must be acceptable. In some implementations, the $R^2$ must be the highest compared to other RO models and RFT must be the lowest compared to other RO models and the EFT must be between −4 and +4.

Example: One Data Block Matches with Two or More Previously Processed Data Blocks In some implementations, for example, one data block may match with two or more previously processed data blocks (RO). In these implementations, pass/fail can be determined based on either previously provided data block. In some implementations, if both the $R^2$ and RFT have acceptable values, the cartridge passes the preflight test. In some implementations, if one or the other of $R^2$ or RFT have acceptable values, the cartridge passes the preflight test. In some implementations, if both $R^2$ or RFT have unacceptable values, the cartridge fails the preflight test. In some implementations, if one or the other of $R^2$ or RFT have unacceptable values, the cartridge fails the preflight test.

In an illustrative example, input data stream 1 has a current data block 1 which matches with previously processed data block 1, 2, and 3. However, amongst the three previously processed data blocks, Block 1, Block 2, and Block 3, current data block 1 has the best match with, previously processed data block 3. Therefore, previously processed data Block 2 and Block 1 are discarded and the match relationship between previously processed data block 3 and current data block 1 is formed. In some implementations, when a match relationship is formed the preflight test passes. In some implementations, a match relationship must be formed and the EFT for each electrode must be between 3-5 to pass the preflight test.

In an illustrative example, input data stream 1 has a current data block 1 which has a run match characteristic with previously processed data block 1, 2, and 3. Because, current data block 1 has a run match characteristic with previously processed data block 1, 2, and 3 a match relationship between previously processed data blocks 1, 2 and 3 and current data block 1 is formed.

In an illustrative example, input data stream 1 has a current data block 1 which has a run match characteristic with previously processed data block 1, 2, and 3. Because no previously processed data block 1, 2, or 3 has a best match, no match relationship between previously processed data blocks 1, 2 or 3 and current data block 1 is formed. When no match relationship is formed the preflight test fails. In some implementations, the "best match" is the highest $R^2$ and lowest RFT. In some implementations, the "best match" is the highest $R^2$, lowest RFT, and lowest EFT.

Evaluating Each Electrode

In some implementations, for example, once a match between a current data block and a previously processed data block has been found, the qualifier module 1806 analyses each electrode to determine its fit (e.g., EFT). The qualifier uses the EFT to determine whether each electrode is connected.

In these implementations, the qualifier may include an "examine" operation to scrutinize if each electrode is connected. In some implementations, the examine operation can include seeking an acceptable tolerance. In some implementations, the examine operation can include seeking an unacceptable tolerance. In some implementations, the examine operation can include seeking an acceptable and unacceptable tolerance.

In some implementations, the examine characteristics include the QOF number or the predefined parameter number. In some implementations, examine characteristics are the same and, in some implementations, they are different for each electrode. In some implementations, the number of examine characteristics is always the same and, in some implementations, they are different. For example, in some implementations, the examine characteristic is the EFT. In some implementations, the examine characteristic is the EFT and the impedance value. In some implementations, the first RO has one set of matching examine characteristics (e.g., such as EFT and impedance value) while a second RO has a different set of matching examine characteristics (e.g., such as EFT or impedance value). Examine characteristics that can be matched are the EFT, impedance value or amplitude or combinations thereof.

In some implementations, each examine matching characteristic is given an electrode match number. For example, a run that has a match for EFT will be given a first electrode match number and if the run also has a match for the impedance value it will be given a second electrode match number and then the first electrode match number and second electrode match number will be given a total electrode match number. In some implementations, a "pass" signal is generated if the total electrode match number is greater than or equal to a threshold. In some implementations, a "fail" signal is generated if the total electrode match number is less than or equal to a threshold. For example, if the circuit assembly fails in implementations of the method, the steps 120-150 of the method shown FIG. 19, 20 or 21 can be repeated for a next match location (a bay on a different assay device or a different bay on the same assay device or even the same bay) if the total electrode match number at a match location is less than the threshold, e.g., at steps 180-220.

In other implementations, each electrode match number is analyzed to determine "pass" or "fail", e.g., a total electrode match number is not generated. For example, in some implementations, a "pass" signal is generated if all the electrode match numbers are greater than or equal to a threshold. In some implementations, a "pass" signal is generated if one electrode match number is greater than or equal to a threshold. In some implementations, a "fail" signal is generated if all the electrode match numbers are less than or equal to a threshold. In some implementations, a "fail" signal is generated if one electrode match number is less than or equal to a threshold.

In some implementations, the examine matching characteristics is EFT. In some implementations, the EFT must be acceptable. In some implementations, an acceptable EFT is between 0 and less than 5. In some implementations, an acceptable EFT is about 4 (open) or greater than −4 (short).

Determine Quality of the Fit

In various implementations of the step 140, 140B or 14C of the method of any of FIG. 19, 20 or 21, respectively, a quality of the fit (QOF) number is generated. In some implementations, each data point in the QOF number corresponds to one electrode location (EFT) and/or for all of the electrode locations combined (RFT and/or $R^2$). The QOF number can be evaluated for pass/fail. As one example, the input data stream can include 130 data blocks. A QOF number is generated after processing all of the 130 data blocks in the input data stream. For example, the QOF number can include a value for all of the data block values combined (RFT and $R^2$) and for each data block (EFT).

In some implementations, the QOF number includes the QOF parameters or predefined parameters. In some implementations, the QOF number includes the run match characteristic and the examine matching characteristic. In some implementations, the QOF number includes the run match number and the electrode match number.

Referring to FIGS. 27-30, these diagrams illustrate examples of an affinity matrix formed in accordance with the disclosed methods and systems. For example, as shown in FIG. 27, the example affinity matrix 300 can be formed after obtaining an impedance value for each electrode. In a second example, the affinity matrix 301, shown in FIG. 28, can be formed by assigning each current data block a new location after comparing it to a previously processed data block.

FIG. 29 shows a diagram of an example affinity matrix 302, which can be formed after comparing the current data block 1 to all 5 previously processed data blocks and generating pass/fail numbers (e.g., such as run match number (RM #), electrode match number (EM #), QOF number (QOF #), or combinations thereof) associated with each previously processed data block.

FIG. 30 shows a diagram of an example affinity array 303, which demonstrates an affinity number associated with each previously processed data block.

In these examples, the affinity number stands for a measure of the quality of the fit between data block x and previously provided data block y. The higher the affinity number, the stronger the match between the data blocks they represent. In addition, the affinity matrix can be formed based on a weight given to each match found. For example, a weight factor can be the number of electrodes above a predetermined limit for example 130.

In some implementations, the QOF factor for the SOPE method is based on $R^2$ and EFT (but in some instances, can include EFT). In some implementations, the QOF factor for the ROPE method is based on $R^2$, RFT and EFT. In some implementations, the QOF factor for the POPE method is based on $R^2$, RFT and EFT. Additionally, for all three methods, the QOF factor can be based on the slope of the line and/or the intercept, for example.

Determine if Additional Data Needs to be Analyzed.

Figure 22:
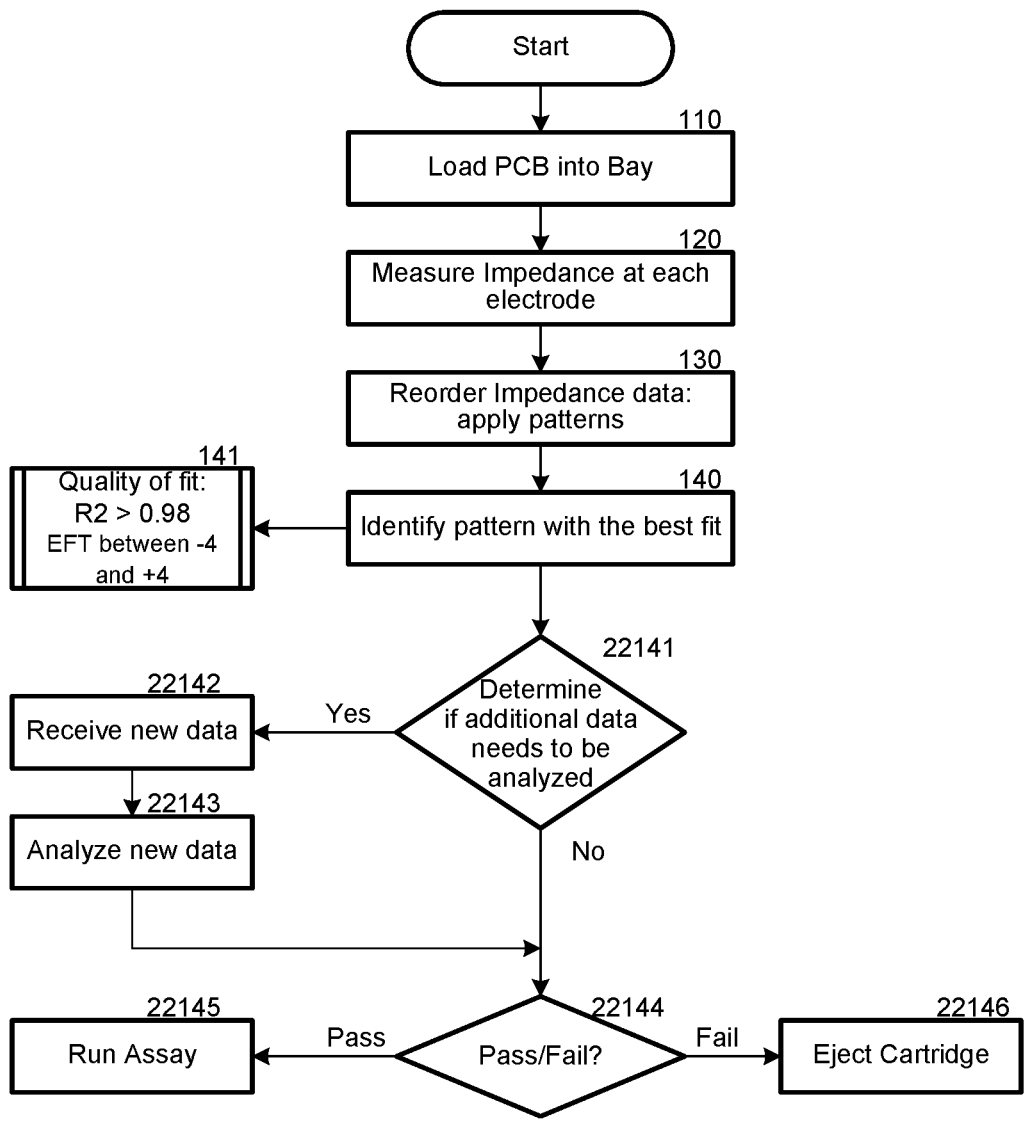

FIG. 22 illustrates an alternate example of the method 101, 102 or 103 that includes making a check to determine if additional data needs to be analyzed. As shown in step 22141, the input data stream is checked to see if there is another data block in the input data stream that needs to be compared. If there is no additional data block that needs to be compared, then the method goes to step 22144 and evaluates if the original data block passes or fails. If it passes, then the circuit assembly is processed 22145 or if it fails the circuit assembly is ejected 22146. If there is another data block in the input data stream that needs to be compared, then the method goes to step 22142. At step 22142, the new data block is received. At step 22143 the new data block is analyzed. At step 22144, both the new and original data blocks are analyzed for pass/fail. In some embodiments, if both data blocks pass, then the circuit assembly is processed 22145 or if both data blocks fail the circuit assembly is ejected 22146. In some embodiments, if one or the other data blocks passes, then the circuit assembly is processed 22145 or if one or the other data blocks fail the circuit assembly is ejected 22146.

It is noted that, while the diagrams of FIGS. 19-21 include steps 110-240 that are arranged serially in the exemplary embodiments, other embodiments of the subject matter may execute two or more steps that can be implemented in parallel, e.g., using multiple processors or a single processor organized as two or more virtual machines or sub-processors. Moreover, still other embodiments may implement the steps as two or more specific interconnected hardware modules with related control and data signals communicated between and through the modules, or as portions of an application-specific integrated circuit. Thus, the example process flow diagrams are applicable to software, firmware, and/or hardware implementations.

Excluding Certain Impedance Values

Prior to rearranging or after rearranging impedance values, certain data blocks can be excluded from the pass/fail analysis. In some implementations, for example, data blocks may be excluded for two reasons (1) the electrode is highly variable run-to-run or, (2) the electrode's impedance measurement is too high or too low.

Highly Variable Electrodes

In some embodiments, data blocks from known highly variable electrodes are excluded. In examples of different impedance values, a highly variable electrode is an electrode which, run-to-run, gives very different impedance values. In some implementations, a highly variable electrode varies by more than about 100 units between runs. In some implementations, a highly variable electrode varies by about 100-2000 units between runs. In this context, "unit" in relation to impedance values refers to the inverse of an ohm, e.g., 2 ohms=0.5 units.

In examples of variability of their scaled error across multiple runs, highly variable electrodes are identified by having unacceptable variability of their scaled error across multiple runs, e.g., runs performed on the same bay with different cartridges. To identify high variability electrodes across multiple runs, the variability of their scaled error across N runs is determined—electrodes with standard deviation of the scaled error >1.5 may be excluded.

Adjusting the Fit of Certain Impedance Values

In some implementations, the index of each ordered electrode is adjusted, e.g., "stretched out" to improve the linearity of the fit. See FIG. 2A, see the spaces between x-values—indices—124 and 142).

Electrode's Impedance Measurement

In some implementations, certain electrodes can be excluded because their impedance value is too high or too low or combinations thereof. In some implementations, for example, an impedance value of above about 2000 units is considered too high and is excluded. In some implementations, for example, an impedance value of between 2000-25000 units is considered too high and is excluded. In some implementations, for example, an impedance value of below 100 units is considered too low and is excluded. In some implementations, for example, an impedance value of between 0-100 units is considered too low and is excluded. In this context, "unit" in relation to impedance values refers to the inverse of an ohm, e.g., 2 ohms=0.5 units.

In some implementations, electrodes with an impedance value that is too high or too low are identified by having unacceptable variability of their minimum scaled error or maximum scaled error or combinations thereof.

Example Embodiments of an Assay System Including an Assay Cartridge and an Assay Processing Device FIG. 31A shows a schematic illustration of an example embodiment of an assay processing device of an assay system, such as an automated, cartridge-multiplexing electrochemical detection system. The assay processing device 3140 includes a base station 3141 that includes a control console 3142, which in some embodiments includes a user interface. The assay processing device 3140 includes an instrument bank 3145 that includes one or more cartridge processing modules ("bays") 3146 operatively coupled to the base station 3141. In the example shown, the assay processing device 3140 can include a plurality of instrument banks 3145 operatively connected to the base station 3141. The one or more cartridge bays 3146 of the instrument bank 3145 are configured to receive an assay cartridge (not shown) and process the cartridge, e.g., independently of other bays. In some embodiments, the instrument bank 3145 is operatively coupled to the base station 3145 to exchange power, input and output data, and control signal transmissions, which can be from processed user inputs entered on the control console 3142. In implementations of the assay processing system to perform an assay on the assay cartridge loaded in a cartridge bay 3146, the system can conduct a preflight test of the electrical connections between the electronics of the assay cartridge (e.g., PCB) and the electronics of the cartridge bay 3146 (e.g., "working device") in accordance with the disclosed methods, e.g., the method 1815 and method 1831.

PCB of an Example Assay Cartridge

An example of a printed circuit board (PCB) of an assay cartridge that may be used in example implementations of the disclosed systems and methods for assessing electrical connections between the assay cartridge and an assay processing device is described.

Figure 23:
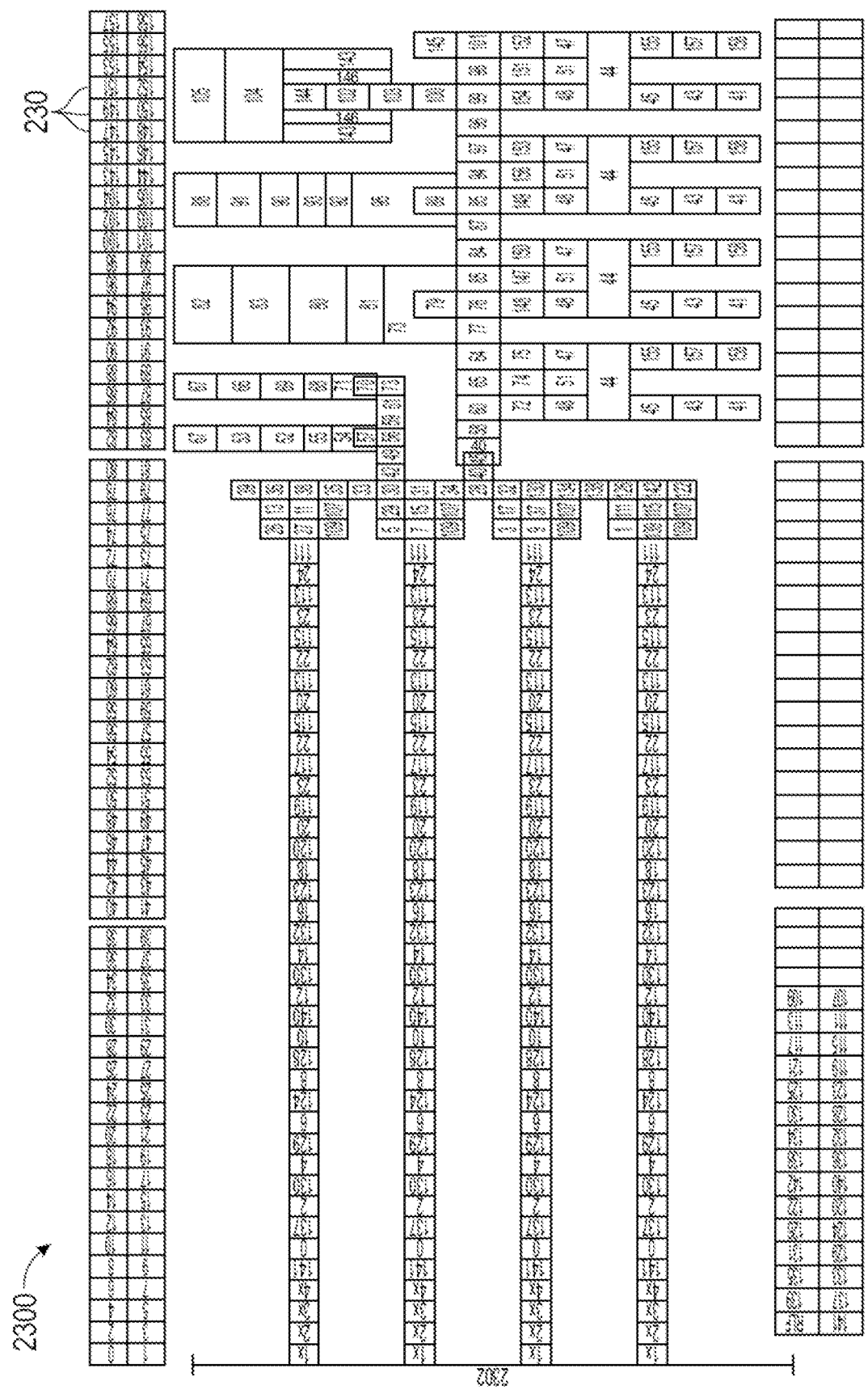
FIG. 23 shows a diagram of an example printed circuit board for an assay cartridge device.

FIG. 23 shows a diagram of an example PCB 2300 of an assay cartridge device. The PCB 2300 includes a first surface and a second surface. One or more pre-defined areas defined on the first surface provide a PCB plane for the location of one or more electrical components thereon. One or more test pads provided on the second surface allow electrical testing of the solder connection between the PCB 2300 and/or one or more electrical components of another electronic device, such as electrical components in an assay cartridge bay. Two or more connectivity points are provided on the first surface in each of said pre-defined areas.

The diagram of FIG. 23 illustrates the electrowetting connections to a cartridge, e.g., the numbered arrays along the top and bottom. The electrodes are numbered geometrically without regard to their expected electrical properties. The numbered boxes between the top and bottom arrays represent the electrowetting pads of the cartridge/consumable. The cartridge depicted in FIG. 23 has a bi-planer portion and a co-planer portion. Opens cannot be detected over the co-planer portion but shorts can. The bi-planer portion can detect both opens and shorts.

Figure 26A:
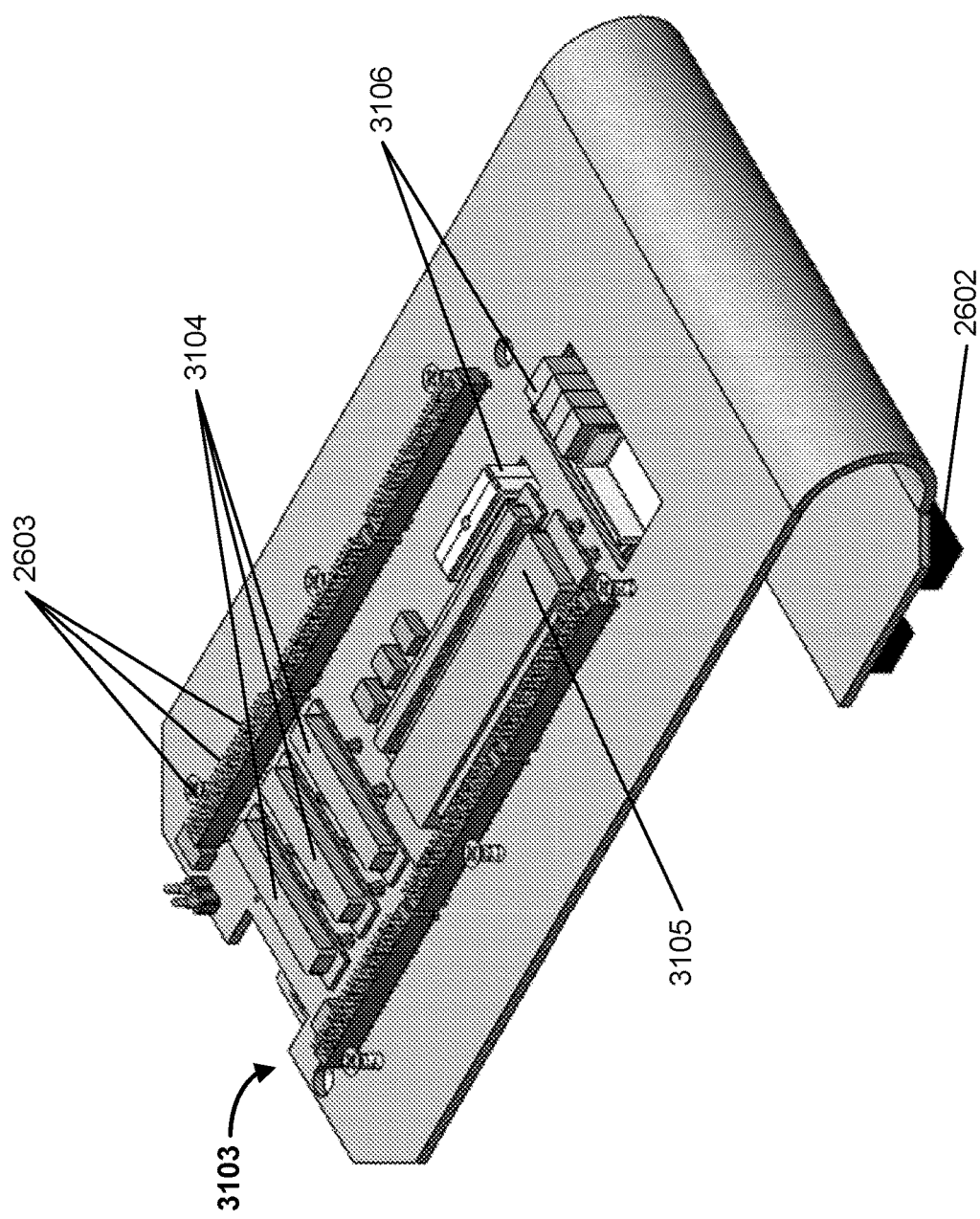
FIGS. 26A and 26B show schematic illustrations of an example connector board and plate of an example embodiment of a connector board assembly of an assay cartridge bay.
Figure 26B:
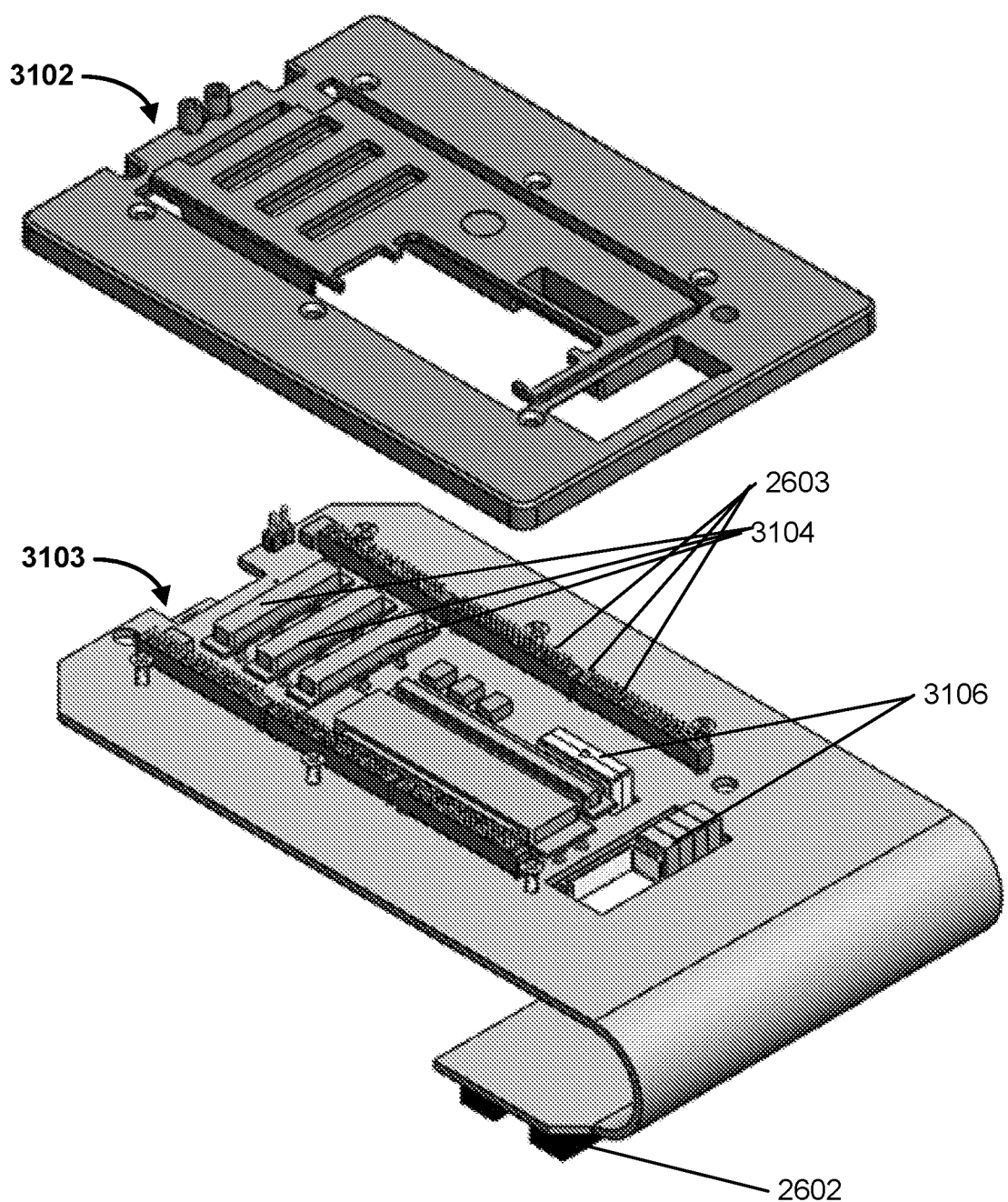

The example PCB 2300 includes 158 PCB electrodes/pads 2301 that connect to a connector board of another electronic device, e.g., such as a connector board shown in FIGS. 26A and 26B. Trace wires (not shown) connect the electrowetting pad electrodes 2302 to the PCB electrodes/pads 2301. The PCB electrodes/pads 2301 interface with the connector board assembly electrodes, e.g., depicted in FIGS. 26A and 26B.

Connection Between Circuit Assembly of an Assay Cartridge and Working Instrument To measure impedance in a preflight test of an assay cartridge in a processing bay, for example, the circuit assembly and working instrument must be connected. FIGS. 31B-31E show schematic illustrations depicting portions of an example electronic device for an assay cartridge processing bay ("working device" or "working instrument") and of a cartridge PCB in electrical connection with the working instrument.

FIG. 31B shows an example connector board assembly 3100 of an assay cartridge bay, like 3146, shown without an interfacing PCB from an assay cartridge. The connector board assembly 3100 can include a support structure 3101 and support plate 3102, which can provide a structural housing for the electronic components of the connector board assembly 3100. The connector board assembly 3100 can include a connector board 3103, described in further detail below, which can be flexible. In some example embodiments, such as for assays that include polymerase chain reaction (PCR), the connector board assembly 3100 can include PCR heaters 3104 and detection heaters 3105. In some example embodiments, the connector board assembly 3100 can include magnets 3106, e.g., for capturing magnetic beads in the sample.

Figure 31C:
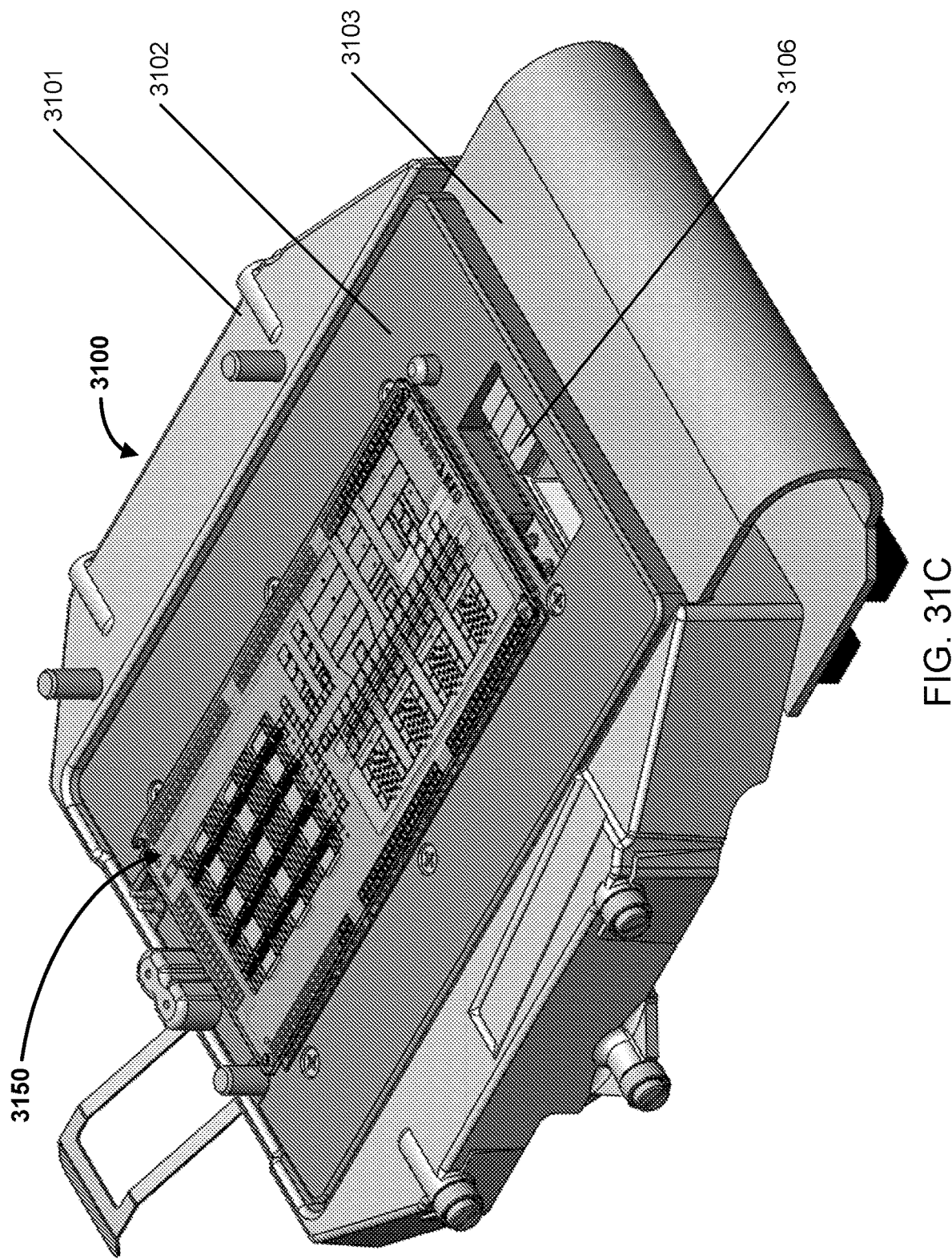

FIG. 31C shows the connector board assembly 3100 electrically interfaced with a PCB 3150 of an assay cartridge, which is depicted in the diagram of FIG. 31C as transparent, i.e., the features of PCB 3150 outlined in solid lines over a transparent background so that the underlying features of the connector board assembly 3100 can be seen. The features of the example PCB 3150 are shown in the diagram of FIG. 23 for the PCB 2300.

Figure 31D:
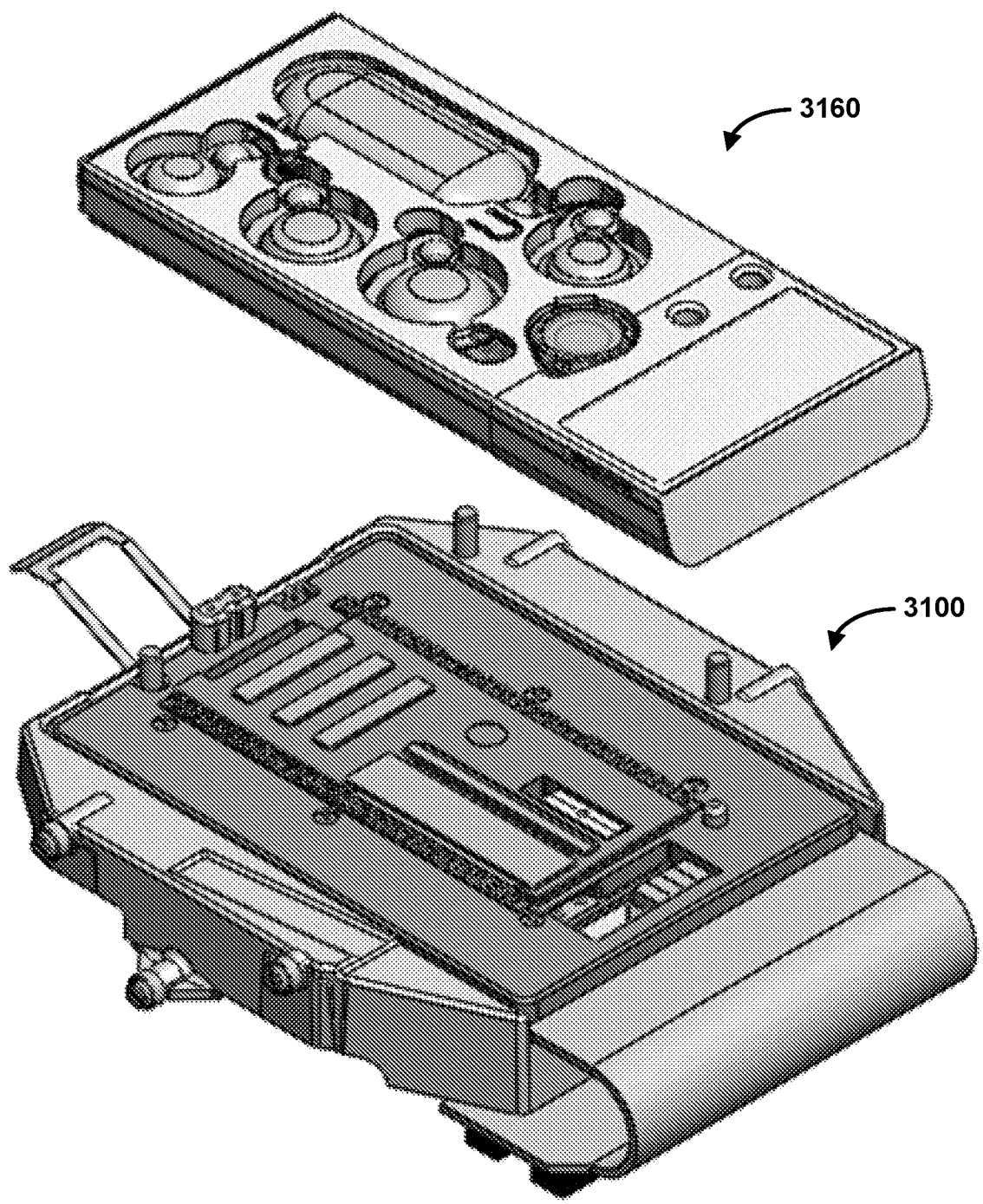

FIG. 31D shows a diagram illustrating the connector board assembly 3100 with an assay cartridge 3160 which comprises the PCB 3150 (in a lower region of the assay cartridge 3160, not shown in FIG. 31D). In some embodiments, the connector board assembly 3100 can engage/disengage with the assay cartridge 3160 by moving up and down via a screw (not shown).

Figure 31E:
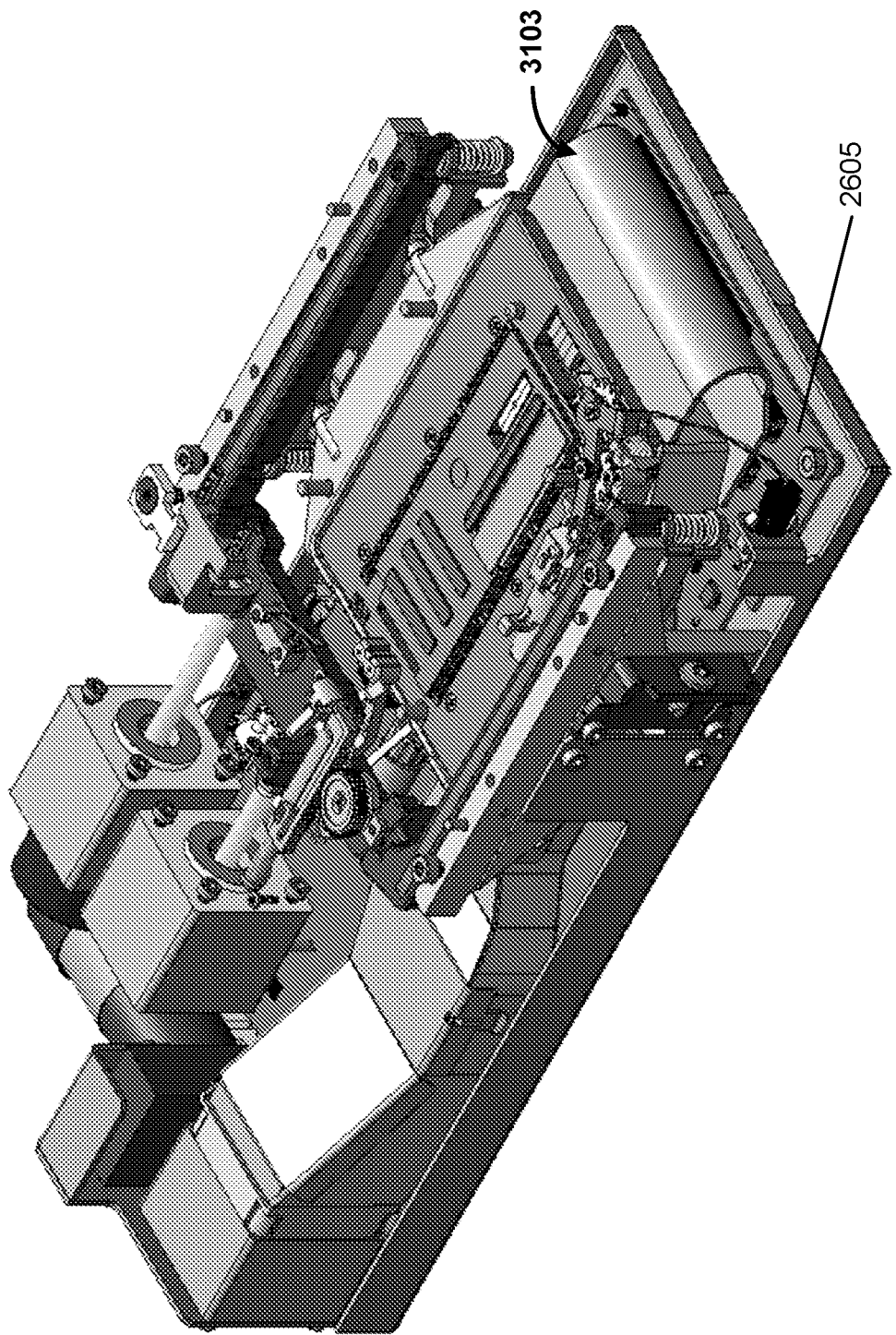
FIG. 31E shows a schematic illustration depicting portions of an assay cartridge processing bay (bottom bay).

FIG. 31E shows a perspective view of the example connector board assembly 3100 electrically interfaced with the other components of the electronic device ("working device") of the cartridge bay 3146. Further details of the example cartridge bay 3146 and the assay cartridge are described in U.S. Pat. No. 9,498,778, e.g., at FIGS. 36-43 of U.S. Pat. No. 9,498,778, which is incorporated by reference in its entirety for all purposes.

The connector board 3103 (also shown in FIG. 26B) can include pogo pins 2603 (shown in FIGS. 26A and 26B), which connect the electrodes on the connector board assembly to the cartridge PCB. The connector board 3103 can include high-density connectors 2602 (shown in FIGS. 26A and 26B), which connect the electrodes on the connector board assembly to a PCB 2605 on the bay, as shown in FIG. 31E. The pogo pins are connected to the connector board assembly high-density connectors via trace wires (not shown). Pogo pins are spring loaded electrodes.

FIG. 26A shows a schematic diagram of an example embodiment of the connector board 3103 of the example connector board assembly 3100. In this example, the connector board 3103 includes pogo pins 2603 that are spring loaded electrodes. In some embodiments, the electrodes on the connector board assembly 3100 are not spring loaded. For example, there is a 1:1 relationship between the pogo pins 2603 on the connector board and the electrodes on the cartridge PCB. Also, for example, there is a 1:1 relationship between the electrodes on the connector board's high density connector 2602 and the electrodes on the bay PCB (shown in FIG. 31E). In this way, electricity can be provided from the bay PCB to the connector board assembly high-density connectors 2602, and to the connector board assembly pogo pins 2603 to the cartridge PCB. As shown in this example, the connector board 3103 includes magnets 3106 and heaters 3104 and 3105.

FIG. 26B shows an exploded view of the support plate 3102 and the connector board 3103 of the example connector board assembly 3100. Shown are the connector board's high density connector 2602, pogo pins 2603, heaters 3104 and 3105 and magnets 3106.

Example Applications

The systems and methods in accordance with the disclosed technology can also be used to ensure that each time a subsystem is added to a system the new subsystem is properly integrated. For example, in the ePlex® system produced by GenMark Diagnostics, Inc., each time a new bay is added to an instrument (e.g., replacing a broken bay, non-performing bay or an updated bay), the bay is evaluated to ensure proper function. Part of the evaluation includes running test cartridges to ensure a proper connection is formed between the new bay and cartridges. Under conventional methods, a properly installed bay could be un-installed and re-installed because cartridges were failing the pre-flight test when in fact they were properly connected, thus wasting time, effort and bays. In contrast, in example implementation of the disclosed methods, instead of ejecting the cartridge, a "fail" signal (step 150 of the method 101 illustrated in FIG. 19) is interpreted to mean the bay was improperly installed. The fail signal at step 150 is particularly indicative of an improper bay installation if the bay had previously been used on another instrument and functioned properly. The fail signal at step 150 is particularly indicative of an improper bay installation if the bay type had previously been used on another instrument and functioned properly.

Example Data and Results

Example 1: Variability Based on Strict Preflight Impedance Testing

Figure 24:
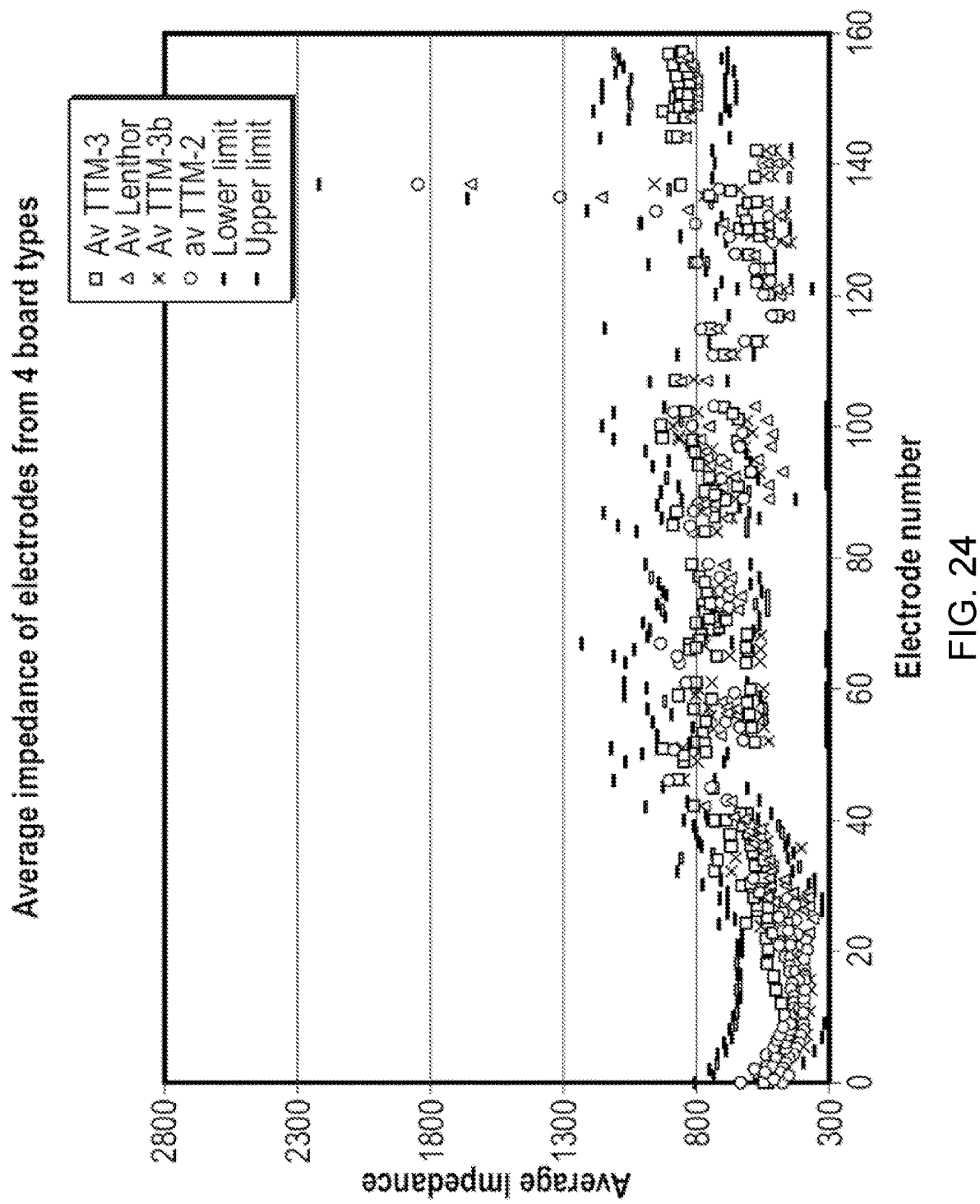
FIG. 24 shows a data plot depicting example average impedance values for each electrode across multiple bays of different types of assay cartridge bays.

FIG. 24 shows a data plot depicting example average impedance values for each electrode across multiple bays of different types of assay cartridge bays (e.g., TTM-2, TTM-3TTM-3b, and Lenthor) using the impedance threshold method. Also plotted are the pass/fail limits for the impedance measurements. As can be seen, every electrode has its own limits. As can be seen there is no relationship between the electrodes. As shown in the example data, the variability between the different board types is shown most clearly for electrode 137, but electrodes in the 20-30 range, the 50-65 range, and the 90-100 range also show substantial differences between bay types. In FIG. 24, the Y-axis is conductance (inverse of ohm) and the X-axis is the electrode number (i.e. not re-ordered). This data demonstrates how difficult it is to assess the impedance data across multiple bays.

Figure 25:
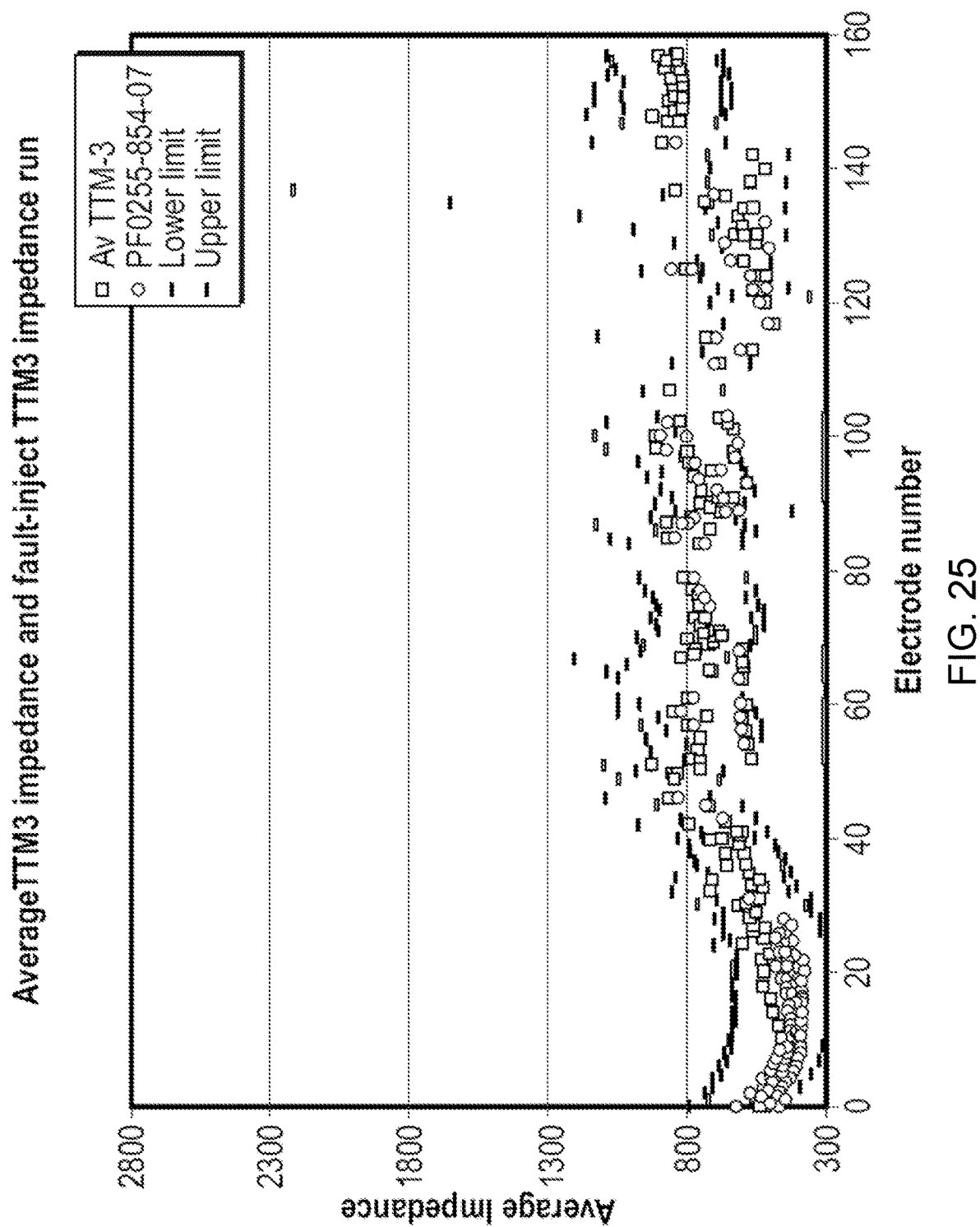
FIG. 25 shows a data plot depicting average impedance values associated with an example TTM3 bay, which illustrates the difficulty in making an accurate pass/fail call on a cartridge with a defect.

FIG. 25 shows a data plot depicting average impedance values associated with an example TTM3 bay. The example data in FIG. 25 illustrates the difficulty in making an accurate pass/fail call on a sample with a defect. The squares on the chart show the average of the TTM-3 impedance readings across many cartridges along with the electrode-by-electrode pass/fail limits. The circles show the impedance readings for each electrode of one cartridge run on one bay. For example, electrode 125 of this cartridge has a defect (short), and although the impedance measurement of this electrode appears higher than the average measurement of this electrode, its value still passes. As a result, the system would run the assay and a potential false negative would result potentially impacting patient care.

The example data in FIGS. 24 and 25 illustrates that variability based on strict preflight impedance testing can make it difficult to achieve accuracy, e.g., it is subject to false failures or false passes. For example, if the limits are tight enough to minimize false passes, the rate of false failures grows, but if the limits are loose enough to accommodate bay-to-bay variability and minimize false failures, the rate of false passes grows. Moreover, because the upper and lower limits change over the course of the year (data not shown), the limits need to either be constantly re-evaluated or a wider limit set to avoid false failures (but this in turn obscures true failures).

Example 2: Determining the Expected Order Based on a TTM-2 Bay

The differences in manufactured cartridge bays that are different from one another of their type may be caused by bay manufacturing variation, process variability, supplier changes, design changes, and other effects. While these variabilities may be thought to be small and have little or no impact on validity, instead such variations can lead to changes in assay validity because the differences impact pre-flight pass/fail determinations. As such impedance characteristics of electrodes from four different cartridge bay types from Genmark Diagnostics, Inc. have been characterized, including the TTM-2, TTM-3, TTM-3b, and Lenthor type bays.

The TTM-2 bay was the first released variety of bays. In example implementations using the TTM-2 bay, data was collected from over 6300 preflight files from internal and external systems. The internal data includes test runs, quality control runs, and verification runs that include open and short fault injects.

FIG. 1 shows a data plot depicting average impedance values obtained from all electrodes on example PCBs of assay cartridges run in TTM-2 bays and plotted monotonically. In FIG. 1, the Y-axis is conductance (inverse of ohm) and the X-axis is the ordered index (electrodes ordered monotonically). The slope of the line is indicated as 5.1957 and the Intercept is 338.04. Here $R^2$ is 0.7775, applying the quality factor this cartridge would be ejected because $R^2$ is not greater than 0.98.

Figure 2A:
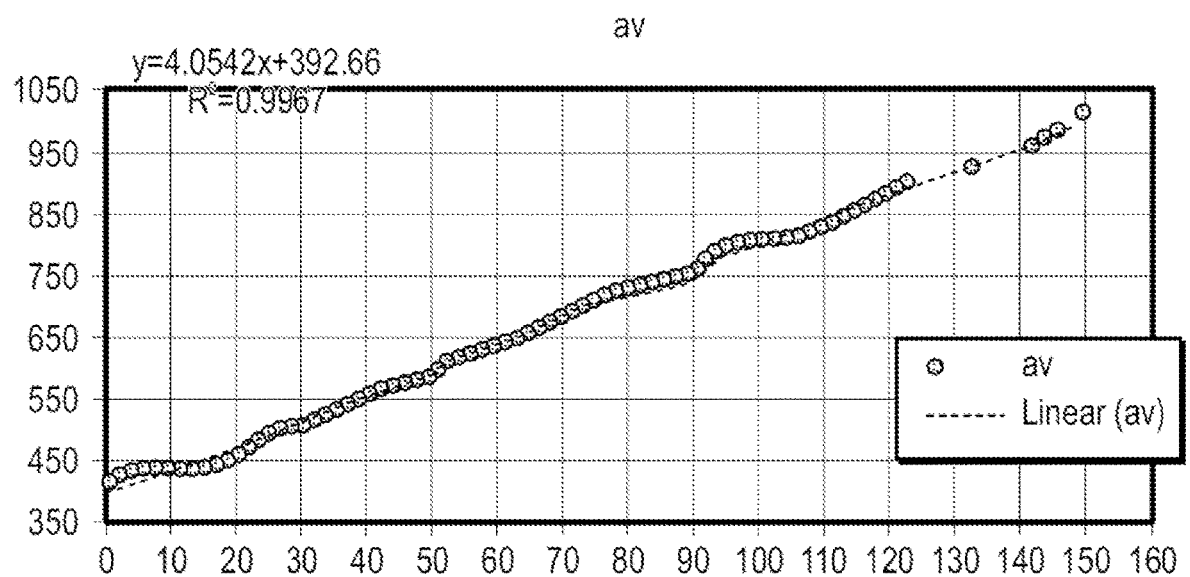
FIG. 2A shows a data plot depicting average impedance values for electrodes on PCBs of assay cartridges run in TTM-2 bays and plotted monotonically that fit a linear line.

FIG. 2A shows a data plot depicting average impedance values obtained from all electrodes on example PCBs of assay cartridges run in TTM-2 bays and plotted monotonically that fit a linear line, e.g., electrodes excluded and stretched to fit a linear line. In this example, high variability electrodes and all electrodes with impedance greater than 2000 are excluded. The high variability electrodes were identified by the variability of their scaled error across all 6300 runs. Electrodes with standard deviation of the scaled error >1.5 were excluded. After selecting the electrodes, the index of each ordered electrode was adjusted to improve the linearity of the fit (see the spaces between x-values—indices—124 and 142). The linear range was determined subjectively from FIG. 1. For example, in FIG. 2A, the Y-axis is conductance (inverse of ohm) and the X-axis is the ordered index (electrodes ordered monotonically). The slope of the line is indicated as 4.0542 and the Intercept is 392.66. Here, in FIG. 2A, $R^2$ is 0.9968, applying the quality factors this cartridge would be processed because $R^2$ is greater than 0.98. For example, this demonstrates that excluding high variability electrodes, electrodes with impedance greater than 2000 and adjusting the fit from the data shown in FIG. 1 changes the result from ejecting the cartridge to processing the cartridge. FIG. 2A is an example of the SOPE method.

Figure 2B:
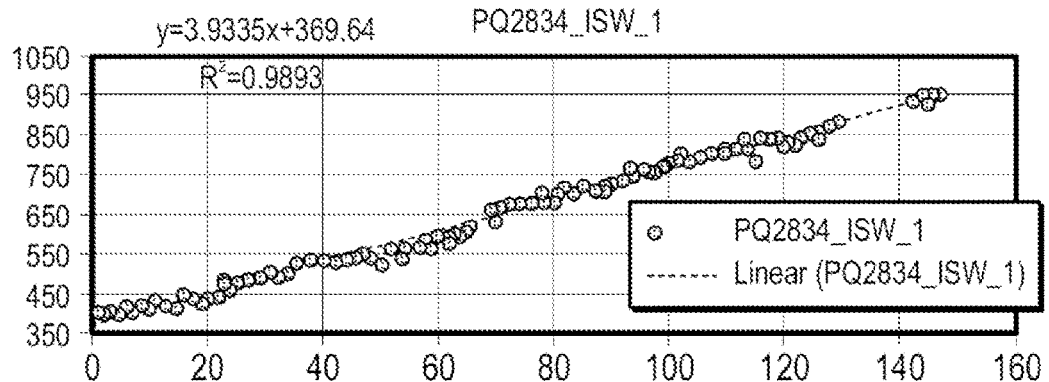
FIGS. 2B-2D show data plots depicting impedance data from three different cartridges run in example TTM-2 bays.
Figure 2C:
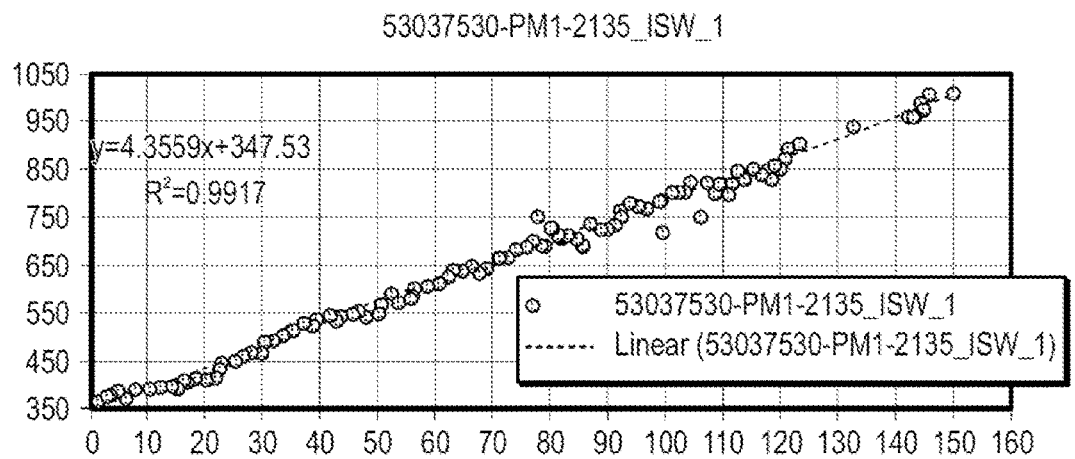
Figure 2D:
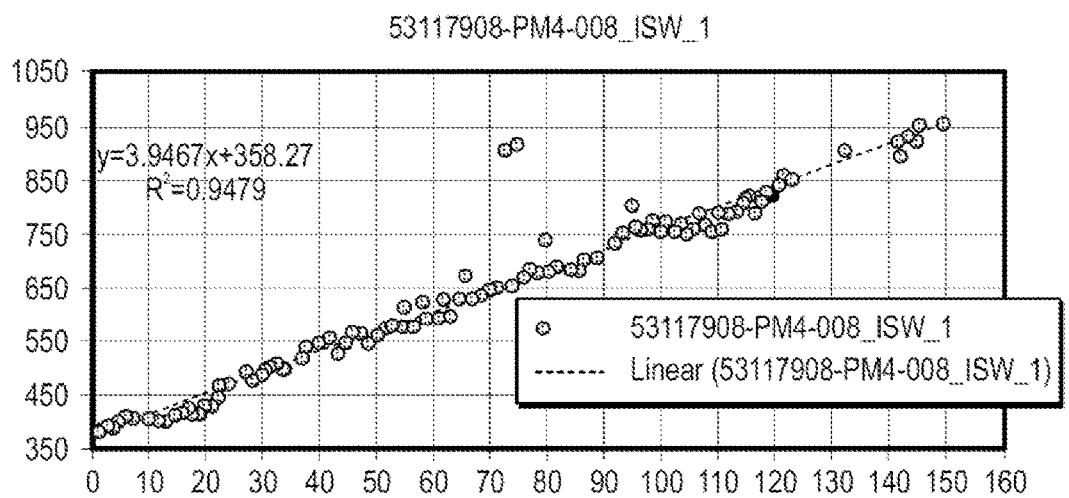

FIGS. 2B-2D show data plots depicting impedance data from 3 different cartridges run on TTM-2 bay types. FIG. 2B shows no defects, no failing electrodes. FIG. 2C shows two failing electrodes (opens) at index 100 and index 106. FIG. 2D shows two failing electrodes (shorts) at index 73 and index 75. Shorts occur most often between neighboring electrodes, and these electrodes are neighbors. In FIGS. 2B-2D, the Y-axis is conductance (inverse of ohm) and the X-axis is the ordered index (electrodes ordered monotonically). The slope of the line is indicated as Y and the Intercept is the number added to the slope value. $R^2$ is also shown. FIGS. 2B-2D show data from example implementations of the SOPE method, where, the data from FIGS. 2B and 2C indicates that the PCB cartridge would be processed because $R^2$ is greater than 0.98; but the data from FIG. 2D indicates that the PCB cartridge would be ejected because $R^2$ is not greater than 0.98.

Figure 3:
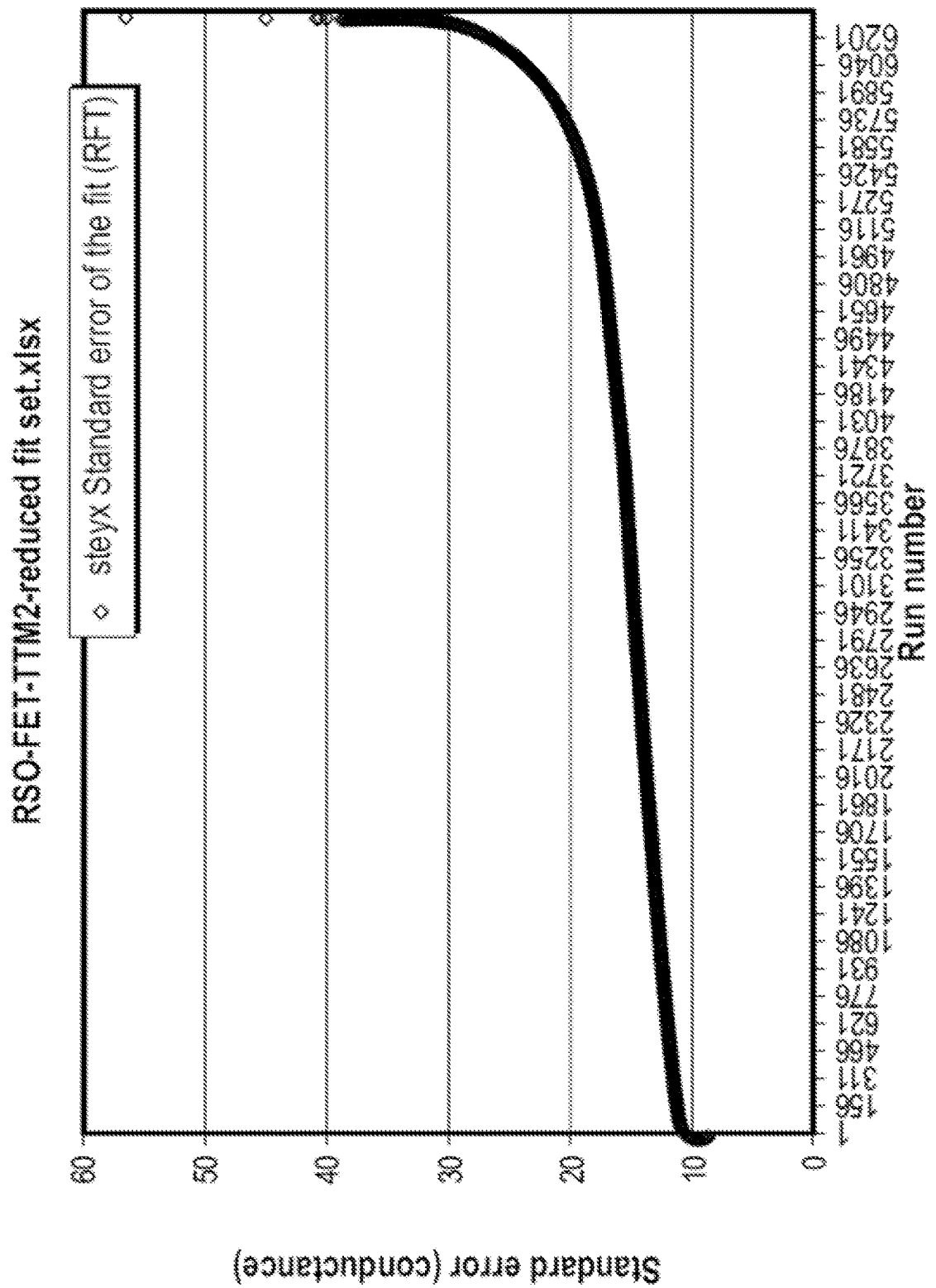
FIG. 3 shows a data plot depicting the worst standard error of the fit (RFT) from each run in the TTM-2 bay.

FIG. 3 shows a data plot depicting the standard error of the fit (RFT) for each run on the TTM-2 bays. For the TTM2 data set, the line steepens at about 28 and 28 is considered the subjective break line. Here, the worst point from each run is plotted. In this example, any electrode with a standard error of the fit above 28 means the cartridge is not processed.

Next the data was assessed to determine if the cartridge contained an open or short circuit. To do this, impedance values were re-ranked according to key parameters to look for a subjective break value.

Figure 4:
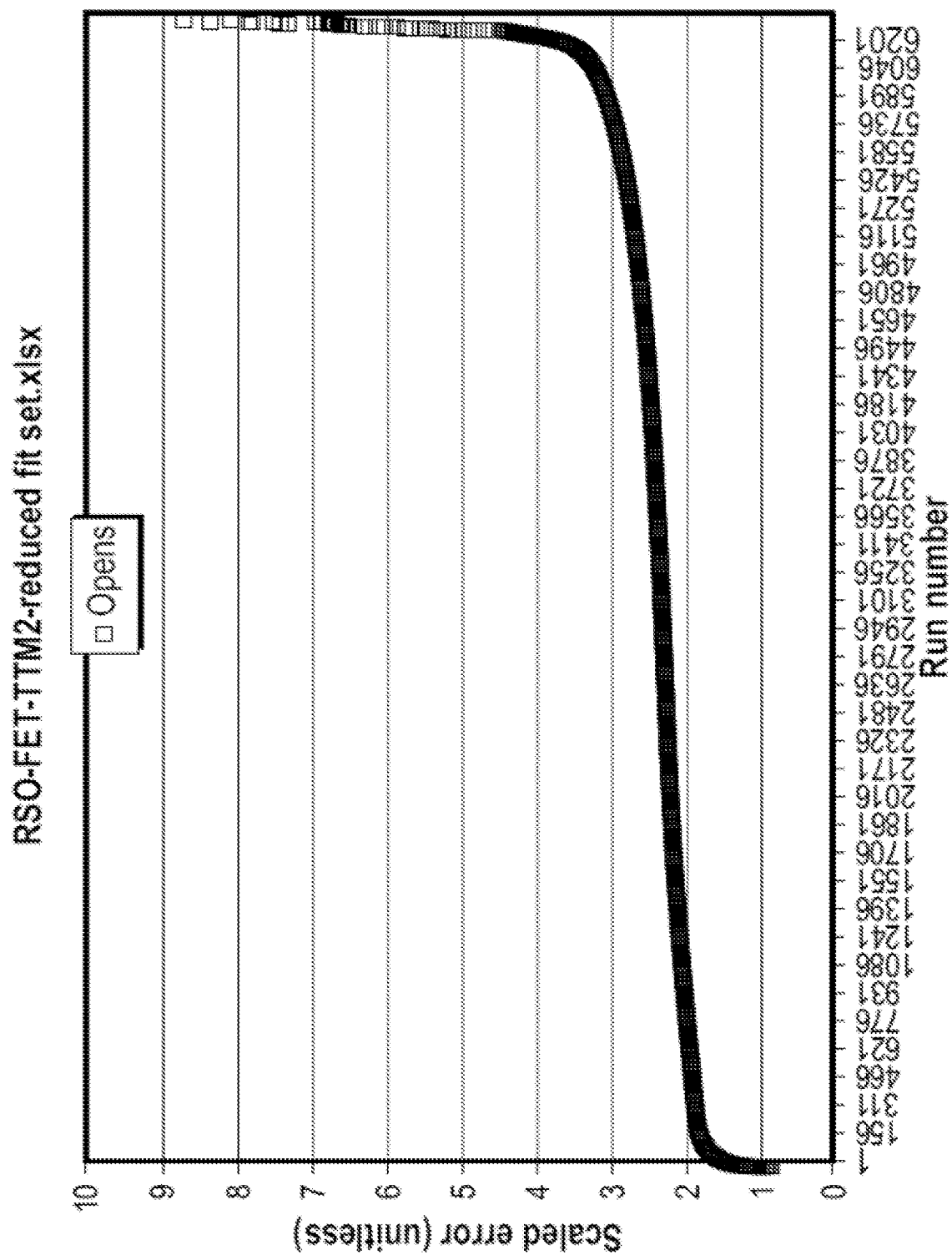
FIG. 4 shows a data plot depicting the data re-ranked according to a maximum scaled error across the electrodes for each run in the TTM-2 bay.

FIG. 4 shows the data re-ranked according to the maximum scaled error (open) across the electrodes for each run. This data set looks for sensitivity to possible open circuits. Because the line steepens at about 4 it is assumed that everything above 4 is a true open circuit. Thus, 4 is set as the subjective break value. Opens are shown at +4.0 and above.

Figure 5:
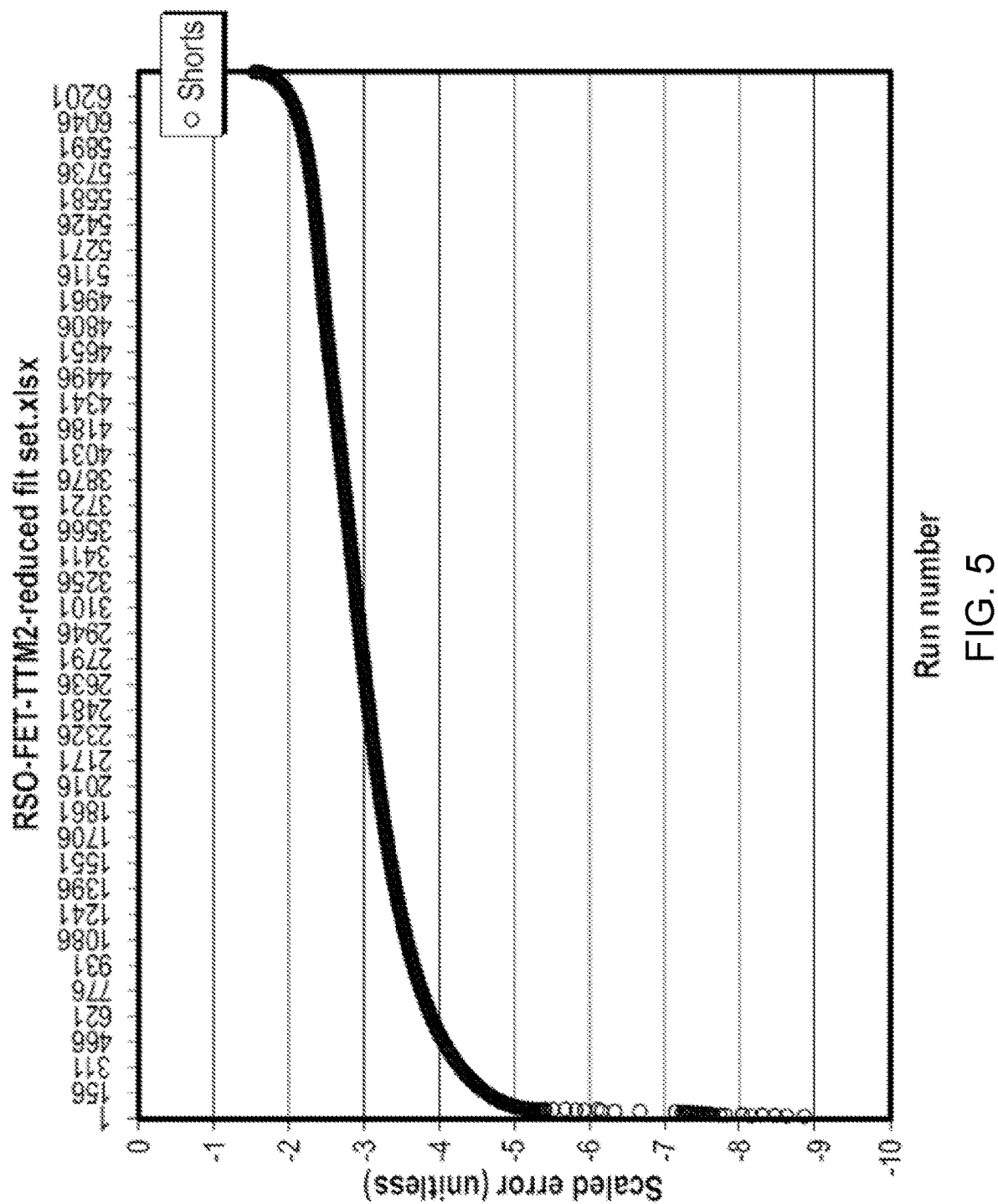
FIG. 5 shows a data plot depicting the data re-ranked according to a minimum scaled error across the electrodes for each run in the TTM-2 bay.

FIG. 5 shows the data re-ranked according to the minimum scaled error (shorts) across the electrodes for each run. This data set looks for sensitivity to possible short circuits. Because the line steepens at about −4 it is assumed that everything below −4 is a true short circuit. Thus, −4 is set as the subjective break value. Shorts are shown at −4.0 and below.

Once the expected order on the TTM-2 bay is determined, the order can be used in the ROPE method.

Example 3: Determining the Expected Order Based on a TTM3 Bay

The TTM3 bay was the second released variety of bays.
The TTM-3 bay was the second released variety of bays. In example implementations using the TTM-3 bay, data was collected from over 170 preflight files used for testing the TTM-3 design.

Figure 6A:
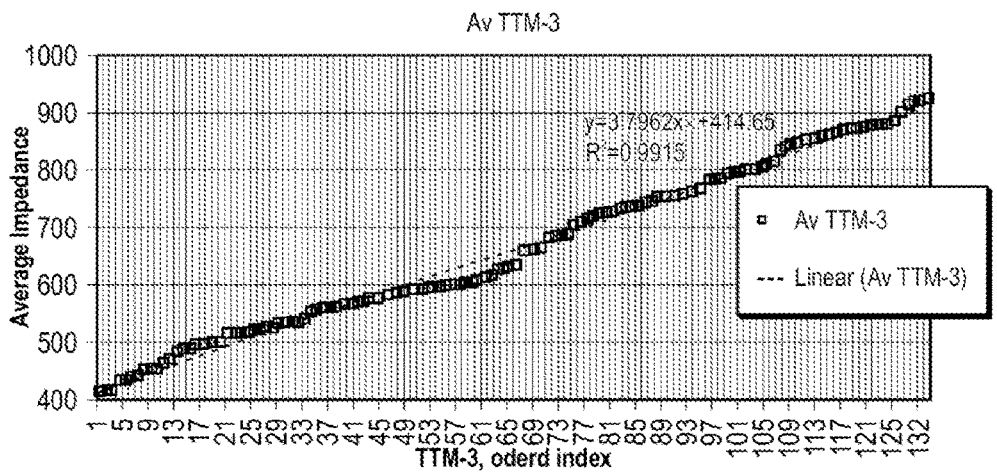
FIG. 6A shows a data plot depicting the average impedance for electrodes on PCBs of assay cartridges when run in a TTM-3 bay and plotted monotonically.

FIG. 6A shows a data plot depicting average impedance values obtained from all electrodes on example PCBs of assay cartridges run in TTM3 bays and plotted monotonically (excluding high variability electrodes and all electrodes with impedance greater than 2000). The high variability electrodes were identified by the variability of their scaled error across all 170 runs. Electrodes with standard deviation of the scaled error >1.5 were excluded. For the TTM-3 data, the 5 electrodes measuring the highest impedances fall above the best-fit line. Assigning these points higher index values improves the fit of the line (the R2 increases from 0.9915 to 0.992). In FIG. 6A, the Y-axis is conductance (inverse of ohm) and the X-axis is the ordered index (electrodes ordered monotonically). The slope of the line is indicated as 3.7962 and the Intercept is 414.65. Here $R^2$ is 0.9915, applying the quality factors this cartridge would be processed because $R^2$ is greater than 0.98. This is an example of the SOPE method.

Figure 6B:
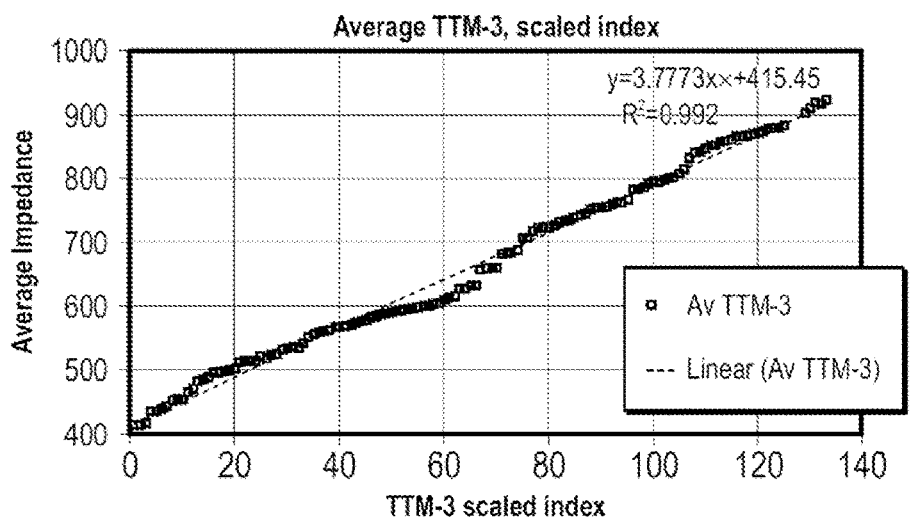
FIG. 6B shows a data plot depicting average impedance values for electrodes on PCBs of assay cartridges run in TTM-3 bays and plotted monotonically that fit a linear line.

FIG. 6B shows a data plot depicting average impedance values for electrodes on PCBs of assay cartridges run in TTM-3 bays and plotted monotonically that fit a linear line. In FIG. 6B, the index of each ordered electrode was adjusted to improve the linearity of the fit (see the spaces between x-values—indices—123). The linear range was determined subjectively from the average impedance for all electrodes from PCBs run in TTM3 bays and plotted monotonically. In FIG. 6B, the Y-axis is conductance (inverse of ohm) and the X-axis is the ordered index (electrodes ordered monotonically). The slope of the line is indicated as 3.7773 and the Intercept is 415.45. Here $R^2$ is 0.992, applying the quality factors this cartridge would be processed because $R^2$ is greater than 0.98. This is an example of the SOPE method.

Figure 6C:
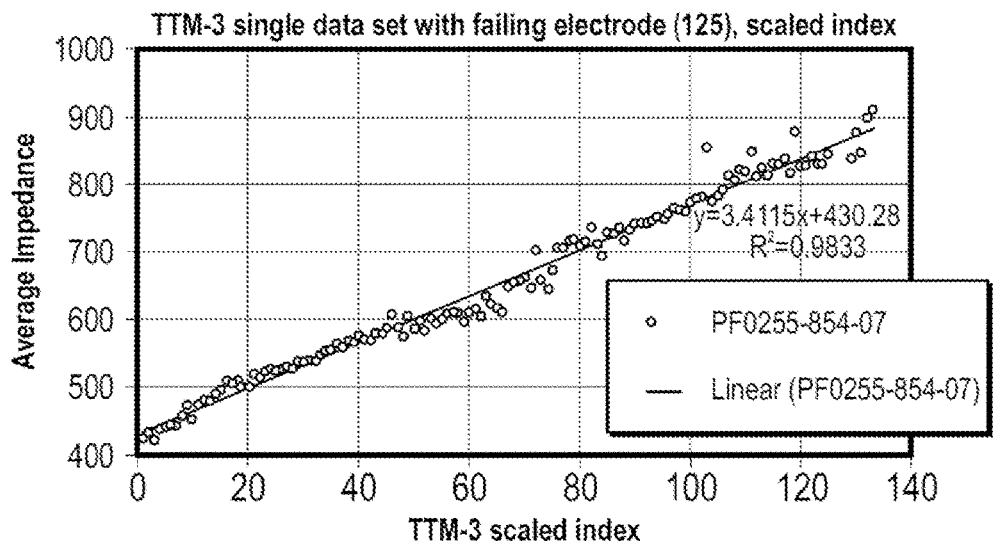
FIG. 6C shows a data plot depicting a data set from a single cartridge with a defect at electrode 125.

Once the order and functional form have been selected based on expectations, then the impedance measurements of each electrode can be analyzed. FIG. 6C shows a data set from a single cartridge with a defect at electrode 125. In the electrode reordering, electrode 125 falls at index 103. This electrode is easily identifiable as defective by its separation from the least-mean squares linear fit. Its scaled error from the fit is 4.35, which is well above the 4.0 cutoff. Indeed, most electrodes' scaled errors do not exceed 3. In FIG. 6C, the Y-axis is conductance (inverse of ohm) and the X-axis is the ordered index (electrodes ordered monotonically). The slope of the line is indicated as 3.4115 and the Intercept is 430.28. Here $R^2$ is 0.9833, applying the quality factors this cartridge would be ejected because $R^2$ is not greater than 0.98. This is an example of the SOPE method.

Figure 7:
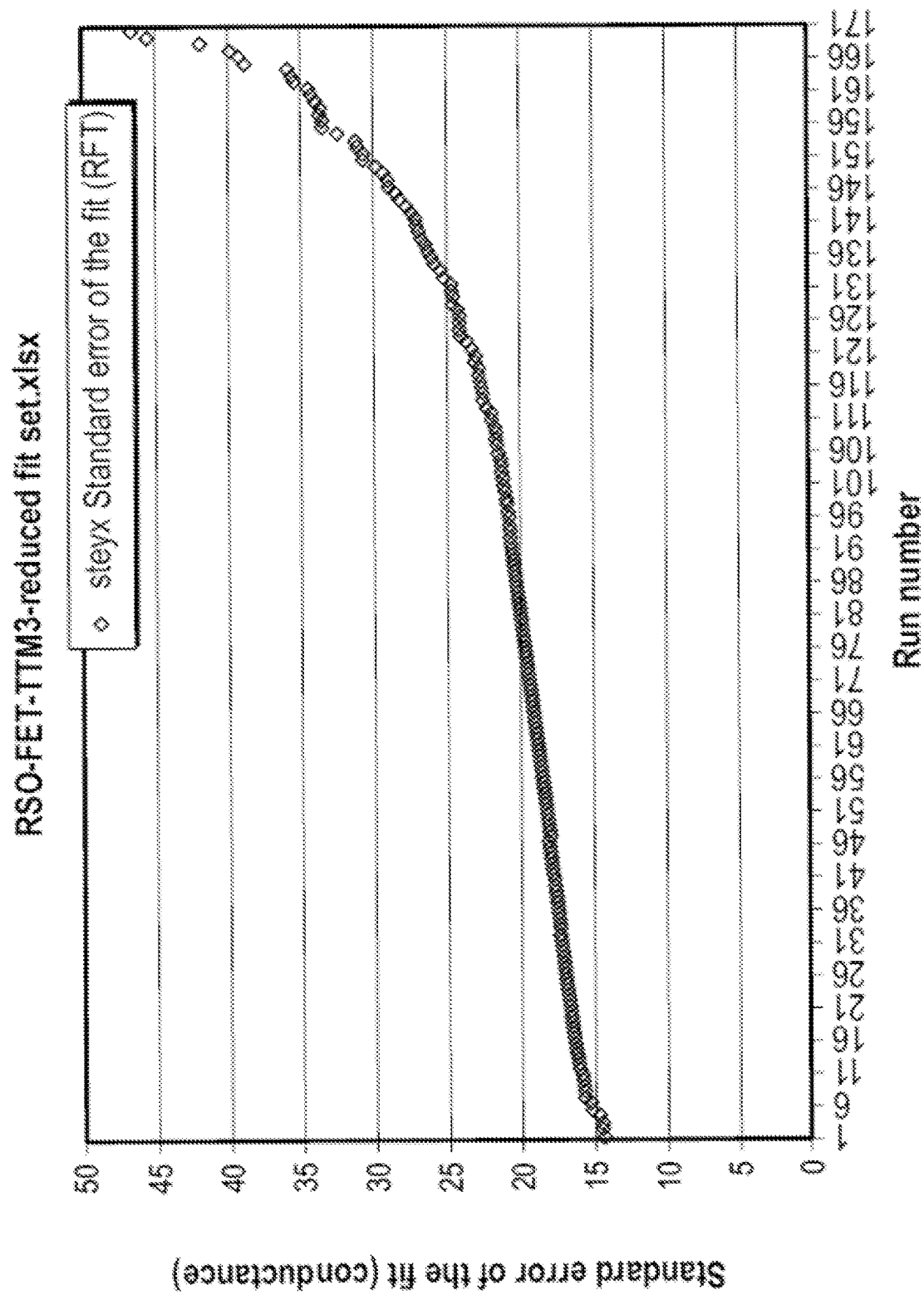
FIG. 7 shows a data plot depicting the standard error of the fit (RFT) for each run on a TTM-3 bay.

FIG. 7 shows the standard error of the fit (RFT) for each run. For the TTM3 data set, the line steepens at about 28. In this example, any electrode with a standard error of the fit above 28 means the cartridge is not processed. This data set highlights the need for standard error of the fit (RFT) as a pass/fail factor. In runs with high RFT (above 28—see the right-hand side of the plot), the opens' and shorts' extremes did not exceed 4 in magnitude. As these errors are scaled by the standard error of the fit, their absolute error was large.

Figure 8:
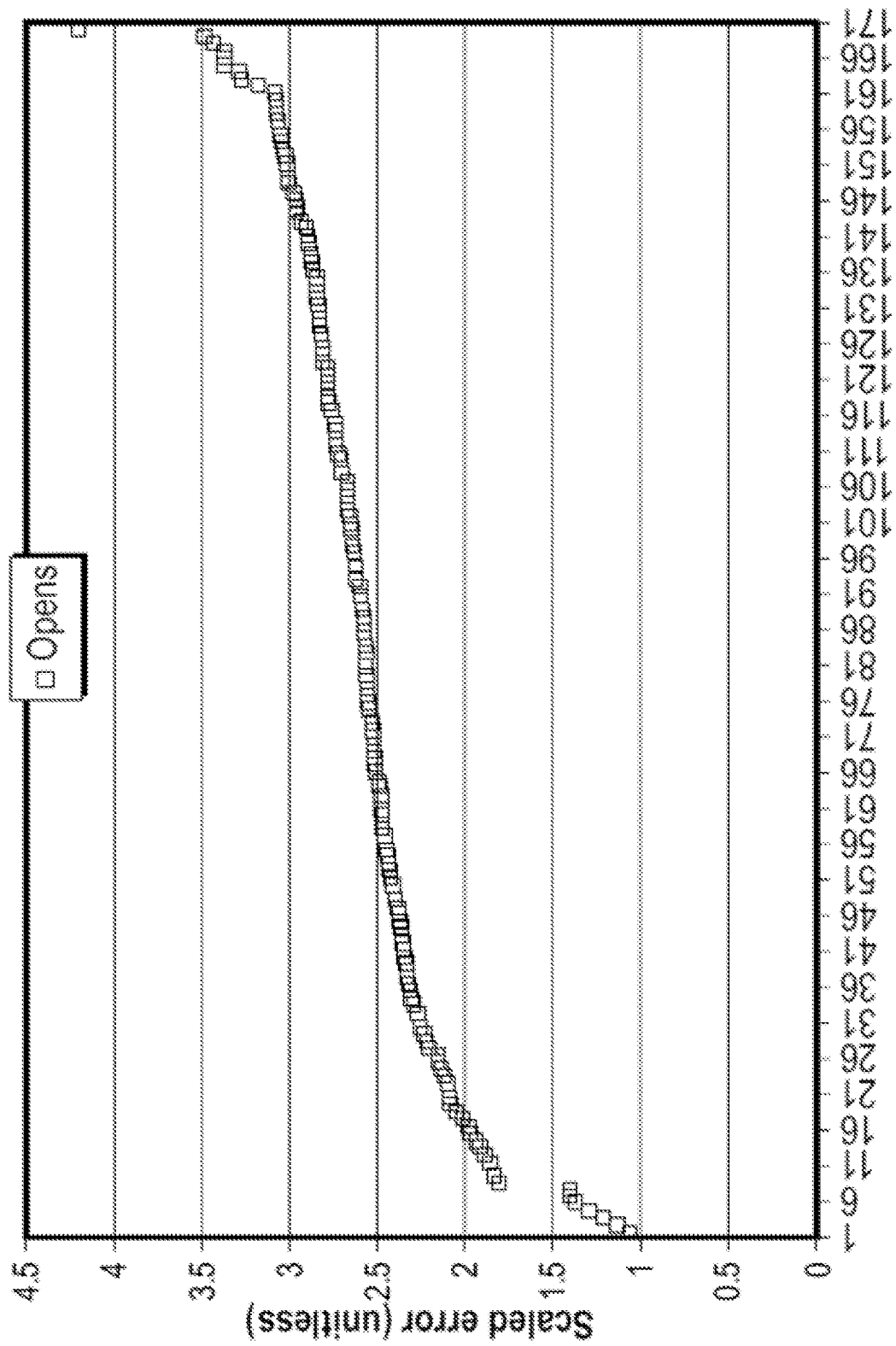
FIG. 8 shows a data plot depicting the data re-ranked according to the maximum scaled error across the electrodes for each run on a TTM-3 bay.

FIG. 8 shows the data re-ranked according to the maximum scaled error (open) across the electrodes for each run. This data set looks for sensitivity to possible open circuits. Because the line steepens at about 4 it is assumed that everything above 4 is a true open circuit. Thus, 4 is set as the subjective break value. Opens are shown at +4.0 and above.

Figure 9:
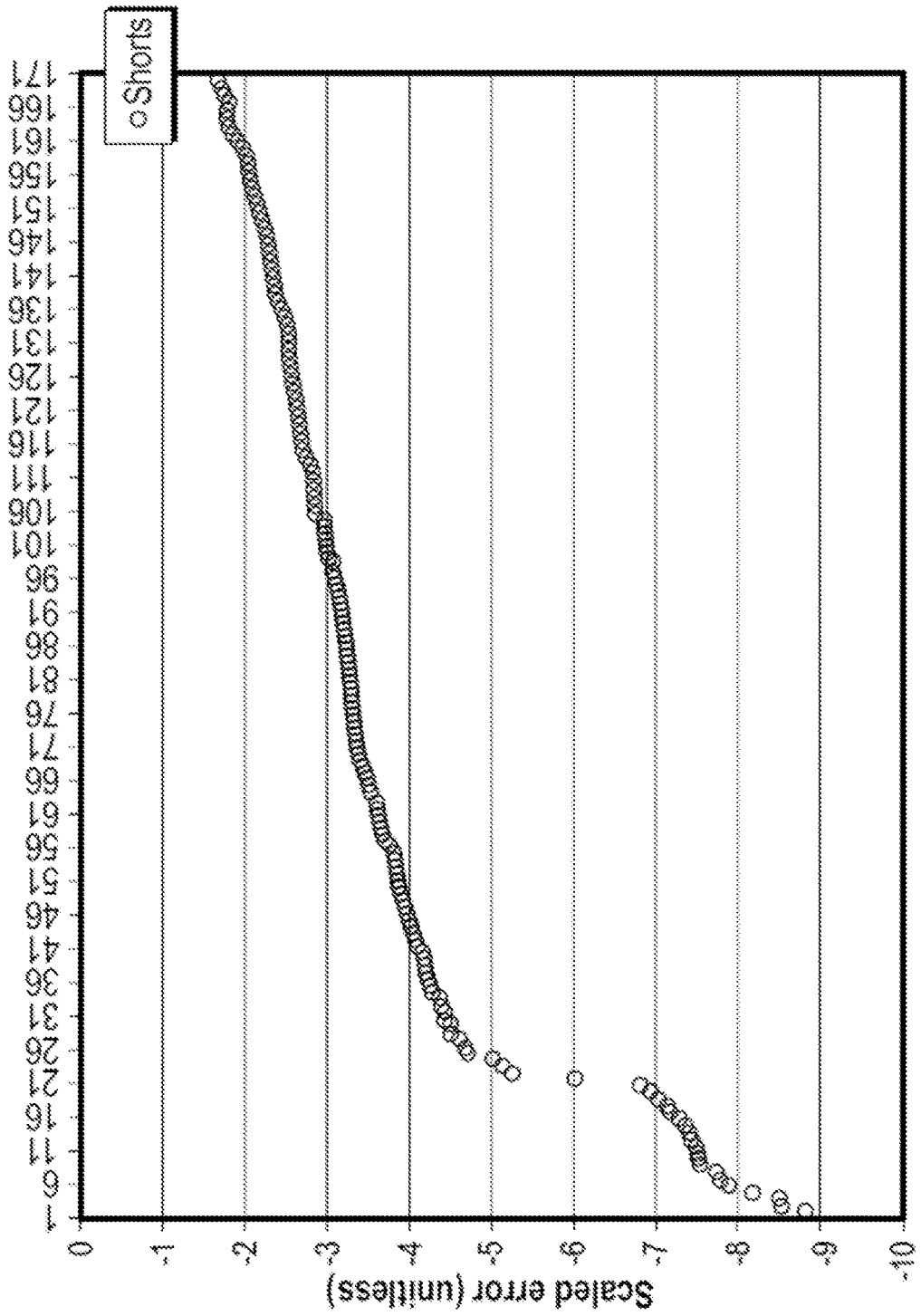
FIG. 9 shows a data plot depicting the data re-ranked according to the minimum scaled error across the electrodes for each run on a TTM-3 bay.

FIG. 9 shows the data re-ranked according to the minimum scaled error (short) across the electrodes for each run. This data set looks for sensitivity to possible short circuits. Because the line steepens at about −4 it is assumed that everything below −4 is a true short circuit. Thus, −4 is set as the subjective break value. Shorts are shown at −4.0 and below.

Once the expected order on the TTM3 bay is determined, for example, the order can be used in the ROPE method.

Example 4: Determining the Expected Order Based on a TTM3-b Bay

The TTM3-b bay was the third released variety of bays. In example implementations using the TTM-3 bay, data was collected from 68 preflight files from test runs.

Figure 10:
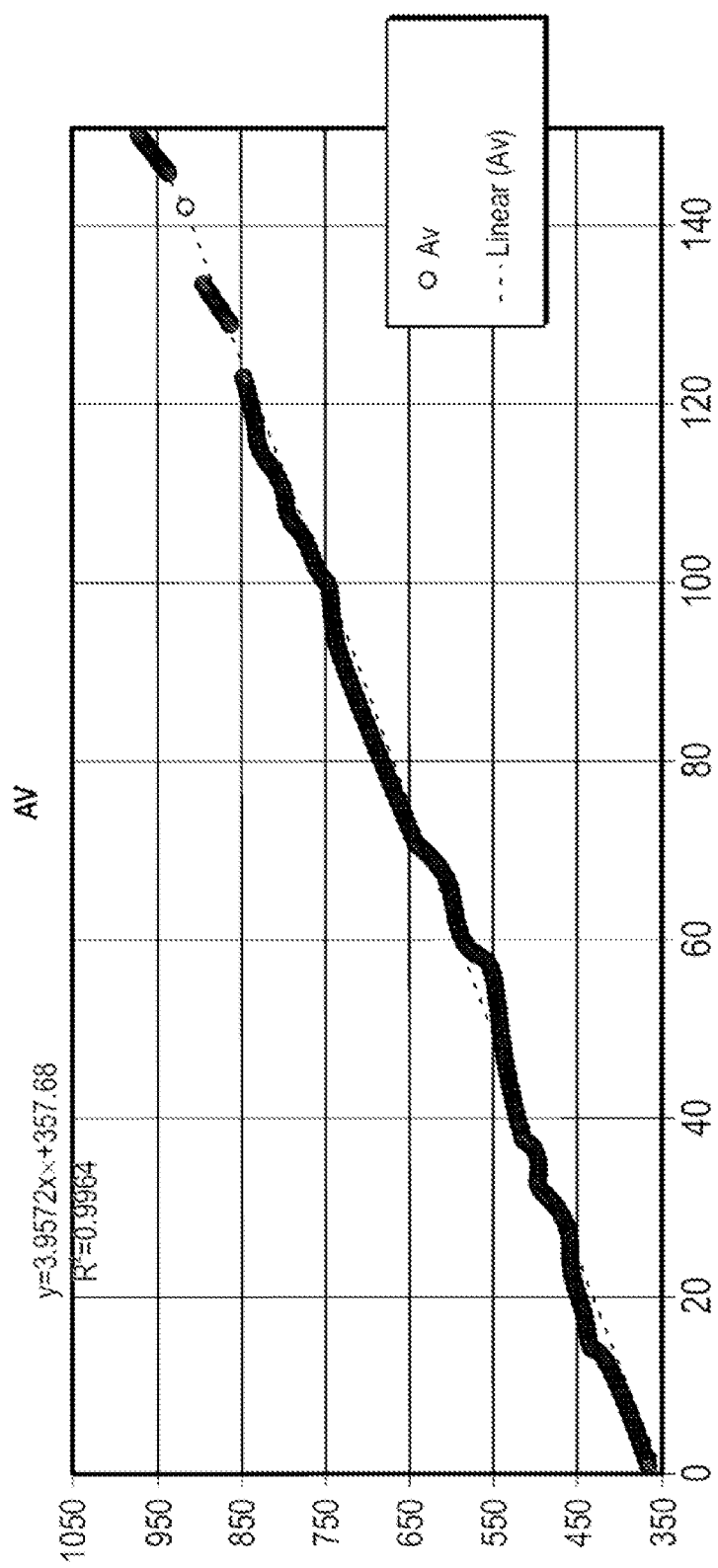
FIG. 10 shows a data plot depicting the average impedance for electrodes PCBs of assay cartridges run in TTM3-b bays and plotted monotonically.

FIG. 10 shows the average impedance for all electrodes from PCBs run in TTM3-b bays and plotted monotonically (excluding high variability electrodes and all electrodes with impedance greater than 2000). The high variability electrodes were identified by the variability of their scaled error across all 68 runs. Electrodes with standard deviation of the scaled error >1.5 were excluded. After selecting the electrodes, the index of each ordered electrode was adjusted to improve the linearity of the fit (see the spaces between x-values—indices—123 and 140). The linear range was determined subjectively from the average impedance for all electrodes from PCBs run in TTM3-b bays and plotted monotonically. In FIG. 10, the Y-axis is conductance (inverse of ohm) and the X-axis is the ordered index (electrodes ordered monotonically). The slope of the line is indicated as 3.9572 and the Intercept is 357.68. Here $R^2$ is 0.9964, applying the quality factors this cartridge would be processed because $R^2$ is greater than 0.98. This is an example of the SOPE method.

Figure 11:
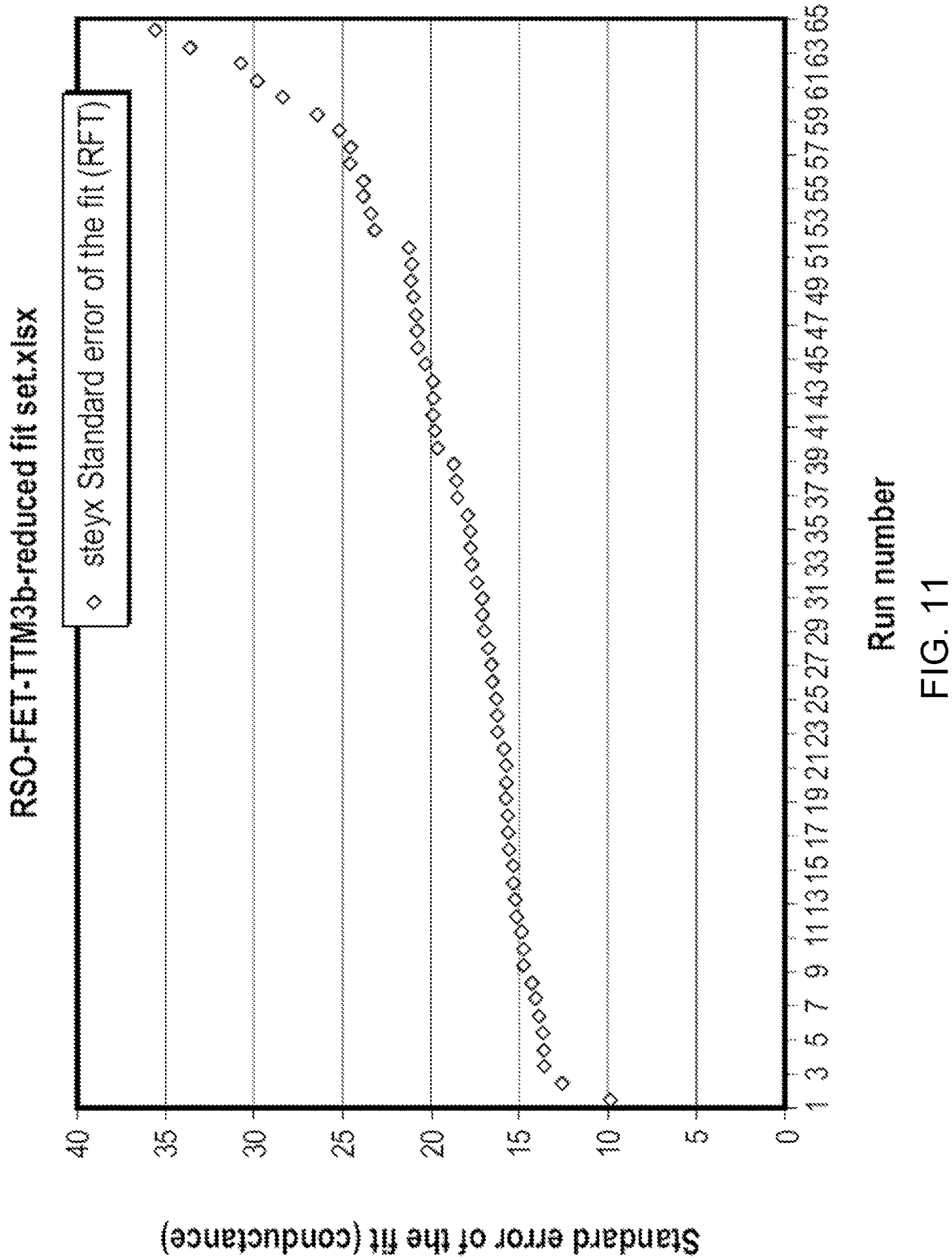
FIG. 11 shows a data plot depicting the standard error of the fit (RFT) for each run in a TTM3-b bay.

FIG. 11 shows the standard error of the fit (RFT) for each run. For the TTM3-b data set, the line steepens at about 28. In this example, any electrode with a standard error of the fit above 28 means the cartridge is not processed.

Figure 12:
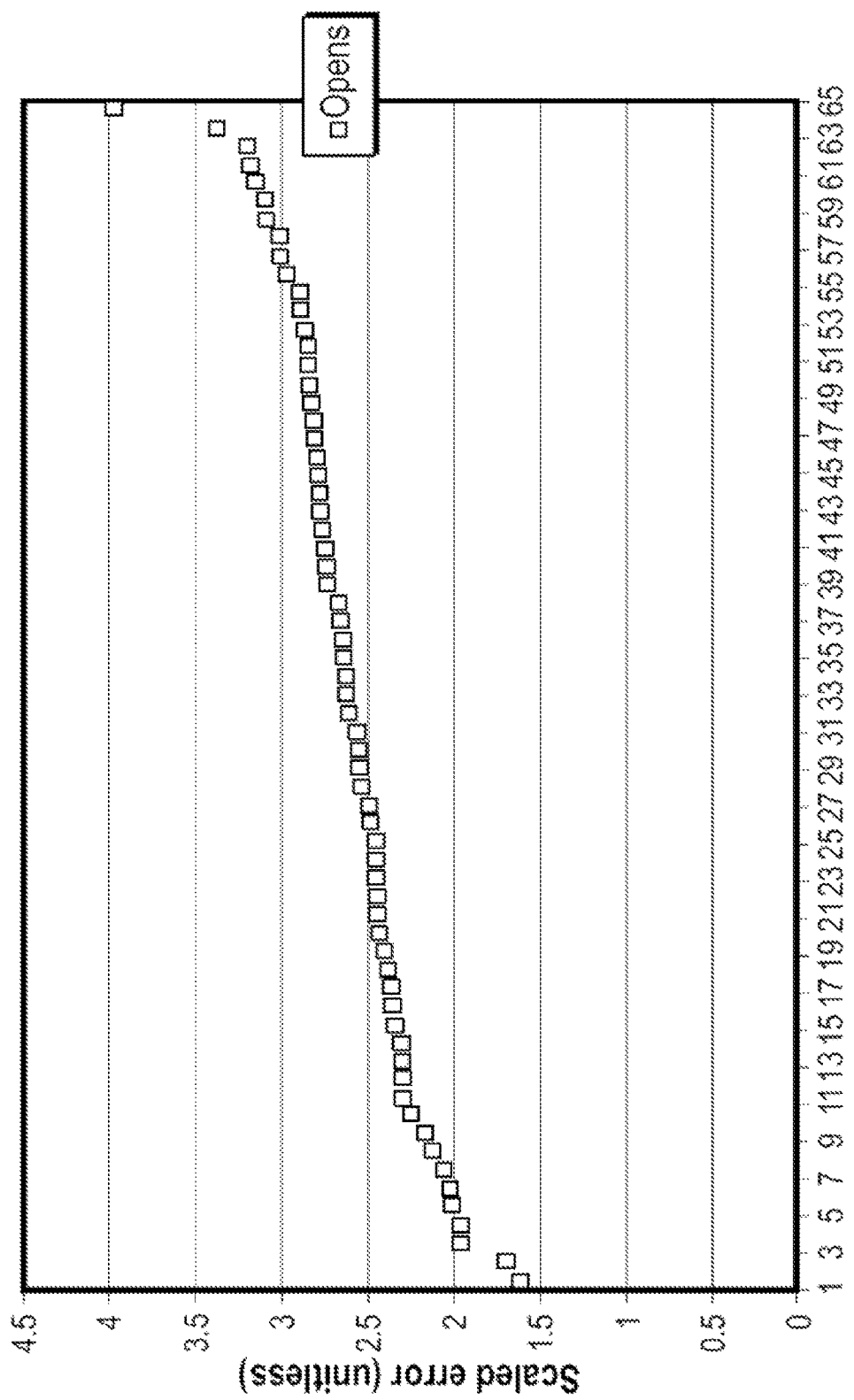
FIG. 12 shows a data plot depicting the data re-ranked according to the maximum scaled error across the electrodes for each run in a TTM3-b bay.

FIG. 12 shows the data re-ranked according to the maximum scaled error (open) across the electrodes for each run. This data set looks for sensitivity to possible open circuits. Because the line steepens at about 4 it is assumed that everything above 4 is a true open circuit. Thus, 4 is set as the subjective break value. Opens are shown at +4.0 and above.

Figure 13:
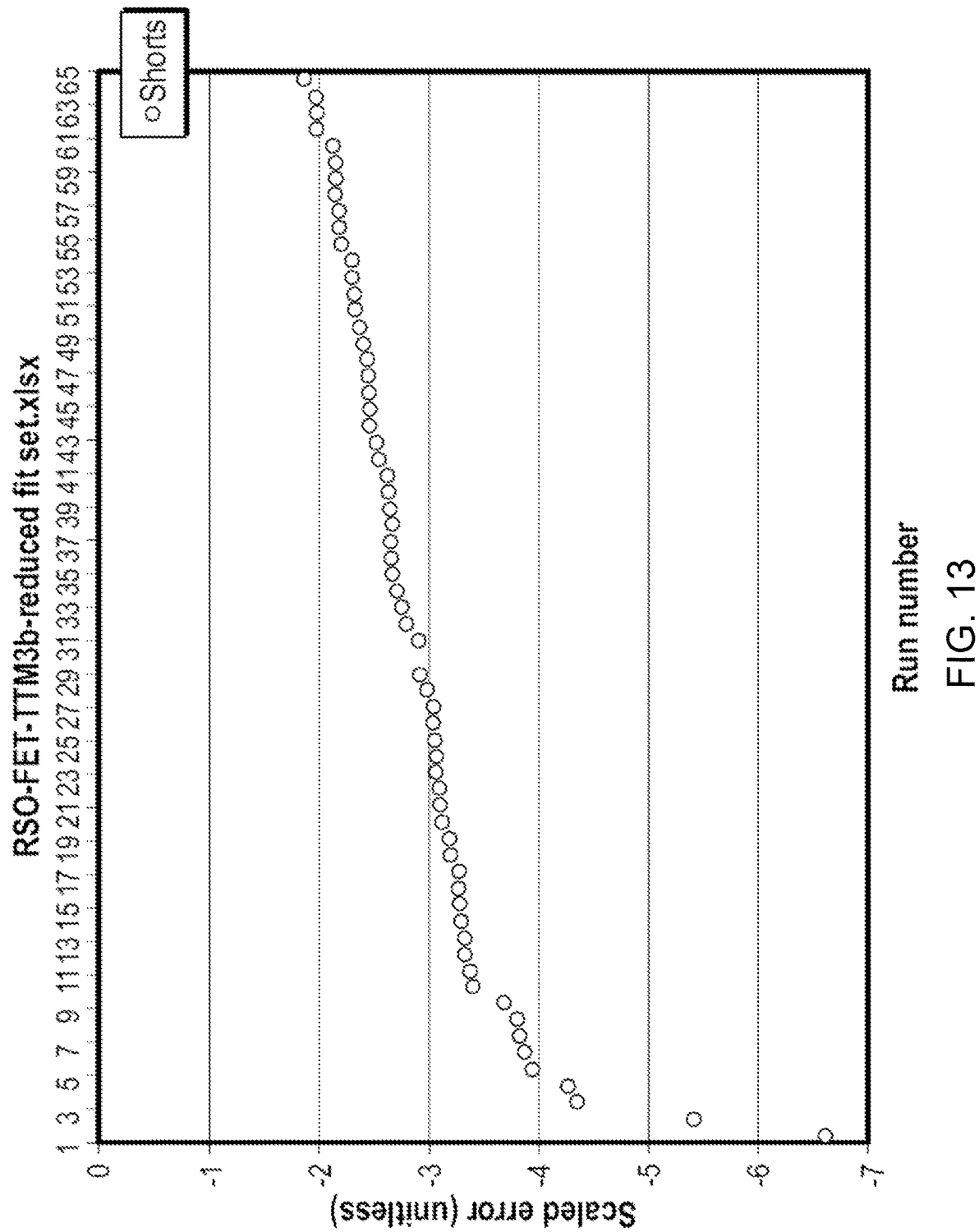
FIG. 13 shows a data plot depicting the data re-ranked according to the minimum scaled error across the electrodes for each run in a TTM3-b bay.

FIG. 13 shows the data re-ranked according to the minimum scaled error (short) across the electrodes for each run. This data set looks for sensitivity to possible short circuits. Because the line steepens at about −4 it is assumed that everything below −4 is a true short circuit. Thus, −4 is set as the subjective break value. Shorts are shown at −4.0 and below.

Once the expected order on the TTM-3b bay is determined, the order can be used in the ROPE method.

Example 5: Determining the Expected Order Based on Lenthor Bay

The Lenthor bay, e.g., an alternate of the TTM2 design) was the third released variety of bays. In example implementations using the TTM-3 bay, data was collected from 403 preflight files from internal test runs and customer runs.

Figure 14A:
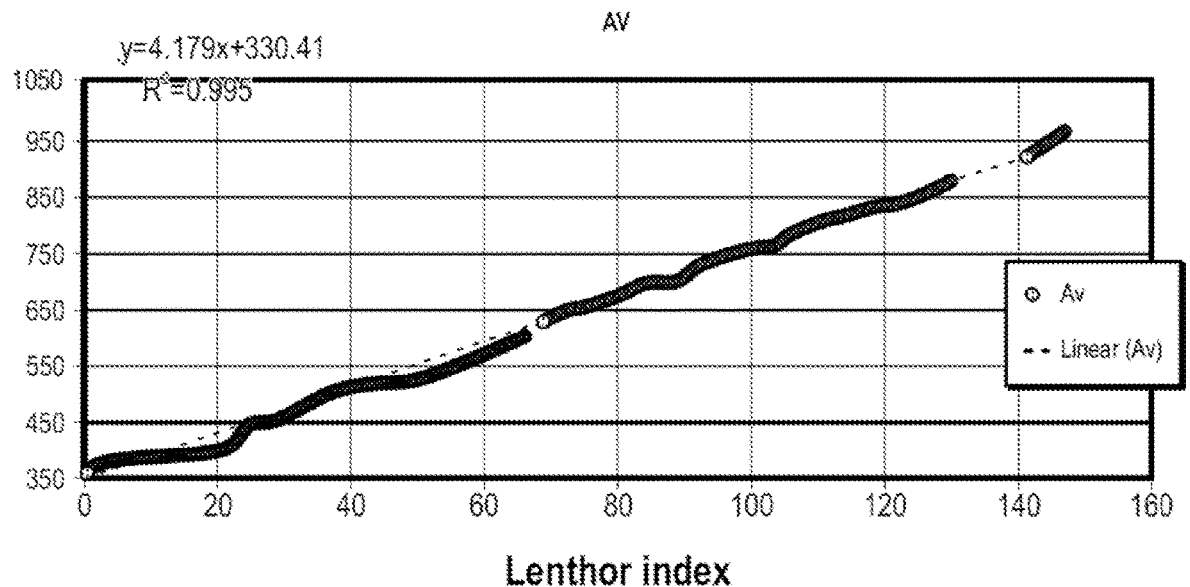
FIG. 14A shows a data plot depicting the average impedance for electrodes on PCBs of assay cartridges run in Lenthor bays and plotted monotonically.

FIG. 14A shows the average impedance for all electrodes from PCBs run in Lenthor bays and plotted monotonically (excluding high variability electrodes and all electrodes with impedance greater than 2000). The high variability electrodes were identified by the variability of their scaled error across all 403 runs. Electrodes with standard deviation of the scaled error >1.5 were excluded. After selecting the electrodes, the index of each ordered electrode was adjusted to improve the linearity of the fit (see the spaces between x-values—indices—138). The linear range was determined subjectively from the average impedance for all electrodes from PCBs run in Lenthor bays and plotted monotonically. In FIG. 14A, the Y-axis is conductance (inverse of ohm) and the X-axis is the ordered index (electrodes ordered monotonically). The slope of the line is indicated as 4.179 and the Intercept is 330.41. Here $R^2$ is 0.9959, applying the quality factors this cartridge would be processed because $R^2$ is greater than 0.98. This is an example of the SOPE method.

Figure 14B:
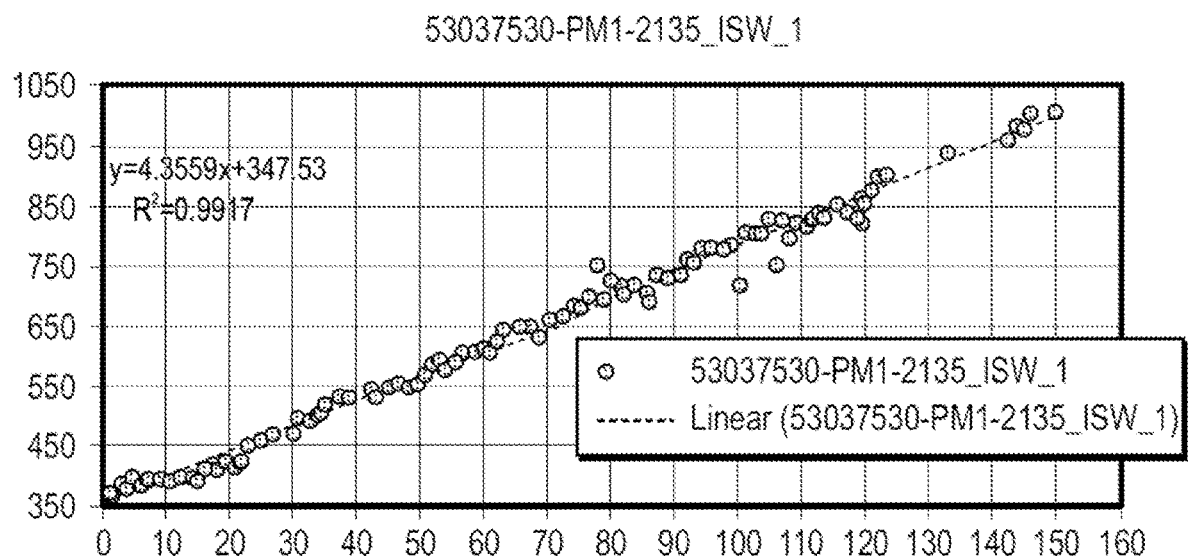
FIG. 14B shows a data plot depicting impedance data from a passing cartridge on a Lenthor type bay, plotted with the linear fit to the data.

FIG. 14B shows impedance data from a passing cartridge on a Lenthor type bay, plotted with the linear fit to the data. In FIG. 14B, the Y-axis is conductance (inverse of ohm) and the X-axis is the ordered index (electrodes ordered monotonically). The slope of the line is indicated as 4.3559 and the Intercept is 347.53. Here $R^2$ is 0.9917, applying the quality factors this cartridge would be processed because $R^2$ is greater than 0.98. This is an example of the SOPE method.

Figure 15:
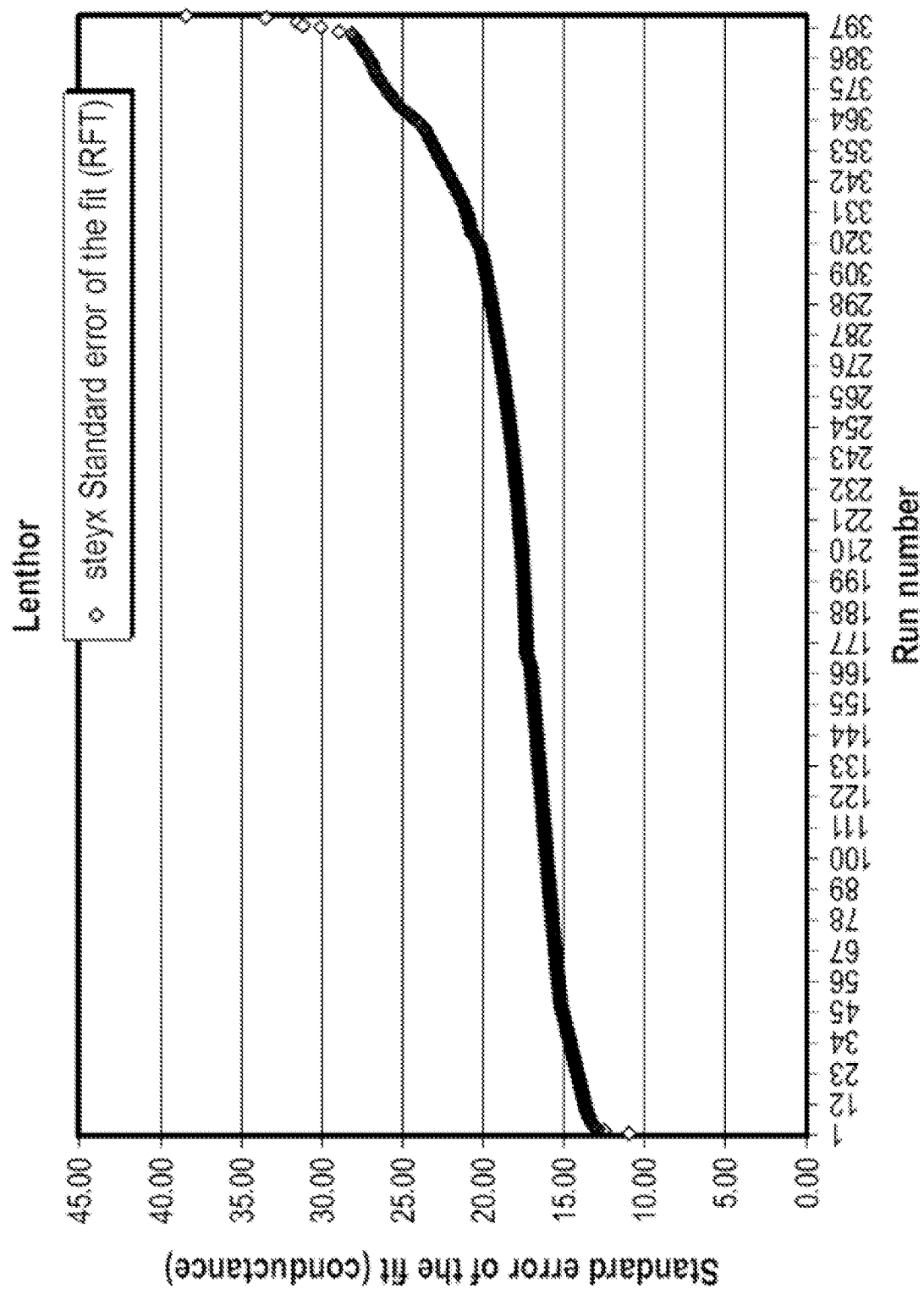
FIG. 15 shows a data plot depicting the standard error of the fit (RFT) for each run in a Lenthor bay.

FIG. 15 shows the standard error of the fit (RFT) for each run. For the Lenthor data set, the line steepens at about 28. In this example, any electrode with a standard error of the fit above 28 means the cartridge is not processed.

Figure 16:
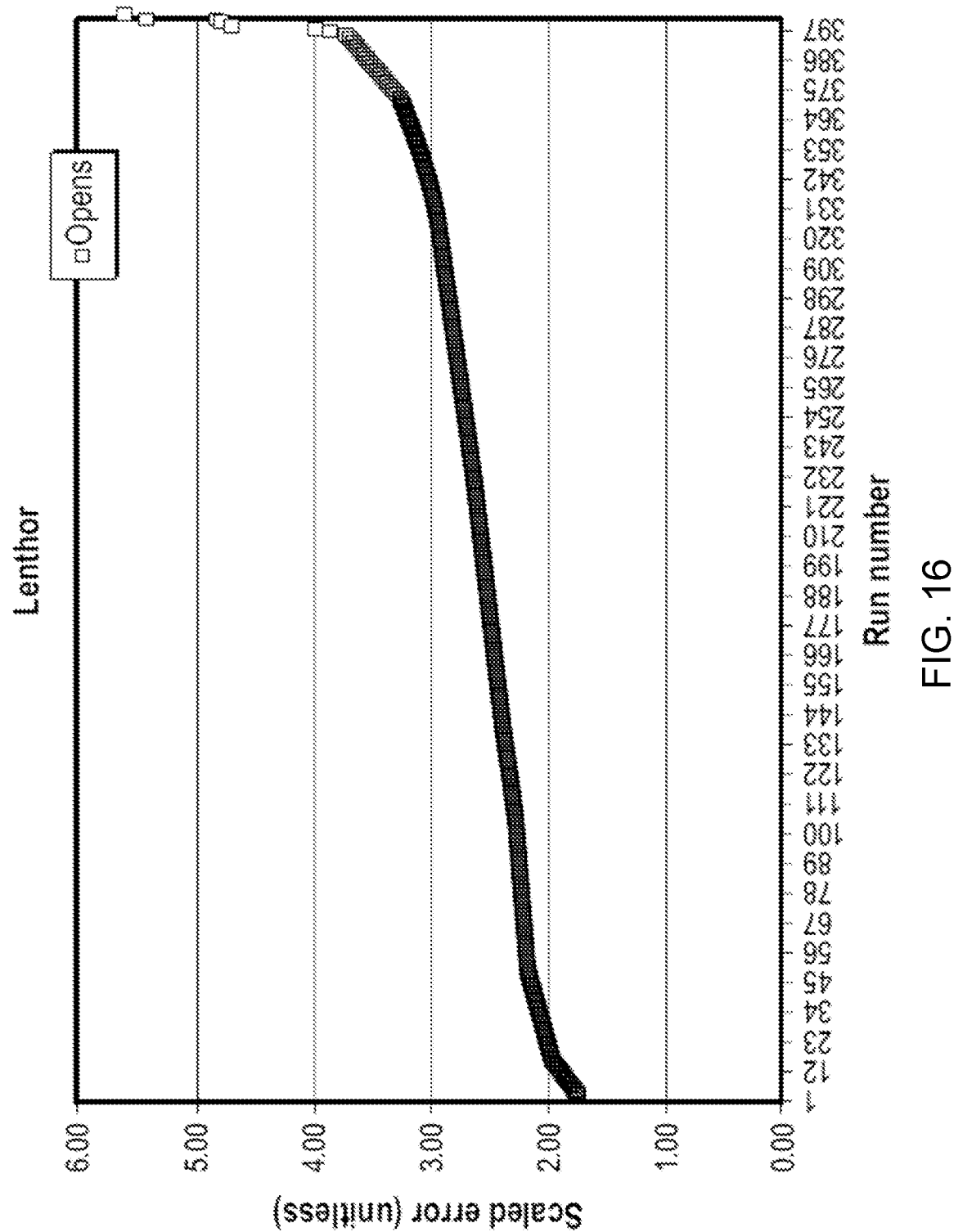
FIG. 16 shows a data plot depicting the data re-ranked according to the maximum scaled error across the electrodes for each run in a Lenthor bay.

FIG. 16 shows the data re-ranked according to the maximum scaled error (open) across the electrodes for each run. This data set looks for sensitivity to possible open circuits. Because the line steepens at about 4 it is assumed that everything above 4 is a true open circuit. Thus, 4 is set as the subjective break value. Opens are shown at +4.0 and above.

Figure 17:
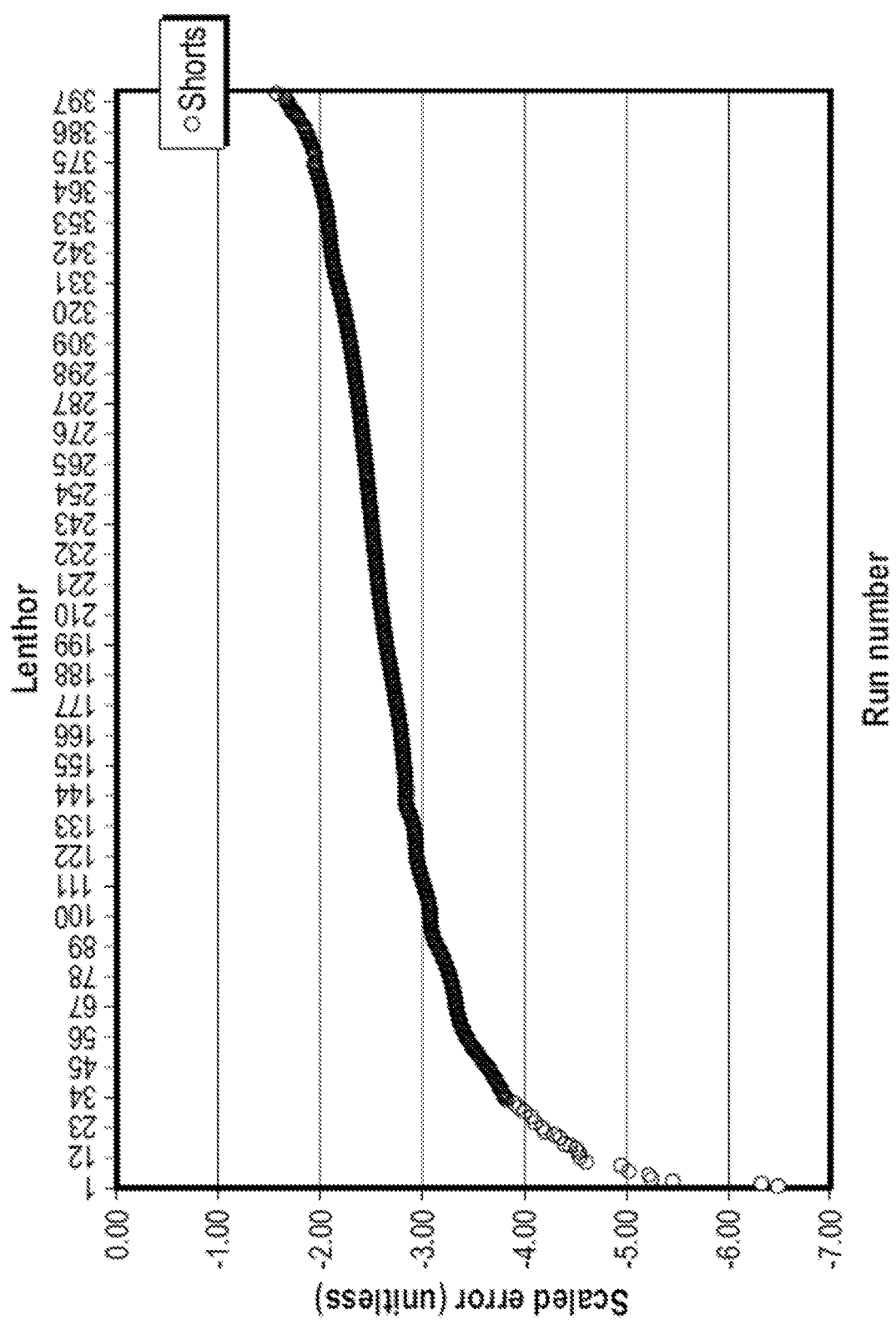
FIG. 17 shows a data plot depicting the data re-ranked according to the minimum scaled error across the electrodes for each run in a Lenthor bay.

FIG. 17 shows the data re-ranked according to the minimum scaled error (short) across the electrodes for each run. This data set looks for sensitivity to possible short circuits. Because the line steepens at about −4 it is assumed that everything below −4 is a true short circuit. Thus, −4 is set as the subjective break value. Shorts are shown at −4.0 and below.

Once the expected order on the Lenthor bay is determined, the order can be used in the ROPE method.

Example 6: ROPE Method

In this example, impedance values (WIVs) were analyzed using the ROPE method. Table 1 lists the electrodes, impedance values, reordering by index, and the resulting $R^2$, RFT, and EFT values. From the raw data the following QOF factors were determined: Intercept=346.3522; EFT=3.573006; $R^2$=0.969108; RFT=24.48453.

In this example, The RFT is below 28 and the EFT is below 4 but because $R^2$ is less than 0.98, the cartridge tested should be ejected and re-tested on another machine.

TABLE 1

| Electrode | Index (aka x) | Impedance (aka y) | EFT |
|---|---|---|---|
| 11 | 1 | 339 | 0.446208 |
| 15 | 2 | 344 | 0.387927 |
| 13 | 3 | 340 | 0.697225 |
| 9 | 4 | 366 | −0.21874 |
| 17 | 5 | 351 | 0.53982 |
| 8 | 6 | 350 | 0.726591 |
| 6 | 7 | 363 | 0.341572 |
| 19 | 8 | 337 | 1.549397 |
| 10 | 9 | 377 | 0.061641 |
| 4 | 10 | 370 | 0.493465 |
| 12 | 11 | 383 | 0.108447 |
| 21 | 12 | 367 | 0.90785 |
| 7 | 13 | 407 | −0.57991 |
| 14 | 14 | 408 | −0.47482 |
| 128 | 15 | 411 | −0.45142 |
| 16 | 16 | 424 | −0.83643 |
| 117 | 17 | 442 | −1.42566 |
| 5 | 18 | 422 | −0.46289 |
| 23 | 19 | 406 | 0.336511 |
| 2 | 20 | 424 | −0.25272 |
| 140 | 21 | 449 | −1.12784 |
| 121 | 22 | 483 | −2.37054 |
| 20 | 23 | 394 | 1.410333 |
| 132 | 24 | 450 | −0.7309 |
| 18 | 25 | 404 | 1.29377 |
| 3 | 26 | 422 | 0.704541 |
| 120 | 27 | 439 | 0.156154 |
| 22 | 28 | 424 | 0.914715 |
| 25 | 29 | 452 | −0.08293 |
| 1 | 30 | 459 | −0.2229 |
| 0 | 31 | 452 | 0.208923 |
| 29 | 32 | 467 | −0.25778 |
| 27 | 33 | 478 | −0.56111 |
| 26 | 34 | 484 | −0.66024 |
| 142 | 35 | 491 | −0.8002 |
| 138 | 36 | 509 | −1.38943 |
| 33 | 37 | 498 | −0.79424 |
| 52 | 38 | 486 | −0.1582 |
| 28 | 39 | 508 | −0.9108 |
| 31 | 40 | 493 | −0.15224 |
| 35 | 41 | 505 | −0.49642 |
| 37 | 42 | 508 | −0.47301 |
| 124 | 43 | 470 | 1.224915 |
| 134 | 44 | 540 | −1.4881 |
| 122 | 45 | 497 | 0.414036 |
| 129 | 46 | 503 | 0.314912 |
| 54 | 47 | 506 | 0.338315 |

TABLE 1-continued

| Electrode | Index (aka x) | Impedance (aka y) | EFT |
|---|---|---|---|
| 113 | 48 | 584 | −2.70144 |
| 24 | 49 | 527 | −0.22751 |
| 39 | 50 | 516 | 0.367681 |
| 56 | 51 | 513 | 0.636137 |
| 60 | 52 | 514 | 0.741224 |
| 58 | 53 | 524 | 0.478732 |
| 66 | 54 | 500 | 1.604872 |
| 68 | 55 | 509 | 1.383222 |
| 64 | 56 | 519 | 1.12073 |
| 93 | 57 | 507 | 1.756764 |
| 130 | 58 | 573 | −0.79289 |
| 30 | 59 | 553 | 0.169885 |
| 99 | 60 | 554 | 0.274972 |
| 41 | 61 | 561 | 0.135007 |
| 131 | 62 | 585 | −0.69927 |
| 36 | 63 | 552 | 0.794444 |
| 38 | 64 | 541 | 1.389636 |
| 101 | 65 | 536 | 1.739776 |
| 97 | 66 | 570 | 0.497073 |
| 133 | 67 | 600 | −0.58226 |
| 126 | 68 | 535 | 2.218406 |
| 136 | 69 | 637 | −1.80156 |
| 89 | 70 | 602 | −0.22616 |
| 91 | 71 | 626 | −1.06044 |
| 34 | 72 | 590 | 0.555806 |
| 111 | 73 | 652 | −1.83048 |
| 43 | 74 | 614 | −0.13255 |
| 103 | 75 | 583 | 1.279488 |
| 32 | 76 | 645 | −1.10679 |
| 65 | 77 | 630 | −0.34823 |
| 86 | 78 | 614 | 0.45117 |
| 95 | 79 | 638 | −0.38311 |
| 40 | 80 | 641 | −0.35971 |
| 69 | 81 | 636 | −0.00957 |
| 115 | 82 | 700 | −2.47754 |
| 74 | 83 | 648 | −0.20782 |
| 71 | 84 | 659 | −0.51115 |
| 76 | 85 | 625 | 1.023411 |
| 84 | 86 | 672 | −0.75024 |
| 72 | 87 | 664 | −0.27757 |
| 55 | 88 | 635 | 1.052777 |
| 53 | 89 | 675 | −0.43498 |
| 90 | 90 | 676 | −0.32989 |
| 75 | 91 | 681 | −0.38817 |
| 92 | 92 | 646 | 1.18723 |
| 61 | 93 | 711 | −1.32158 |
| 45 | 94 | 661 | 0.866457 |
| 77 | 95 | 693 | −0.29456 |
| 73 | 96 | 645 | 1.811789 |
| 94 | 97 | 693 | −0.0027 |
| 96 | 98 | 722 | −1.0412 |
| 88 | 99 | 679 | 0.860944 |
| 57 | 100 | 702 | 0.067505 |
| 70 | 101 | 667 | 1.642908 |
| 79 | 102 | 703 | 0.318521 |
| 125 | 103 | 775 | −2.47618 |
| 135 | 104 | 676 | 1.713116 |
| 67 | 105 | 712 | 0.388729 |
| 42 | 106 | 713 | 0.493816 |
| 102 | 107 | 732 | −0.13625 |
| 50 | 108 | 778 | −1.86906 |
| 49 | 109 | 743 | −0.29366 |
| 59 | 110 | 748 | −0.35194 |
| 107 | 111 | 821 | −3.18749 |
| 154 | 112 | 739 | 0.307496 |
| 151 | 113 | 767 | −0.69015 |
| 153 | 114 | 752 | 0.068407 |
| 152 | 115 | 748 | 0.377704 |
| 156 | 116 | 760 | 0.033528 |
| 87 | 117 | 708 | 2.303247 |
| 85 | 118 | 781 | −0.5323 |
| 149 | 119 | 785 | −0.54974 |
| 147 | 120 | 802 | −1.09812 |
| 144 | 121 | 780 | −0.05367 |
| 150 | 122 | 755 | 1.113314 |
| 46 | 123 | 778 | 0.319874 |
| 98 | 129 | 802 | 0.215238 |
| 155 | 130 | 821 | −0.41483 |
| 148 | 131 | 795 | 0.792991 |
| 100 | 132 | 807 | 0.448815 |
| 157 | 133 | 816 | 0.227165 |
| 51 | 134 | 823 | 0.087199 |
| 78 | 142 | 843 | 0.43779 |

Example 7: Omitted Electrodes

Not all electrodes allow for detectable opens. For example, electrodes in the non-conductive top plate coating region do not allow for detectable opens. Electrodes which have a lot of variability include electrode 115 (in a coplanar region of the PCB, in the amplification zone), 158 (in a coplanar region of the PCB, in the detection zone), 88 (in a biplanar region of the PCB, R4), 105 (in a biplanar region of the PCB, in the sample reservoir), 0 (in a coplanar region of the PCB, in the amplification zone).

Each of the above described RO patterns includes at least 130 electrodes. In these examples, preflight (and precheck) using this version of the impedance method may not be sensitive to opens or shorts on these electrodes. In these examples, impedance measurements could not detect opens from the non-conductive top pate region, but could detect shorts from these electrodes.

Table 2 lists electrodes excluded from these RO patterns.

TABLE 2

| TTM-3b | Lenthor | TTM-2 | TTM-3 | Top Plate Region | Location |
|---|---|---|---|---|---|
| 44 | 44 | 44 | 44 | Conductive | Det. Staging |
| 47 | | | 47 | Conductive | Det. Staging |
| | | | 48 | Conductive | Det. Staging |
| 62 | 62 | 62 | 62 | Test Capacitor | Test Cap |
| 63 | 63 | 63 | 63 | TP Reference | Isolation |
| | | | 67 | Conductive | R1/R2 entry |
| | | | 78 | Conductive | R3 |
| | | | 80 | Conductive | R3 |
| | | | 81 | Conductive | R3 |
| 82 | 82 | 82 | 82 | Conductive | R3 entry |
| 83 | | | 83 | Conductive | R3 |
| 104 | 104 | 104 | 104 | Conductive | R5 |
| 105 | 105 | 105 | 105 | Conductive | R5 entry |
| | | | 107 | Conductive | PCR prep |
| 109 | 109 | 109 | 109 | Conductive | PCR prep |
| | | 115 | 115 | Non-Conductive | PCR |
| 119 | 119 | 119 | 119 | Non-Conductive | PCR |
| 123 | 123 | 123 | 123 | Non-Conductive | PCR |
| | | | 125 | Non-Conductive | PCR |
| 127 | 127 | 127 | 127 | Test Capacitor | Test Cap |
| | | | 133 | Non-Conductive | PCR |
| | | 135 | 135 | Conductive | PCR prep |
| | | | 136 | Non-Conductive | PCR |
| | | 137 | 137 | Non-Conductive | PCR |
| 139 | 139 | 139 | 139 | Conductive | PCR prep |
| 141 | 141 | 141 | 141 | Non-Conductive | PCR |
| 143 | 143 | 143 | 143 | Conductive | R5 |
| | | 145 | 145 | Conductive | waste |
| | | | 146 | Conductive | R5 |
| 158 | 158 | | 158 | Non-Conductive | Detection |
| 191 | 191 | 191 | 191 | Test Capacitor | Test Cap |

Example 8: Reducing Validity Rates

The rate of incorrect results (false negatives or invalids) due to an improper connection between the assay cartridge and analysis device should go down using the SOPE, ROPE or POPE methods compared to using the impedance threshold method. For example, it is expected that the error rate could go from 0.2-0.3% using the impedance threshold method to 0.05 to 0.035% using the ROPE, POPE or SOPE method.

Example 9: Detection of Fault Injects Using the ROPE Method

In this example, 12 bays (3 of each type of connector board0 TTMB-2, TTMB-3, TTMB-3b, and Lenthor) each ran the same 162 cartridges with two fault injects on each cartridge (either 2 opens in the co-planer region, 2 opens in the bi-planer region or 1 tiebar and 1 HD connector short). Detection of the fault injects was assessed using the target impedance (plus threshold), i.e., the impedance threshold method and the ROPE method. For every type of failure, the ROPE method detected more faults and had fewer false failures see Table 3 below. In particular, the ROPE method is significantly better at detecting tiebar shorts—these are hard shorts and are particularly useful to identify and fail the pre-flight test if present.

Table 3 shows example values for detection of fault injects using impedance threshold method vs. the example ROPE method.

TABLE 3

| Fault | Impedance Threshold Method | ROPE Method |
|---|---|---|
| Detected non-tiebar shorts | 150 | 244 |
| Missed non-tiebar shorts | 141 | 47 |
| Detected tiebar shorts | 187 | 266 |
| Missed tiebar shorts | 112 | 33 |
| Detected opens | 94 | 120 |
| Missed opens | 490 | 465 |
| Detected fault injects | 431 | 630 |
| False Failures | 177 | 71 |

Example 10: Target Detection Using ROPE

In this example, the ability for the assay system to detect expected targets after applying the ROPE pre-flight test was assessed. For 10 cartridges tested, the following targets Bocavirus, *Bordetella pertussis*, Flu B, influenza A H3, NL63 (coronavirus), parainfluenza virus 1, and respiratory syncytial virus (RSV) B were identified. Each of the cartridges was valid and passed. There were no false negatives. Moreover, the signal of the detected target (*Bordetella pertussis*, NL63 (coronavirus), human bocavirus, influenza A H3, influenza B, parainfluenza virus 1, and RSVB) using the ROPE method was comparable to the signal obtained using the impedance target method.

Example 11: POPE Method

In this example, two pre-flight tests run on TTM2 bays were assessed. In this example, the example implementation of the POPE method had the following methodology (e.g., example data in Table 4 below): find the right pattern for the impedance measurements (in this case, TTM2); find the EFT of each index for both runs (scaled error for each index); because the previous preflight was valid, use it for POPE; subtract the previous preflight's EFTs from the current preflight's EFTs; and identify any indices that fail the threshold (e.g., beyond 3 sigma)—none failed in this case.

Alternatively, as discussed above, rather than comparing the EFT from the prior valid run and the preflight run, the impedance values from the prior valid run and impedance values from the preflight run could be compared. Again, after subtracting the impedance value from the prior valid run from the impedance value from the preflight run any indices that fail the threshold (e.g., beyond 4 sigma) the cartridge is ejected.

TABLE 4

| Electrode | TTM-2 index | Prior valid impedance values VLP0731-390_ISW_1 | Pre-flight impedance values VLP0731-608_ISW_1 | Prior valid EFT VLP0731-390_ISW_1 | Preflight EFT VLP0731-608_ISW_1 | POPE method: (Prior valid EFT minus preflight EFT) VLP0731-608_ISW_1 |
|---|---|---|---|---|---|---|
| 25 | 1 | 430 | 427 | 1.537435 | 1.442415 | −0.09502 |
| 23 | 2 | 416 | 430 | 1.810745 | 0.916487 | −0.89426 |
| 27 | 3 | 437 | 428 | 0.419596 | 0.745977 | 0.326381 |
| 29 | 4 | 463 | 457 | 1.138185 | 1.037379 | −0.10081 |
| 14 | 5 | 457 | 450 | 1.012789 | 0.791576 | −0.22121 |
| 13 | 6 | 452 | 452 | 0.86874 | 0.974187 | 0.105447 |
| 16 | 7 | 453 | 445 | 0.96417 | 0.611116 | −0.35305 |
| 20 | 8 | 441 | 438 | 0.351684 | 0.198409 | −0.15328 |
| 22 | 9 | 443 | 444 | 0.393192 | 0.449584 | 0.056391 |
| 15 | 10 | 454 | 450 | 0.843415 | 0.66172 | −0.1817 |
| 12 | 11 | 455 | 453 | 0.753715 | 0.676184 | −0.07753 |
| 19 | 12 | 448 | 444 | 0.229511 | 0.00722 | −0.22229 |
| 21 | 13 | 440 | 437 | 0.373085 | 0.578579 | 0.205494 |
| 18 | 14 | 452 | 452 | 0.004647 | 0.011856 | 0.007208 |
| 17 | 15 | 465 | 460 | 0.412628 | 0.202543 | −0.21009 |
| 11 | 16 | 464 | 463 | 0.101298 | 0.105608 | 0.00431 |
| 10 | 17 | 464 | 463 | 0.172861 | 0.167096 | −0.00576 |
| 9 | 18 | 470 | 468 | 0.155777 | 0.177191 | 0.021414 |
| 26 | 19 | 465 | 465 | 0.698317 | 0.630298 | −0.06802 |
| 28 | 20 | 484 | 481 | 0.040611 | 0.053701 | 0.01309 |

TABLE 4-continued

| Electrode | TTM-2 index | Prior valid impedance values VLP0731-390_ISW_1 | Pre-flight impedance values VLP0731-608_ISW_1 | Prior valid EFT VLP0731-390_ISW_1 | Preflight EFT VLP0731-608_ISW_1 | POPE method: (Prior valid EFT minus preflight EFT) VLP0731-608_ISW_1 |
|---|---|---|---|---|---|---|
| 8 | 21 | 474 | 482 | 0.841662 | 0.297231 | −0.54443 |
| 7 | 22 | 486 | 481 | 0.538711 | 0.651112 | 0.112401 |
| 6 | 23 | 504 | 502 | 0.066598 | 0.193343 | 0.126745 |
| 5 | 24 | 507 | 505 | 0.078656 | 0.05891 | −0.01975 |
| 24 | 25 | 507 | 501 | 0.370612 | 0.45413 | 0.083518 |
| 121 | 26 | 520 | 518 | 0.004758 | 0.180223 | 0.175465 |
| 117 | 27 | 518 | 517 | 0.386071 | 0.161293 | −0.22478 |
| 31 | 28 | 546 | 539 | 0.745748 | 0.755052 | 0.009304 |
| 128 | 29 | 520 | 521 | 0.826454 | 0.501435 | −0.32502 |
| 30 | 30 | 545 | 535 | 0.170012 | 0.008899 | −0.16111 |
| 132 | 31 | 538 | 536 | 0.432084 | 0.217926 | −0.21416 |
| 4 | 32 | 542 | 538 | 0.473433 | 0.365818 | −0.10761 |
| 3 | 33 | 542 | 538 | 0.70712 | 0.615875 | −0.09124 |
| 33 | 34 | 568 | 559 | 0.373186 | 0.284583 | −0.0886 |
| 140 | 35 | 571 | 562 | 0.307002 | 0.211365 | −0.09564 |
| 120 | 36 | 566 | 556 | 0.152704 | 0.345513 | 0.192809 |
| 1 | 37 | 577 | 568 | 0.198863 | 0.084256 | −0.11461 |
| 32 | 38 | 588 | 577 | 0.557959 | 0.356627 | −0.20133 |
| 130 | 39 | 575 | 575 | 0.280913 | 0.035539 | −0.24537 |
| 142 | 40 | 579 | 576 | 0.259556 | 0.116903 | −0.14265 |
| 138 | 41 | 587 | 577 | 0.031243 | 0.264526 | 0.233283 |
| 134 | 42 | 590 | 585 | 0.048445 | 0.026552 | −0.02189 |
| 35 | 43 | 601 | 594 | 0.34099 | 0.269736 | −0.07125 |
| 34 | 44 | 601 | 596 | 0.182417 | 0.188105 | 0.005688 |
| 2 | 45 | 595 | 594 | 0.273753 | 0.108591 | −0.16516 |
| 122 | 46 | 591 | 587 | 0.626486 | 0.675361 | −0.11461 |
| 124 | 47 | 597 | 594 | 0.474759 | 0.477936 | −0.20133 |
| 37 | 48 | 602 | 603 | 0.371568 | 0.170442 | −0.24537 |
| 36 | 49 | 610 | 607 | 0.116734 | 0.134677 | −0.14265 |
| 93 | 50 | 595 | 600 | 1.016418 | 0.697966 | 0.233283 |
| 38 | 51 | 630 | 617 | 0.59418 | 0.045413 | −0.02189 |
| 52 | 52 | 638 | 631 | 0.84814 | 0.624415 | −0.07125 |
| 0 | 53 | 642 | 639 | 0.899722 | 0.875157 | 0.005688 |
| 89 | 54 | 603 | 614 | 1.209906 | 0.673362 | −0.16516 |
| 39 | 55 | 636 | 629 | 0.293038 | 0.045685 | 0.048874 |
| 113 | 56 | 628 | 636 | 0.265872 | 0.143493 | 0.003178 |
| 54 | 57 | 638 | 630 | 0.075366 | 0.378524 | −0.20113 |
| 41 | 58 | 640 | 622 | 0.010811 | 1.012967 | 0.017943 |
| 99 | 59 | 630 | 639 | 0.660785 | 0.2896 | −0.31845 |
| 97 | 60 | 645 | 662 | 0.081947 | 0.756492 | −0.54877 |
| 126 | 61 | 669 | 659 | 0.943631 | 0.382233 | −0.22373 |
| 91 | 62 | 642 | 659 | 0.597008 | 0.166911 | −0.02457 |
| 101 | 63 | 655 | 668 | 0.134818 | 0.437178 | −0.53654 |
| 129 | 64 | 684 | 683 | 1.124962 | 1.029553 | −0.24735 |
| 74 | 65 | 683 | 687 | 0.87249 | 1.018101 | −0.12238 |
| 56 | 66 | 672 | 652 | 0.111943 | 1.122174 | 0.303158 |
| 72 | 67 | 711 | 705 | 1.856016 | 1.525745 | 1.002156 |
| 57 | 68 | 701 | 704 | 1.133811 | 1.228023 | −0.37119 |
| 55 | 69 | 693 | 698 | 0.506222 | 0.653553 | 0.674545 |
| 43 | 70 | 704 | 685 | 0.827005 | 0.306404 | −0.5614 |
| 40 | 71 | 714 | 710 | 1.092135 | 0.799276 | −0.4301 |
| 95 | 72 | 709 | 707 | 0.598908 | 0.376228 | 0.30236 |
| 75 | 73 | 686 | 699 | 0.803001 | 0.322554 | −0.09541 |
| 92 | 74 | 708 | 714 | 0.050096 | 0.228292 | 0.145611 |
| 77 | 75 | 711 | 718 | 0.054941 | 0.177375 | 1.01023 |
| 136 | 76 | 731 | 721 | 0.689952 | 0.069774 | −0.33027 |
| 71 | 77 | 737 | 740 | 0.728705 | 0.83185 | 0.094212 |
| 86 | 78 | 747 | 751 | 0.965654 | 1.15696 | 0.147331 |
| 58 | 79 | 724 | 716 | 0.456466 | 1.024011 | −0.5206 |
| 111 | 80 | 741 | 758 | 0.128388 | 0.988602 | −0.29286 |
| 94 | 81 | 735 | 733 | 0.442488 | 0.647484 | −0.22268 |
| 103 | 82 | 744 | 758 | 0.260402 | 0.440651 | −0.48045 |
| 73 | 83 | 740 | 746 | 0.730605 | 0.484778 | 0.178196 |
| 76 | 84 | 750 | 748 | 0.496694 | 0.645468 | 0.122434 |
| 90 | 85 | 744 | 752 | 1.064314 | 0.694363 | −0.62018 |
| 53 | 86 | 754 | 755 | 0.825982 | 0.794226 | 0.103145 |
| 70 | 87 | 803 | 797 | 1.37388 | 1.234141 | 0.191306 |
| 79 | 88 | 752 | 758 | 1.443428 | 1.144358 | 0.567544 |
| 69 | 89 | 746 | 739 | 1.996525 | 2.428223 | 0.860214 |
| 45 | 90 | 764 | 751 | 1.339165 | 2.017763 | 0.204862 |
| 88 | 91 | 773 | 778 | 1.127667 | 0.783845 | 0.180249 |
| 59 | 92 | 838 | 841 | 1.902362 | 2.417812 | −0.24583 |
| 115 | 93 | 804 | 798 | 0.031272 | 0.146231 | 0.148774 |
| 96 | 94 | 751 | 760 | 2.911078 | 2.42999 | −0.36995 |
| 68 | 95 | 809 | 796 | 0.209036 | 0.675031 | −0.03176 |

TABLE 4-continued

| Electrode | TTM-2 index | Prior valid impedance values VLP0731-390_ISW_1 | Pre-flight impedance values VLP0731-608_ISW_1 | Prior valid EFT VLP0731-390_ISW_1 | Preflight EFT VLP0731-608_ISW_1 | POPE method: (Prior valid EFT minus preflight EFT) VLP0731-608_ISW_1 |
|---|---|---|---|---|---|---|
| 131 | 96 | 806 | 813 | 0.561084 | 0.053804 | −0.13974 |
| 125 | 97 | 772 | 772 | 2.460481 | 2.36732 | −0.29907 |
| 60 | 98 | 781 | 768 | 2.19125 | 2.764096 | 0.431699 |
| 50 | 99 | 830 | 816 | 0.096212 | 0.31944 | 0.678598 |
| 84 | 100 | 849 | 847 | 0.887242 | 1.208637 | −0.34382 |
| 98 | 101 | 808 | 808 | 1.32446 | 1.06654 | 0.51545 |
| 87 | 102 | 883 | 888 | 2.298287 | 3.148603 | 0.11496 |
| 100 | 103 | 863 | 877 | 1.160658 | 2.416274 | −0.48109 |
| 42 | 104 | 847 | 833 | 0.233295 | 0.105016 | 0.465995 |
| 85 | 105 | 858 | 862 | 0.670619 | 1.357399 | −0.50728 |
| 107 | 106 | 853 | 852 | 0.31294 | 0.702823 | 0.389883 |
| 151 | 107 | 855 | 838 | 0.314369 | 0.163341 | 0.572845 |
| 66 | 108 | 880 | 866 | 1.47737 | 1.263252 | 0.223228 |
| 149 | 109 | 853 | 832 | 0.034967 | 0.682871 | 0.321395 |
| 153 | 110 | 860 | 843 | 0.304058 | 0.175401 | −0.25792 |
| 154 | 111 | 865 | 845 | 0.47552 | 0.156978 | 0.850316 |
| 61 | 112 | 862 | 866 | 0.246364 | 0.895624 | 1.255616 |
| 155 | 113 | 870 | 836 | 0.568656 | 0.832089 | −0.12828 |
| 152 | 114 | 873 | 856 | 0.636817 | 0.158553 | 0.686779 |
| 150 | 115 | 869 | 860 | 0.347973 | 0.27044 | 0.389883 |
| 49 | 116 | 851 | 846 | 0.652076 | 0.608076 | −0.15103 |
| 147 | 117 | 876 | 865 | 0.495729 | 0.297695 | −0.21412 |
| 156 | 118 | 893 | 883 | 1.2273 | 1.132701 | 0.647904 |
| 64 | 119 | 861 | 850 | 0.519649 | 0.829833 | −0.12866 |
| 144 | 120 | 863 | 867 | 0.581486 | 0.092881 | −0.31854 |
| 148 | 121 | 883 | 877 | 0.23413 | 0.234909 | 0.64926 |
| 65 | 122 | 883 | 885 | 0.014531 | 0.421338 | 0.263433 |
| 157 | 123 | 896 | 881 | 0.411704 | 0.083103 | −0.47826 |
| 102 | 124 | 921 | 917 | 1.370057 | 1.548503 | −0.07753 |
| 51 | 125 | 918 | 910 | 0.875342 | 0.790017 | −0.044 |
| 46 | 126 | 924 | 906 | 0.779191 | 0.1408 | −0.19803 |
| 81 | 127 | 920 | 921 | 0.12095 | 0.465884 | −0.0946 |
| 78 | 128 | 948 | 952 | 1.002425 | 1.595054 | 0.310185 |
| 67 | 129 | 884 | 880 | 2.810172 | 2.960198 | −0.48861 |
| 133 | 130 | 947 | 950 | 0.328533 | 0.136171 | 0.000779 |
| 48 | 131 | 1003 | 988 | 1.710454 | 1.399198 | 0.406807 |
| 146 | 132 | 989 | 982 | 0.134405 | 0.166648 | −0.3286 |
| 80 | 133 | 1004 | 1004 | 0.095321 | 0.350788 | 0.178447 |
| 47 | 134 | 1017 | 1002 | 0.54543 | 0.890206 | −0.08533 |
| 158 | 135 | 1048 | 1032 | 0.22241 | 0.516548 | −0.63839 |
| 83 | 136 | 1042 | 1057 | 1.899209 | 0.554185 | 0.344934 |
| 145 | 137 | 1108 | 1082 | 0.114688 | 0.742133 | 0.592629 |
| 82 | 138 | 1087 | 1092 | 2.865046 | 1.90928 | 0.150026 |
| 109 | 139 | 1144 | 1144 | 1.878576 | 0.963691 | −0.19236 |
| 104 | 140 | 1206 | 1174 | 0.834601 | 1.404234 | −0.31126 |
| 44 | 141 | 1269 | 1205 | 0.051464 | 1.992027 | 0.032243 |
| 135 | 142 | 1301 | 1301 | 0.842431 | 0.744188 | 0.255467 |
| 143 | 143 | 1442 | 1382 | 3.497324 | 2.432131 | 0.344775 |
| 105 | 144 | 1467 | 1428 | 1.756354 | 1.96668 | 0.294138 |

Example 12: Pogo Pin Connection Test

In this example, a different method was used to identify short or open circuits. Here, an open circuit impedance measurement is taken by measuring the impedance between two pins (one on the PCB and one on the working device) and a short circuit impedance measurement is taken by measuring the impedance at a single pin. The open and short circuit measurements are compared to each other. If the difference between the open and short circuit measurements is above a threshold, there is a true open circuit and the cartridge should be ejected and discarded. If the difference between the open and short circuit measurements is below a threshold, there is not a true open circuit (false open circuit error) and the cartridge should be ejected and re-tested in another bay. In some embodiments, the threshold is about 4000 units. In some embodiments, the threshold is between about 2000-6000 units.

Example 13: High Frequency Impedance for Detection of Shorts in Preflight Test

In this example, a different method was used to identify short circuits. Impedance is a function of frequency. As discussed above, generally, impedance is equal to resistance plus capacitance plus inductance. Capacitance plays a large role in impedance testing. Indeed, it is believed that the large difference between impedance values amongst electrodes is dependent on capacitance. Capacitance is caused by pad size, top plate coating, trace location etc. It was observed that if the frequency goes up (increased about 100 fold, e.g., from about 10 kHz to 100 kHz) capacitance goes to zero. Stated another way, as frequency goes to infinity, capacitance offers no electrical impedance. This approach cannot, however, identify shorts. A pogo pin missing a pad by a small distance or a contaminant gives the same impedance value as a circuit with a bad capacitor which the high frequency will ignore. Nevertheless, this approach is quick, e.g., about 10× faster due to 10× higher frequency.

Figure 32:
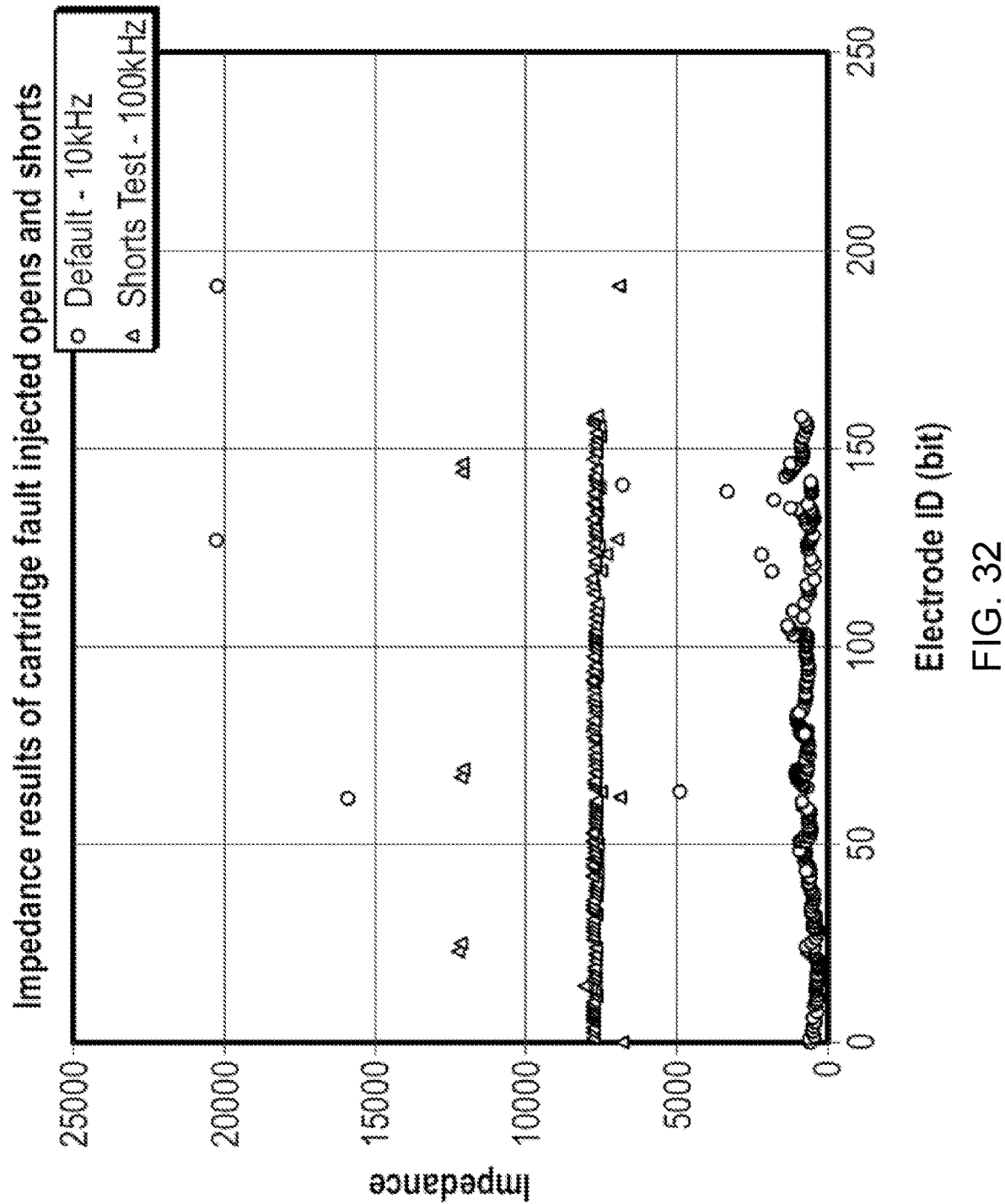
FIG. 32 shows a data plot depicting example impedance measurements at 10 kHz and 100 kHz.

FIG. 32 shows a data plot depicting example impedance measurements at 10 kHz and 100 kHz. As can be seen, variability electrode to electrode is reduced and shorts at electrodes 24/26, 68/70, 144/146 can be easily visualized. The opens on electrodes 1, 9, 37, 47, and 156 cannot be seen. The hits above 15000 units for the default 10 kHz assay are test capacitors and not shorts.

Table 5 below shows the example conditions for the testing.

TABLE 5

High Frequency Impedance Settings For Detection Of Shorts In Preflight Test

| parameter | min | max | default | "Shorts Test" |
|---|---|---|---|---|
| Voltage | 60 | 300 | 300 | 100 |
| Mode | DC/(−)DC | AC | DC | AC |
| AC Freq | 10 | 1000 | 0 | 10 |
| Start freq | 1 | 99 k | 10,000 | 99,000 |
| Sweep pts | 1 | 512 | 8 | 8 |
| amplitude | 200 mV | 2 V | 2 | 2 |
| Freq step | 1 | 524 k | 0 | 0 |
| cycles | 1 | 2044 | 15 | 15 |
| PGA gain | 1 | 5 | 1 | 1 |

EXAMPLES

Various example embodiments in accordance with the disclosed technology are described.

Example A1 includes a method for confirming a PCB is connected to a working device, the method comprising: obtaining the impedance value for each electrode on the PCB; re-ordering the impedance values; comparing the quality of the fit of the re-ordered impedance values to a straight line; determining if the PCB is connected to the working device.

Example A2: The method of Example A1, wherein the impedance values are re-ordered to match a reference order, or are reordered from lowest to highest.

Example A3: The method of Example A1, wherein the QOF comprises determining the maximum scaled error or minimum scaled error or combinations thereof.

Example A4: The method of Example A3, wherein a minimum scaled error value of about 20-40 indicates an open or short circuit on the PCB.

Example A5: The method of Example A3, wherein a maximum scaled error of about 3-10 indicates an open circuit on the PCB.

Example A6: The method of Example A3, wherein a minimum scaled error of about −3 to −15 indicates a short circuit on the PCB.

Example A7: The method of Example A1, wherein electrodes with high variability are excluded from the evaluation.

Example A8: The method of Example A1, wherein the index of the electrodes are adjusted to improve the quality of the fit.

Example A9: The method of Example A1, wherein electrodes with standard deviation of the scaled error >1.5 are excluded from the evaluation.

Example B1 includes a method for identifying a short or open circuit on a PCB after the PCB is loaded into a working device, the method comprising: obtaining the impedance value for each electrode on the PCB; re-ordering the impedance values; evaluating the quality of the fit of the re-ordered impedance values; determining if the PCB has a short or open circuit.

Example B2: The method of Example B1, wherein the impedance values are re-ordered to match a reference order, or are reordered from lowest to highest.

Example B3: The method of Example B1, wherein the QOF comprises determining the maximum scaled error or minimum scaled error or combinations thereof.

Example B4: The method of Example B3, wherein a minimum scaled error value of about 20-40 indicates an open or short circuit on the PCB.

Example B5: The method of Example B3, wherein a maximum scaled error of about 3-10 indicates an open circuit on the PCB.

Example B6: The method of Example B3, wherein a minimum scaled error of about −3 to −15 indicates a short circuit on the PCB.

Example B7: The method of Example B1, wherein electrodes with high variability are excluded from the evaluation.

Example B8: The method of Example B1, wherein the index of the electrodes is adjusted to improve the quality of the fit.

Example B9: The method of Example B1, wherein electrodes with standard deviation of the scaled error >1.5 are excluded from the evaluation.

Example C1 includes a system for identifying a short or open circuit on a PCB after the PCB is loaded into a working device, the working device comprising: a measurer for measuring impedance values; a processor for re-ordering the electrodes and evaluating the quality of the fit of the re-ordered impedance values.

Example C2: The system of Example C1, wherein measurer is coupled t the processor.

Example C3: The system of Example C1, wherein the processor comprises a pattern module and a pass/fail module.

Example C4: The system of Example C1, wherein the processor is remotely connected to the working device.

Example C5: The system of Example C1, wherein the working device comprises a PCB interface.

Example D1 includes a working device comprising a PCB interface, impedance measuring module, an analysis module and a control module.

Example D2: The working device of Example D1 wherein the analysis module comprises a pattern module and a pass/fail module.

In some example embodiments in accordance with the disclosed technology (example E1), a method includes receiving an input data stream comprising at least one data block; rearranging the sequence of data blocks in the input data stream to match one or more previously processed data blocks thereby forming a new data stream comprising at least one new data block; determining the quality of the fit (QOF) between the new data stream to a straight line; and sending a signal passing the input data stream or failing the data stream.

Example E2 includes the method of example E1, further comprising: identifying a first position for each data block in the input data stream and identifying a second position for each new data block from the new data stream.

Example E3 includes the method of example E1, further comprising prior to step b: identifying each data block to be excluded from the input data stream.

Example E4 includes the method of example E1, further comprising after step b: identifying each data block to be excluded from the input data stream.

Example E5 includes the method of example E1, further comprising prior to step d: determining if there is a next data block in the input data stream that should be analyzed and if so, repeating the re-ordering and determining steps for the next data block.

Example E6 includes the method of example E1, further comprising after to step d: forming the affinity array.

Example E7 includes the method of example E6, wherein forming the affinity array comprises determining run match number, an electrode match number and a QOF number.

In some example embodiments in accordance with the disclosed technology (example E8), a computer readable medium having instructions which when executed by a computing platform result in execution of a method comprising: receiving an input data stream comprising data blocks; rearranging the sequence of data blocks in the input data stream to match one or more previously processed data blocks thereby forming a new data stream comprising at least one new data block; determining the quality of fit (QOF) between the new data stream to a straight line; sending a signal passing the input data stream or failing the input data stream.

Example E9 includes the computer readable medium of example E8, further comprising: identifying a first position for each data block in the input data stream and identifying a second position for each new data block from the new data stream.

Example E10 includes the computer readable medium of example E8, further comprising prior to step b: identifying each data block to be excluded from the input data stream.

Example E11 includes the computer readable medium of example E8, further comprising after step b: identifying each data block to be excluded from the input data stream.

Example E12 includes the computer readable medium of example E8, further comprising prior to step d: determining if there is a next data block in the input data stream that should be analyzed and if so, repeating the re-ordering and determining steps for the next data block.

Example E13 includes the computer readable medium of example E8, further comprising after to step d: forming the affinity array.

Example E14 includes the computer readable medium of example E13, wherein forming the affinity array comprises determining run match number, an electrode match number and a QOF number.

In some example embodiments in accordance with the disclosed technology (example E15), an apparatus comprising: an input module that receives an input data stream comprising at least one data block; a comparator that compares each data block with each of a predetermined number of previously processed data blocks; and a qualifier that determines the quality of the fit (QOF) between the new data stream to a straight line wherein the qualifier forms an affinity array, wherein each element in the affinity array comprises an affinity number based on the run match number, an electrode match number, a QOF number or combinations thereof.

Example E16 includes the apparatus of example E15, further comprising a controller.

Example E17 includes the apparatus of example E15, wherein the input module is connected to the comparator.

Example E18 includes the apparatus of example E15, wherein the comparator and qualifier are remotely associated with the apparatus.

In some example embodiments in accordance with the disclosed technology (example F1), an automated electrochemical detection system for assaying a patient sample includes an assay cartridge including a printed circuit board (PCB) having a plurality of electrical interface connections corresponding to a plurality of electrodes in the PCB operable to implement an assay in the assay cartridge; and an assay processing device including (i) an instrument bank including a cartridge bay having an electronic unit that interface with the assay cartridge when inserted in the cartridge bay to implement the assay, wherein the electronic unit includes a plurality of electrical conductor sites to contact at least some of the plurality of electrical interface connections of the assay cartridge PCB, and (ii) a base station including a data processing unit to control functionality of the assay processing device and/or process the acquired data to produce an output for the electrochemical detection-based assay, wherein the assay processing device is configured to conduct a preflight test assessing electrical connection integrity of the PCB of the assay cartridge with the electronic unit of the cartridge bay prior to implementing the assay, wherein, in conducting the preflight test, the assay processing device measures an electrical signal to determine an impedance value associated with at least some of the electrodes of the assay cartridge PCB; analyzes the determined impedance value to evaluate a quality factor (also referred to as a QOF factor) of the electrical connection between the assay cartridge PCB and the electronic unit of the assay processing device; and determines a command for initiating an assay procedure when the quality factor is at or above a predetermined standard, or determines a command for ejecting the assay cartridge from the assay processing device when the quality factor is below the predetermined standard.

Example F2 includes the system of example F1, wherein the assay processing device analyzes the determined impedance value by assigning the determined impedance values into data blocks, wherein the each data block corresponds to each electrode associated with the impedance value; organizing the data blocks into a sequence; and determining the quality factor of the electrical connection by calculating two or more parameters associated with the sequence of the data blocks and evaluating the two or more parameters each to a predetermined threshold value or threshold range.

Example F3 includes the system of example F2, wherein the assay processing device organizes the data blocks by reordering the data blocks into a monotonical sequence.

Example F4 includes the system of example F3, wherein the monotonical sequence includes a lowest-to-highest monotonical sequence where an earlier data block in the sequence having a first impedance value precedes a latter data block in the sequence having a second impedance value that is greater than the first impedance value, or wherein the monotonical sequence includes a highest-to-lowest monotonical sequence where an earlier data block in the sequence having a first impedance value precedes a latter data block in the sequence having a second impedance value that is less than the first impedance value.

Example F5 includes the system of example F2, wherein the assay processing device organizes the data blocks by reordering the data blocks based on a predetermined reference order (RO) to create a monotonic sequence of the reordered data blocks.

Example F6 includes the system of example F2, wherein the assay processing device, prior to organizing the data blocks, compares the impedance values to prior impedance values obtained from one or more previous preflight tests using the cartridge bay of the assay processing device, and wherein the assay processing device organizes the data blocks by reordering the data blocks based on a prior reference order (PRO) at least partially determined by an average of prior valid runs of prior assay cartridges.

Example F7 includes the system of example F2, wherein the two or more parameters are selected from a group consisting of a correlation coefficient ($R^2$), a scaled error of fit for an electrode fit test (EFT), a standard error of fit for a run fit test (RFT), and a tolerance difference value includes a difference of an $R^2$ associated with a different assay cartridge and the $R^2$ associated with the assay cartridge, or a difference of an RFT associated with a different assay cartridge and the RFT associated with the assay cartridge.

Example F8 includes the system of example F1, wherein the assay cartridge includes reagents to assay a panel of respiratory pathogens, central nervous system pathogens, gastrointestinal pathogens, fungal pathogens, HCV pathogens, gram positive bacteria, or gram negative bacteria from a patient sample.

In some example embodiments in accordance with the disclosed technology (example F9), a method for preflight test assessing electrical connection integrity of an assay cartridge interfaced with an assay processing device includes establishing an electrical connection between (i) an assay cartridge including a printed circuit board (PCB) having a plurality of electrical interface connections corresponding to a plurality of electrodes in the PCB and (ii) an electronic unit in a cartridge bay of an assay processing device, wherein the electronic unit includes a plurality of electrical conductor sites to contact at least some of the plurality of electrical interface connections of the assay cartridge PCB; measuring an electrical signal to determine an impedance value associated with at least some of the electrodes of the assay cartridge PCB; analyzing the determined impedance value to evaluate a quality factor of the electrical connection between the assay cartridge PCB and the electronic unit of the assay processing device; and determining a command for initiating an assay procedure when the quality factor is at or above a predetermined standard, or determining a command for ejecting the assay cartridge from the assay processing device when the quality factor is below the predetermined standard.

Example F10 includes the method of example F9, wherein the analyzing includes assigning the determined impedance values into data blocks, wherein the each data block corresponds to each electrode associated with the impedance value; organizing the data blocks into a sequence; and determining the quality factor of the electrical connection by calculating two or more parameters associated with the sequence of the data blocks and evaluating the two or more parameters each to a predetermined threshold value or threshold range.

Example F11 includes the method of example F10, wherein the organizing the data blocks includes reordering the data blocks into a lowest-to-highest monotonical sequence where an earlier data block in the sequence having a first impedance value precedes a latter data block in the sequence having a second impedance value that is greater than the first impedance value, or wherein the organizing the data blocks includes reordering the data blocks into a highest-to-lowest monotonical sequence where an earlier data block in the sequence having a first impedance value precedes a latter data block in the sequence having a second impedance value that is less than the first impedance value.

Example F12 includes the method of example F11, further comprising, prior to or after the organizing the data blocks into the monotonical sequence, excluding one or more data blocks can be excluded based on a comparison of the impedance value with a previous impedance value associated with a prior preflight test.

Example F13 includes the method of example F10, wherein the organizing the data blocks includes reordering the data blocks based on a predetermined reference order (RO) to create a monotonic sequence of the reordered data blocks.

Example F14 includes the method of example F13, wherein the predetermined reference order is produced from an analysis of internal and external data that define a pattern of impedance values associated with the corresponding electrodes.

Example F15 includes the method of example F14, further comprising generating the predetermined reference order based on a frequency pattern identified from three or more preflight tests, wherein the frequency pattern is produced by averaging impedance values associated with the corresponding electrode for each of the three or more preflight tests and ordering them monotonically.

Example F16 includes the method of example F15, wherein the monotonic sequence of reordered data blocks includes a lowest-to-highest monotonical sequence where an earlier data block in the sequence having a first impedance value precedes a latter data block in the sequence having a second impedance value that is greater than the first impedance value, or wherein the monotonic sequence of reordered data blocks includes a highest-to-lowest monotonical sequence where an earlier data block in the sequence having a first impedance value precedes a latter data block in the sequence having a second impedance value that is less than the first impedance value.

Example F17 includes the method of example F16, further comprising, prior to or after the reordering the data blocks based on a predetermined reference order, excluding one or more data blocks can be excluded based on a comparison of the impedance value with a previous impedance value associated with a prior preflight test.

Example F18 includes the method of example F10, further comprising, prior to the organizing the data blocks, comparing the impedance values to prior impedance values obtained from one or more previous preflight tests using the cartridge bay of the assay processing device, wherein the organizing the data blocks includes reordering the data blocks based on a prior reference order (PRO) at least partially determined by an average of prior valid runs of prior assay cartridges.

Example F19 includes the method of example F18, further comprising, prior to or after the reordering the data blocks based on a predetermined reference order, excluding one or more data blocks can be excluded based on a comparison of the impedance value with a previous impedance value associated with a prior preflight test.

Example F20 includes the method of any of the examples F10-F19, wherein the two or more parameters any of: a correlation coefficient ($R^2$), a scaled error of fit for an electrode fit test (EFT), a standard error of fit for a run fit test (RFT), and a tolerance difference value includes a difference of an $R^2$ associated with a different assay cartridge and the $R^2$ associated with the assay cartridge, or a difference of an RFT associated with a different assay cartridge and the RFT associated with the assay cartridge.

Example F21 includes the method of example F20, wherein a first parameter includes the correlation coefficient, and a second parameter includes the scaled error of fit for EFT.

Example F22 includes the method of example F20, wherein a first parameter includes the correlation coefficient, and a second parameter includes the standard error of fit for RFT.

Example F23 includes the method of example F20, wherein a third parameter includes the scaled error of fit for EFT.

Example F24 includes the method of example F20, wherein a first parameter includes the correlation coefficient, a second parameter includes the standard error of fit for RFT, and a third parameter includes the tolerance difference value.

Example F25 includes the method of example F20, wherein each data block includes one or more data including the impedance value determined for the corresponding electrode, and an index number associated only with the data block.

Example F26 includes the method of example F9, wherein the assay cartridge includes reagents to assay a panel of respiratory pathogens, central nervous system pathogens, gastrointestinal pathogens, fungal pathogens, HCV pathogens, gram positive bacteria, or gram negative bacteria from a patient sample.

In some example embodiments in accordance with the disclosed technology (example G1), a method for assessing electrical connection integrity of an assay cartridge interfaced with an assay processing device includes establishing an electrical connection between the assay cartridge and the assay processing device; measuring electrical signals to determine impedance values associated with at least two circuits between the assay cartridge and the assay processing device; organizing the impedance values to form a new data stream; analyzing the new data stream to determine a quality factor; and sending a command signal for initiating an assay procedure when the quality factor is at or above a predetermined standard.

Example G2 includes the method of example G1, further comprising sending a command signal for ejecting the assay cartridge from the assay processing device when the quality factor is below the predetermined standard.

Example G3 includes the method of example G1, wherein organizing the impedance values includes reordering the impedance values into a lowest-to-highest monotonical sequence, or wherein organizing the impedance values includes reordering the impedance values into a highest-to-lowest monotonical sequence.

Example G4 includes the method of example G1, further comprising, prior to or after organizing the impedance values, excluding one or more impedance values.

Example G5 includes the method of example G1, wherein organizing the impedance values comprises reordering the impedance values, which in some examples can be based on a predetermined reference order or a plurality of predetermined reference orders.

Example G6 includes the method of example G5, wherein the predetermined reference order or plurality of predetermined reference orders is produced from an analysis of internal and external data that define a pattern of impedance values associated with the corresponding circuits between the assay cartridge and the assay processing device.

Example G7 includes the method of example G1, wherein organizing the impedance values comprises reordering the impedance values based on a prior reference order at least partially determined by an average of prior valid runs on the assay processing device.

Example G8 includes the method of example G1, wherein the quality factor is based on one or more parameters selected from a group consisting of a correlation coefficient ($R^2$), a scaled error of fit for an electrode (EFT), a standard error of fit for a run (RFT), slope of the line created by the new data stream, intercept of the line created by the new data stream and a tolerance difference value wherein the tolerance difference value includes a difference of an $R^2$ associated with a different assay cartridge and the $R^2$ associated with the assay cartridge, or a difference of an RFT associated with a different assay cartridge and the RFT associated with the assay cartridge, or a difference of an EFT associated with a different assay cartridge and the EFT associated with the assay cartridge.

Example G9 includes the method of example G1, wherein the assay cartridge includes reagents to assay a panel of respiratory pathogens, central nervous system pathogens, gastrointestinal pathogens, fungal pathogens, HCV pathogens, gram positive bacterial pathogens, or gram negative bacterial pathogens from a patient sample.

In some example embodiments in accordance with the disclosed technology (example G10), a method for assessing electrical connection integrity of a first device and second device includes establishing an electrical connection between the first device and second device; measuring electrical signals to determine a first data block associated with at least three electrodes on the first device; organizing the first data block to form a second data block; analyzing the second data block according to a first factor; and sending a signal for initiating a procedure when the first factor is at or above a predetermined standard.

Example G11 includes the method of example G10, further comprising sending a signal for disconnecting the first device from the second device when the first parameter is below the predetermined standard.

Example G12 includes the method of example G10, wherein organizing the impedance values includes reordering the impedance values monotonically or based on a predetermined reference order.

Example G13 includes the method of example G10, wherein organizing the impedance values includes reordering the impedance values based on more than one predetermined reference order.

Example G14 includes the method of example G10, wherein the electrical signal is applied at a frequency between 10 kHz and 100 kHz.

Example G15 includes the method of example G10, further comprising analyzing the second data block according to a second factor and sending a signal for initiating a procedure when the first factor and second factor satisfy a predetermined standard.

In some example embodiments in accordance with the disclosed technology (example G16), an assay processing device for assaying a patient sample, comprising an electronic unit that interfaces with a printed circuit board (PCB) on an assay cartridge, an impedance module, a pattern module, and a qualifier module.

Example G17 includes the assay processing device of example G16, wherein the impedance module is configured to measure an electrical signal to determine an impedance value associated with at least some circuits between the assay cartridge and assay processing device; (ii) wherein the pattern module organizes the impedance values to form a new data stream, (iii) wherein the qualifier module analyzes the new data stream to evaluate a quality factor and sends a command signal for initiating an assay procedure when the quality factor is at or above a predetermined standard.

Example G18 includes the assay processing device of example G16, wherein the qualifier module sends a command signal to a control module for ejecting the assay cartridge from the assay processing device when the quality factor is below the predetermined standard.

Example G19 includes the assay processing device of example G16, wherein the pattern module organizes the impedance values into a lowest-to-highest monotonical sequence, or into a highest-to-lowest monotonical sequence or on a predetermined reference order.

Example G20 includes the assay processing device of example G16, wherein the pattern module and qualifier module are on a remote device.

Example G21 includes the assay processing device of example G16, wherein the impedance module, the pattern module and the qualifier module are on the electronics unit.

Example G22 includes the assay processing device of example G16, wherein the impedance module includes a signal generator and an impedance measurement apparatus, wherein the signal generator generates and emits a current pulse or a sequence of current pulses, and the impedance measurement apparatus measures an electrical signal to determine an impedance value associated with at least some circuits between the assay cartridge and assay processing device.

Example G23 includes the assay processing device of example G16, the assay processing device operable to implement the method of any of examples G1-G9.

In general terms, systems and methods of measuring impedance are disclosed. In some specific embodiments, systems and methods for measuring an electrical connection between a PCB and a device are disclosed. Various example implementations of systems and methods are described herein for measuring the contact impedance between two circuit boards.

In various examples, the disclosed systems and techniques are capable of obtaining an electrical characteristic of a circuit assembly connected to a working device, which includes measuring the impedance at each electrode, reordering the impedance values and determining if a connection exists between the circuit assembly and working device as a function of the re-order.

According to one aspect, provided is an article including a storage medium having instructions that, when executed by a computing platform, result in execution of a method for data analysis, the method comprising the steps of a) receiving an input data block; b) comparing one or more characteristics of each input data block with one or more previously processed input data blocks; c) rearranging the input data block to match the order of the previously processed data blocks to form a new data block; d) determining if the new data block is within predefined parameters; e) processing the cartridge if the new data block is within predefined parameters or ejecting the cartridge if the new data block is not within predefined parameters.

According to another aspect, provided is an apparatus for data comparison, the apparatus comprising: a) an input module that receives an input data stream; b) a comparator that compares each input data stream with each of a predetermined number of previously processed input data streams and wherein the comparator rearranges the input data stream to match the order of the previously processed input data stream to create a new data stream; and c) a qualifier that determines if the new input data stream is within predefined parameters.

According to another aspect, provided is a system for data comparison, the system comprising: a) a cartridge interface; b) an input module coupled to the cartridge interface that receives an input data stream; c) a processor; d) a memory coupled to the processor; e) a comparator that compares the new data stream with at least one previously processed data blocks and creates a new data stream; and f) a qualifier coupled to the comparator that determines if the new input data stream matches predefined parameters.

In some aspects, a system includes an assay cartridge including a PCB having a plurality of electrical interface connections; and an assay processing device including a cartridge bay having an electronic unit that interfaces with the assay cartridge when the assay cartridge is inserted into the cartridge bay, wherein the electronic unit includes a plurality of electrical conductor sites to contact at least some of the plurality of electrical interface connections of the assay cartridge PCB, wherein the assay processing device is configured to conduct a preflight test in which impedance values for each electrode circuit are rearranged and assessed to determine the electrical connection integrity of the PCB of the assay cartridge with the electronic unit of the cartridge bay prior to implementing the assay.

Various example embodiments in accordance the disclosed technology are described.

In some example embodiments in accordance with the disclosed technology (example H1), a method for assessing electrical connection integrity of an assay cartridge interfaced with an assay processing device includes (a) establishing an electrical connection between the assay cartridge and the assay processing device; (b) applying a voltage; (c) measuring electrical signals to determine impedance values associated with at least two circuits between the assay cartridge and the assay processing device; and (d) analyzing the impedance values to identify (i) a short or (ii) an open caused by a contaminant, wherein, when the impedance values are below a predetermined standard, the assay cartridge is electrically connected with the assay processing device.

Example H2 includes the method of example H1, including sending a command signal to initiate an assay procedure when the impedance value is at and/or above a predetermined standard.

Example H3 includes the method of example H1, wherein the voltage is about 100 kHz.

In some example embodiments in accordance with the disclosed technology (example I1), a method for assessing electrical connection integrity of an assay cartridge interfaced with an assay processing device includes (a) establishing an electrical connection between the assay cartridge and the assay processing device; (b) applying a voltage; (c) measuring resistance but not capacitance to determine impedance values associated with at least two circuits between the assay cartridge and the assay processing device; and (d) analyzing the impedance values to identify (i) a short or (ii) an open caused by a contaminant, wherein, when the impedance values are below a predetermined standard, the assay cartridge is electrically connected with the assay processing device.

Example I2 includes the method of example I1, including sending a command signal to initiate an assay procedure when the impedance values are at and/or above a predetermined standard.

In some example embodiments in accordance with the disclosed technology (example J1), a method for assessing electrical connection integrity of a PCB interfaced with a processing device includes (a) establishing an electrical connection between the PCB and the processing device; (b) applying a voltage; (c) measuring electrical signals to determine impedance values associated with at least two circuits between the PCB and the processing device; (d) analyzing the impedance values to identify (i) a short or (ii) an open caused by a contaminant, wherein, when the impedance values are below a predetermined standard, the PCB is electrically connected with the processing device.

Example J2 includes the method of example J1, including sending a command signal to initiate a procedure when the impedance value is at and/or above a predetermined standard.

Example J3 includes the method of example J1, including wherein the voltage is about 100 kHz.

In some example embodiments in accordance with the disclosed technology (example K1), a method for assessing electrical connection integrity of a PCB interfaced with a processing device, comprising: (a) establishing an electrical connection between the PCB and the processing device; (b) applying a voltage; (c) measuring resistance but not capacitance to determine impedance values associated with at least two circuits between the PCB and the processing device; and (d) analyzing the impedance values to identify (i) a short or (ii) an open caused by a contaminant, wherein, when the impedance values are below a predetermined standard, the PCB is electrically connected with the processing device.

Example K2 includes the method of example K1, including sending a command signal to initiate a procedure when the impedance values are at and/or above a predetermined standard.

In some example embodiments in accordance with the disclosed technology (example L1), an assay processing device includes an electronic unit to electronically interface with a printed circuit board (PCB) on an assay cartridge; an impedance module comprising a signal generator and an impedance measurement device; and an analysis module comprising a processor and memory, wherein the analysis module comprises a qualifier module, wherein the qualifier module comprises a fail criteria factor, wherein, when the fail criteria factor is below a predetermined standard, the electronic unit is electrically connected with the PCB on the assay cartridge.

In some example embodiments in accordance with the disclosed technology (example M1), a method for reducing electrode variability when assessing electrical connection integrity of an assay cartridge interfaced with an assay processing device includes (a) establishing an electrical connection between the assay cartridge and the assay processing device; (b) applying a voltage of about 100 kHz to 1000 kHz; (c) measuring electrical signals to determine impedance values associated with at least two circuits between the assay cartridge and the assay processing device; and (d) analyzing the impedance values to identify (i) a short or (ii) an open caused by a contaminant, wherein, when the impedance values are below a predetermined standard, the assay cartridge is electrically connected with the assay processing device.

In some example embodiments in accordance with the disclosed technology (example N1), a method for measuring shorts but not true opens when assessing electrical connection integrity of an assay cartridge interfaced with an assay processing device includes (a) establishing an electrical connection between the assay cartridge and the assay processing device; (b) applying a voltage of about 100 kHz to 1000 kHz; (c) measuring electrical signals to determine impedance values associated with at least two circuits between the assay cartridge and the assay processing device; and (d) analyzing the impedance values to identify (i) a short or (ii) an open caused by a contaminant, wherein, when the impedance values are below a predetermined standard, the assay processing device is electrically connected with the assay cartridge.

Example Methods for Assessing Electrical Connection Integrity by High Frequency Impedance Detection Introduction The testing of both electrical open circuit connections "opens" and short circuit connections "shorts" to verify the integrity of connection between an assay cartridge and assay testing instrument or between a PCB and an analysis instrument can be implemented to ensure the correct functioning of the assay cartridge or PCB. It was surprising to discover that an impedance assay that can detect shorts but not opens is able to effectively identify whether an assay cartridge was properly connected to an assay testing instrument or was improperly connected to an assay testing instrument. Yet, it is also surprising to discover that using high frequency, shorts were more easily identifiable because shorts had a much greater range. As discussed above, detecting shorts and opens with only minimal variation is difficult to detect because of bay-to-bay variability, cartridge-to-cartridge variability, along with measurement variability. Because the opens and shorts (e.g., caused by contaminates) are identifiable using a high frequency impedance test, the likelihood of passing a cartridge with poor connections is low.

Because the voltage is applied at a much faster frequency (e.g., 10× faster), high frequency impedance testing can reduce the time-to-result. Time-to-result is a critical component of pathogen detection devices. Indeed, timely initiation of effective therapy is a critical step in the management of patients with sepsis. Recent studies have shown that patients with severe sepsis or septic shock showed an increased likelihood of death of 7.6% for every hour in which appropriate antibiotic therapy is not applied. Thus, survival rates have been significantly increased as diagnosis times have been reduced. Rapid pathogen identification methods are also associated with decreased mortality, decreased length of stay (LOS) for treating patients in a clinical setting, and decreased cost of health care. This is because rapid pathogen identification methods allow clinicians to quickly initiate "pathogen-directed" therapy and appropriately escalate or de-escalate antibiotic therapy, as needed.

Disclosed are devices, systems and methods for assessing the integrity of electrical connections between elements of interfacing electronic devices based on high frequency analysis (e.g., high frequency impedance detection of shorts in preflight tests). The disclosed methods can be implemented by a variety of electronic systems that electrically interface different circuits, electronic components, modules, units or apparatuses. While implementations of the disclosed technology are suitable for a variety of applications, the following disclosure describes several embodiments of the disclosed methods, systems and devices for assay systems capable of detecting a target analyte, which include assessing the electrical connections between an assay cartridge and an instrument bay of the assay device.

Figure 35:
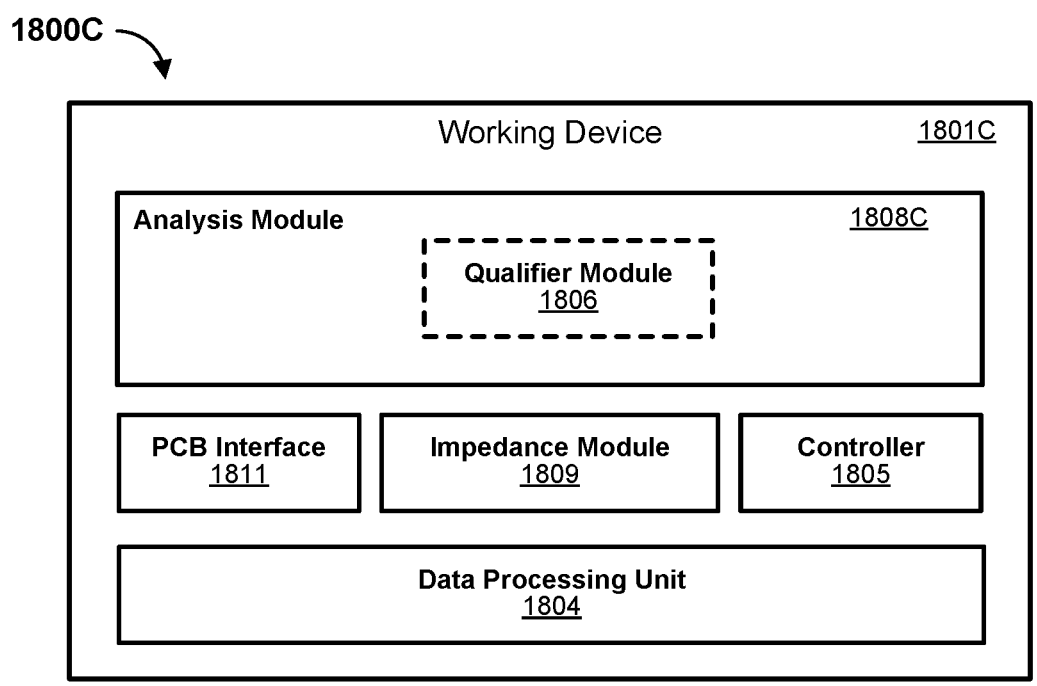
FIG. 35 shows a diagram of an example embodiment of a system for assessing electrical integrity between interfacing devices, such as a PCB electronically connected to a processing instrument.

In some implementations, the example embodiments of the high frequency analysis methods can be implemented by example embodiments of the devices and systems, or any combinations of the devices and systems, described above or hereafter, including but not limited to the system 1800A and/or the system 1800B in FIGS. 18A and 18B, respectively and/or the system 1800C in FIG. 35.

Example High Frequency Impedance Test Conditions

It was observed that if the frequency goes up (e.g., increased about 10 fold, e.g., from about 10 kHz to 100 kHz) the contribution of capacitance in the measured impedance values becomes minimal. The high frequency impedance test cannot identify true opens.

In some embodiments, during the high frequency impedance test frequency ranges from about 100 kHz to 1000 kHz. In some embodiments, frequency ranges from about 100 kHz to 10,000 kHz. In some embodiments, the frequency is greater than 100 kHz.

Example High Frequency Impedance Test Timeline

In some embodiments, the high frequency impedance test is run as a preflight test. A preflight test is a test run before the assay cartridge or PCB is processed by the analysis instrument. In some embodiments, the high frequency impedance test is run as a postflight test. A postflight test is a test run after the assay cartridge or PCB has been processed by the analysis instrument.

Example Techniques for Generating Impedance Values

In some embodiments, a high frequency analysis system is resident on a working device, such as or like the working device 1801 of FIG. 18A, the working device 1802 of FIG. 18B, and/or a working device 1801C shown in FIG. 35, to measure and process working impedance value or values (WIV) in implementations of the high frequency impedance test method. A working impedance value is the impedance value obtained from the circuit connecting a first electronic device having electrical connections interfaced to corresponding electrical connections of a second electronic device, e.g., such as the impedance values obtained for electrodes on a PCB of an assay cartridge that is inserted into a bay of an assay processing device. In some embodiments, a portion of the system is resident on a remote device, such as or like the remote device 1803 of FIG. 18B, which is in data communication with the working device to measure and process WIV(s) in implementations of the high frequency impedance method.

FIG. 35 shows a diagram of an example embodiment of a system 1800C for assessing electrical integrity between interfacing devices, such as a PCB electronically connected to a processing instrument. The system 1800C includes an example embodiment of a working device, 1801C. In some embodiments, the working device 1801C includes an embodiment of the analysis module, such as the example analysis module 1808C shown in FIG. 35. The analysis module 1808C includes an embodiment of a qualifier module 1806. In some embodiments, the qualifier module 1806 can be configured to determine whether each electrode is connected, which in some implementations, is by implementing an examine operation seeking an acceptable tolerance, seeking an unacceptable tolerance, or seeking both an acceptable and unacceptable tolerance. In some embodiments, the working device 1801C includes an embodiment of the PCB interface 1811. In some embodiments, the working device 1801C includes an embodiment of the impedance module 1809. In some embodiments, the working device 1801C includes an embodiment of the controller 1805. In some embodiments, the working device 1801C includes an embodiment of the data processing unit 1804.

In some embodiments, the impedance module includes a signal generator and an impedance measurement apparatus. In implementations, for example, the signal generator generates and emits a current pulse or a sequence of current pulses. The impedance measurement apparatus measures the electrical signal and determines the impedance value (working impedance value (WIV)) at each electrode. The impedance module receives an input data stream comprising at least one data block. In some cases, for example, the data block is a WIV for a particular electrode (where the electrodes from the assay cartridge and assay device form a circuit) of the cartridge PCB; whereas in other cases, for example, the data block includes another data type, such as current, voltage, time, weight, brightness, distance or combinations thereof associated with the particular electrode of the cartridge PCB. Once the impedance module obtains an impedance measurement for each electrode it sends the data block (e.g., WIV and/or other data type associated with a particular measured electrode) to the analysis module. For example, the impedance module obtains the impedance measurement values when the cartridge PCB interfaces with the cartridge PCB interface of the working device (analysis device), and the signal generator applies an electrical signal to the cartridge circuit board through the PCB interface.

Analyzing the Detected Impedance Signal

The analysis module may be included in the working device or may be included in a remote device. In implementations of the system where the analysis module is on the remote device, the data obtained by the impedance module is sent to the remote device via a communication module of the working device and is received by the remote device via a communication module. The data received at the remote device is provided to the analysis module for data analysis in accordance with the example embodiments of a high frequency impedance test method described herein.

For example, regardless of whether the high frequency impedance test is run as a preflight or postflight test, once the analysis module has received the detection signal from the impedance module, the analysis module analyzes the measured impedance values acquired from an impedance module in accordance with the high frequency impedance test.

Figure 33:
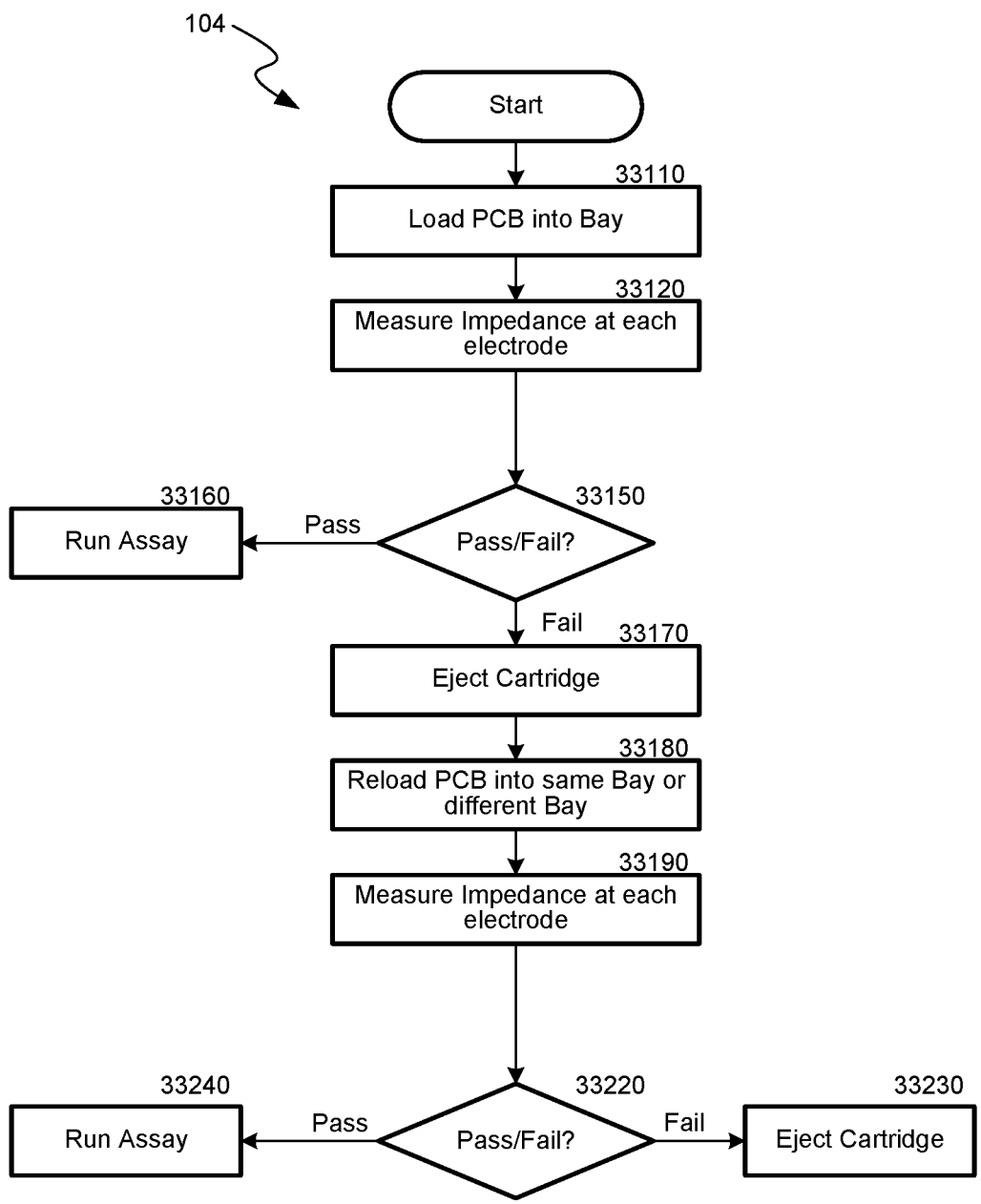
FIGS. 33 and 34 show diagrams of example embodiments of methods for assessing electrical connections based on high frequency impedance for detection of shorts in preflight tests.
Figure 34:
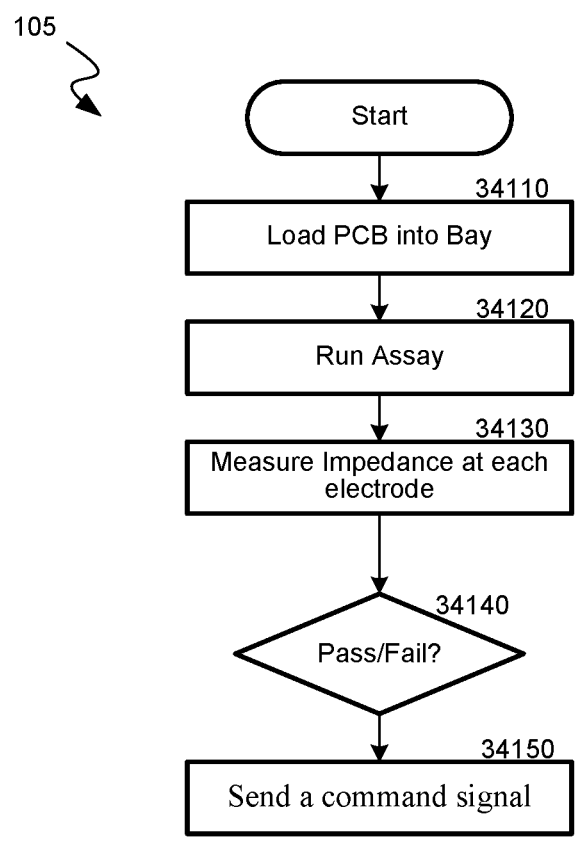

FIGS. 33 and 34 show diagrams of example embodiments of methods for assessing electrical connections based on high frequency analysis, such as high frequency impedance, for detection of shorts. FIG. 33 illustrates an example method 104 for assessing electrical connections based on the high frequency impedance testing. At step 33110 of the method 104 (or step 34110 method 105 of FIG. 34), a circuit assembly of a first device (e.g., assay cartridge or PCB) is loaded into a second device (e.g., instrument bay), such that the circuit assembly of the first device electrically interfaces with a circuit assembly of the second device. At step 33120 of the method 104 (or step 34130 of method 105 of FIG. 34), an input data stream including impedance data blocks is collected. The input data stream can include data elements, such as charge data blocks, amplitude data blocks, impedance data blocks, current data blocks, volts data blocks, time data blocks, weight data blocks, brightness data blocks, distance data blocks or combinations thereof. In some embodiments, the input data stream comprises a sequence of bytes and/or pixels. In some embodiments, the input data stream may be divided into a sequence of n data blocks, where each data block represents a different electrode. For example, Block 1, Block 2, Block 3, . . . , Block n corresponds to electrode 1, electrode 2, electrode 3, . . . , electrode n.

Resolving Fail Criteria Factor

Regardless of whether the high frequency impedance test is run as a preflight or postflight test, the method 104 includes a step 33150 (or step 34140 of method 105 of FIG. 34) to determine whether the impedance value meets a threshold. The analysis module comprises a Fail Criteria Factor. In some implementations, the Fail Criteria Factor is the amount any impedance value varies from its expected value or average of expected values. This determination is the same for every electrode on the PCB and need not be normalized. The Fail Criteria Factor is based on internal and/or external data to define the ranges and the limits of whether the impedance value meets a threshold. In some embodiments, the analysis module determines if the Fail Criteria Factor is met. In some embodiments, the Fail Criteria Factor is evaluated when a frequency of 99,9999 Hz is applied during the impedance test. In some embodiments, the Fail Criteria Factor is evaluated when a frequency of 99,9999-10,000,000 Hz is applied during the impedance test.

In the method 104, the impedance value may pass with respect to the fail criteria factor, and subsequently implements step 33160 to run the application of the analysis system, e.g., such as run the assay. Yet, if the evaluated impedance values do not meet the threshold with respect to the fail criteria factor and thereby fails, the method can implement a series of steps 33170-33220 to retest the first device (e.g., cartridge), or simply permanently fail the test by implementing the process 33230.

For example, some embodiments of the method 104 includes a step 33170 to initially eject the first device (e.g., assay cartridge); a step 33180 to reload the first device into the second device (e.g., reload the cartridge in the bay (same bay or in a different bay) to interface the circuit assembly of the cartridge with the electronics of the bay); a step 33190, similar to step 33120, to re-measure the impedance for each electrode; and a step 33220, similar to step 33150, to determine whether the impedance data passes or fails according to the fail criteria factor; after which, the method 104 includes running the application at step 33240 if a pass, or ejecting the first device at step 33230 if it fails.

Alternatively, in the method 105, the impedance value may pass with respect to the fail criteria factor, and subsequently implement step 34150 to send a command signal. The command signal can associate the detection result with the patient sample. Yet, if the evaluated impedance values do not meet the threshold with respect to the fail criteria factor and thereby fails, the method 105 at step 34150 can send a different command signal such as do not associate the detection result with the patient sample. The command signal can (1) indicate that the cartridge has a leak or (2) indicate that the results should be disregarded or (3) indicate that the bay may be compromised or (4) disable the bay or (5) associate the detection result with the patient sample or (6) fail to associate the detection result with the patient sample or (7) eject the cartridge or (8) any combination of the above. In some embodiments, the command signal is sent by the qualifier module.

In some embodiments of the high frequency impedance test, a short is detected when an impedance value is at least 500 units from the average impedance value of all the electrodes. In some embodiments, a short is detected when an impedance value is about 500-1,000 units from the average impedance value of all electrodes. In some embodiments, a short is detected when an impedance value is about 500-20,000 units from the average impedance value of all electrodes.

In some embodiments of the high frequency impedance test, a leak is detected when an impedance value is at least 500 units from the average impedance value of all electrodes. In some embodiments, a leak is detected when an impedance value is about 500-1,000 units from the average impedance value of all electrodes. In some embodiments, a leak is detected when an impedance value is about 500-20,000 units from the average impedance value of all electrodes.

In some embodiments of the high frequency impedance test, an open due to a contaminant is detected when an impedance value is at least 500 units from the average impedance value of all electrodes. In some embodiments, an open due to a contaminant is detected when an impedance value is about 500-1,000 units from the average impedance value of all electrodes. In some embodiments, an open due to a contaminant is detected when an impedance value is about 500-20,000 units from the average impedance value of all electrodes. In some embodiments, a true open cannot be detected by the high frequency impedance test. A true open is when the electrode on the first device (assay cartridge or PCB) does not touch the electrode on the second device (analysis instrument or processing device).

Regardless of whether the high frequency impedance test is run as a preflight or postflight test, in some implementations, a "pass" signal is generated if every electrode on the PCB has an impedance value below the fail criteria factor. Stated another way, a "pass" signal is generated if every electrode on the PCB has an impedance value below 100-500 units from the average impedance value of all electrodes. In some implementations, a "pass" signal is generated if 90-99% of the electrodes on the PCB has an impedance value below the fail criteria factor. Stated another way, a "pass" signal is generated if 90-99% of the electrodes on the PCB has an impedance value below 100 from the average impedance value of all electrodes. In some implementations, a "fail" signal is generated if at least one electrode on the PCB has an impedance value above the fail criteria factor. Stated another way, a "fail" signal is generated if at least one electrode on the PCB has an impedance value 500 units or above from the average impedance value of all the electrodes. In some embodiments, failing criteria having a range further than 820 units from the average impedance value of all the electrodes.

In other implementations, the average of all the impedance values is calculated and the average impedance value is compared to the fail criteria factor. In such implementations, a "pass" signal is generated if the average impedance value is below the fail criteria factor. In such implementations, a "fail" signal is generated if the average impedance value is above the fail criteria factor.

In some implementations, the high frequency impedance test does not utilize a pattern module.

In some implementations of the high frequency impedance test, the analysis module comprises a qualifier module. The qualifier module determines whether each electrode is connected. In these implementations, the qualifier may include an "examine" operation to scrutinize if each electrode is connected. In some implementations, the examine operation can include seeking an acceptable tolerance. In some implementations, the examine operation can include seeking an unacceptable tolerance. In some implementations, the examine operation can include seeking an acceptable and unacceptable tolerance.

In some implementations of the high frequency impedance test, the examine characteristics include a predefined parameter number. In some implementations, examine characteristics are the same for each electrode. In some implementations, the examine characteristic is the impedance value. In some implementations, a "pass" signal is generated if the examine characteristic is less than or equal to a threshold. In some implementations, a "fail" signal is generated if the examine characteristic is greater than or equal to a threshold. In some implementations, a "pass" signal is generated if all the examine characteristic evaluated are below than or equal to a threshold. In some implementations, a "fail" signal is generated if any examine characteristics are above or equal to a threshold.

Excluding Certain Impedance Values

In some implementations of the high frequency impedance test, certain impedance values can be excluded from the pass/fail analysis. In some implementations, for example, impedance values may be excluded because (1) the electrode is highly variable run-to-run or, (2) the electrode's impedance measurement is too high or too low.

Time-to-Result

One advantage of the high frequency impedance test, for example, is that it speeds the time-to-result as compared to traditional methods. In some embodiments, the high frequency impedance test is completed in under 1 minute or in under 30 seconds or in under 25 seconds or under 20 seconds, or under 17 seconds or under 15 seconds or under 10 seconds, or under 7 seconds, or under 5 seconds or under 3 seconds or under 2 seconds or under 1 second. In some embodiments, the high frequency impedance test is preferably completed in under 17 seconds. In some embodiments, the high frequency impedance test is completed in about 1-60 seconds or in 1-30 seconds, or in 1-30 seconds, or in 1-17 seconds, or in 1-15 seconds, or in 1-10 seconds, or in 1-5 seconds, or in 1-2 seconds.

In some embodiments, the starting frequency of the high frequency impedance test is 99,999 Hz. In some embodiments, the starting frequency of the high frequency impedance test is about 99,999 Hz. In some embodiments, the starting frequency of the high frequency impedance test is about 200,000 Hz or 300,000 Hz or 400,000 Hz or 500,000 Hz, or 600,000 Hz or 700,000 Hz or 800,000 Hz, or 900,000 Hz or 10,000,000 Hz (1 MHz).

At 99,999 Hz the high frequency impedance test takes 17 seconds. At higher frequencies the test is shorter, as an example at 1 MHz, which is 10×99 kHz, the shorts test would take 1-2 seconds. Above 1 MHz, the high frequency impedance test is not expected to run noticeably faster. At higher frequencies (above 99,999 Hz), capacitance variation between bays and consumables plays less of an effect. At higher frequencies (above 99,999 Hz), the shorts test is faster (faster than 17 seconds). At higher frequencies, up to 1 MHz, test time is reduced to 1-2 seconds. Beyond 1 MHz, unexpected effects are likely. At a frequency of 99,999 Hz the high frequency impedance test time is about 17 seconds. At a frequency of about 500,000 Hz the high frequency impedance test time is about 10 seconds. At a frequency of about 10,000,000 Hz the high frequency impedance test time is about 1 second. At a frequency of about 10,000,000 Hz the high frequency impedance test time is about 2 seconds.

In some embodiments, the signal to noise ratio is 11. In some embodiments, the signal to noise ratio is about 11. In some embodiments, the signal to noise ratio is about 9-13.

Example Data and Results

Example 14: A High Frequency Impedance Test Detects Leaks on a PCB

In an example implementation, it was observed that Cartridge VLP0953-011 failed the preflight impedance high frequency shorts test when run on a diagnostic instrument. Table 6, below, shows the example results. RSO_FET is an impedance test using the re-ordered data block method. High Freq. shorts test means the high frequency impedance test with a starting frequency of 99,999 Hz.

TABLE 6

Shorts Test Detection of a reagent leak on consumable ID# VLP0953-011

| Consumable ID# (Accession ID) | Fault Inject | Description | RSO_FET Expected Result | RSO_FET Actual Result | High Freq. SHORTS TEST Expected Result | High Freq. SHORTS TEST Actual Result | Observations |
|---|---|---|---|---|---|---|---|
| VLP0953-011 | Taped Open electrodes 19 & 129 | PASSES RSO-FET WITH AN OPEN | Pass | Fail | Pass | Fail (electrodes 75-81) | Reagent spill on electrodes 73-81 |
| VLP0953-012 | Taped Open electrodes 120 & 132 | PASSES RSO-FET WITH AN OPEN | Pass | Fail | Pass | Pass | N/A |
| VLP0953-013 | Taped Open electrodes 21 & 133 | PASSES RSO-FET WITH AN OPEN | Pass | Fail | Pass | Pass | N/A |
| VLP0953-014 | Taped Open electrodes 22 & 136 | PASSES RSO-FET WITH AN OPEN | Pass | Fail | Pass | Pass | N/A |
| VLP0953-015 | Taped Open electrodes 23 & 137 | PASSES RSO-FET WITH AN OPEN | Pass | Fail | Pass | Pass | N/A |
| VLP0953-016 | Taped Open electrodes 25 & 140 | PASSES RSO-FET WITH AN OPEN | Pass | Pass | Pass | Pass | N/A |

Data review indicated many pads failed for high frequency impedance, the failing criteria having a range further than 820 unites from the average of all electrodes. Typically for a short only a few electrodes, two or three, have high impedance and thus it was inferred that it was a false failure. Upon inspection of the bottom of the cartridge a leak was evident on the pads that failed. Thus, it was concluded that while high frequency impedance testing could not detect true opens, it can detect opens caused by a contaminant such as a liquid, solid or gel, preferably a liquid. In some implementations, the liquid is water, mineral oil, buffer, binding buffer, or other cartridge reagents.

In some embodiments, the high frequency impedance test is used to detect a leak in a preflight test, a postflight test or both. In some embodiments, the command signal indicates that the cartridge has a leak.

In some embodiments, the high frequency impedance test is used to detect a leak wherein 4 or more electrodes are above the fail criteria factor. In some embodiments, the high frequency impedance test is used to detect a leak wherein 4 to about 6 electrodes are above the fail criteria factor. In some embodiments, the high frequency impedance test is used to detect a leak wherein 4 to about 20 electrodes are above the fail criteria factor. In some embodiments, the high frequency impedance test is used to detect a leak wherein 4 to about 100 electrodes are above the fail criteria factor.

In some embodiments, the high frequency impedance test is used to detect a leak wherein 4 or more electrodes in a row are above the fail criteria factor. In some embodiments, the high frequency impedance test is used to detect a leak wherein 4 to about 6 electrodes in a row are above the fail criteria factor. In some embodiments, the high frequency impedance test is used to detect a leak wherein 4 to about 20 electrodes in a row are above the fail criteria factor. In some embodiments, the high frequency impedance test is used to detect a leak wherein 4 to about 100 electrodes in a row are above the fail criteria factor.

Summary of the High Frequency Impedance Test

In some implementations, an assay test cartridge is initially inserted into analysis device and pre-examined before implementing an assay. The analysis device sends a voltage of at least 100 kHz to the assay test cartridge. Impedance values for one or more electrodes on the assay test cartridge are measured to generate a working impedance value (WIV) for each of the one or more electrodes. If the WIV is above a predetermined threshold, a pass signal is generated, and the cartridge is processed by the analysis device; whereas, if a cartridge fails such preflight impedance testing, it is ejected and can be re-tested in the same bay or in a different bay.

In some example embodiments in accordance with the disclosed technology, a method and system for assessing electrical connection integrity of an assay cartridge interfaced with an assay processing device is disclosed and includes establishing an electrical connection between the assay cartridge and the assay processing device; applying a voltage to the assay cartridge of at least 100 kHz; measuring electrical signals to determine impedance values associated with at least two circuits between the assay cartridge and the assay processing device wherein, when the impedance values are above a predetermined standard, the assay processing device is electrically connected with the assay cartridge.

In some implementations, a PCB is initially inserted into analysis device and pre-examined. The analysis device sends a voltage of at least 100 kHz to the PCB. Impedance values for one or more electrodes on the PCB are measured to generate a working impedance value (WIV) for each of the one or more electrodes. If the WIV is above a predetermined threshold, a pass signal is generated, and the PCB is processed by the analysis device; whereas, if a PCB fails such preflight impedance testing, it is ejected and can be re-tested. In some embodiments, when the WIV is above a predetermined standard, the analysis device is not electrically connected with the PCB. In some embodiments, when the WIV is below a predetermined standard, the analysis device is electrically connected with the PCB.

In some example embodiments in accordance with the disclosed technology, a method for assessing electrical connection integrity of a PCB interfaced with an analysis device includes establishing an electrical connection between the PCB and the analysis device; applying a voltage to the PCB of 100 kHz-1000 kHz; measuring electrical signals to determine impedance values associated with at least two circuits between the PCB and the analysis device; and sending a command signal for initiating a procedure when the impedance values are above a predetermined standard.

In some implementations, an assay test cartridge is assessed by an analysis device to generate a result. After the analysis is complete the integrity of the assay test cartridge is assessed by the analysis device. The analysis device sends a voltage of 100 kHz to the assay test cartridge. Impedance values for one or more electrodes on the assay test cartridge are measured for each of the one or more electrodes. If the impedance values are above a predetermined threshold, a pass signal is generated, and the result is (1) approved by the analysis device, or (2) associated with the assay test cartridge, or (3) is reported on a detection report.

In some example embodiments in accordance with the disclosed technology, a method for assessing electrical connection integrity of a PCB interfaced with an analysis device includes (a) running a high frequency impedance test and then (b) running an impedance test using the ROPE, SOPE or POPE methods. In some embodiments, only if step (a) passes is step (b) run. In some embodiments, only if step (a) fails is step (b) run. In some embodiments, only the high frequency impedance test data is analyzed to determine if the PCB is electronically connected to the analysis device even though a re-ordered impedance test is also run. In some embodiments, only the ROPE, SOPE or POPE impedance test data is analyzed to determine if the PCB is electronically connected to the analysis device even though high frequency impedance test data is determined.

In some example embodiments in accordance with the disclosed technology, a method for assessing electrical connection integrity of a PCB interfaced with an analysis device includes (a) running an impedance test using the ROPE, SOPE or POPE methods and then (b) running a high frequency impedance test. In some embodiments, only if step (a) passes is step (b) run. In some embodiments, only if step (a) fails is step (b) run. In some embodiments, only the high frequency impedance test data is analyzed to determine if the PCB is electronically connected to the analysis device. In some embodiments, only the ROPE, SOPE or POPE impedance test data is analyzed to determine if the PCB is electronically connected to the analysis device. In some embodiments, only the high frequency impedance test data is analyzed to determine if the PCB is electronically connected to the analysis device even though re-ordered impedance test data is generated. In some embodiments, only the ROPE, SOPE or POPE impedance test data is analyzed to determine if the PCB is electronically connected to the analysis device even though high frequency impedance test data is generated.

In some embodiments, preflight test options are displayed in a graphical user interface on a display device, the graphical user interface provides a drop-down menu displaying pre-populated preflight impedance tests available to be run (high frequency, SOPE, ROPE or POPE or a combination) for user selection. In such embodiments, user selection of a pre-populated choice is received, the impedance test run and a command signal sent.

In some embodiments, the system is populated with a hierarchical set of impedance tests, and wherein the processor is further configured to apply the hierarchical set of impedance tests to the assay cartridge, wherein an impedance test higher in the hierarchy is applied before an impedance test lower in the hierarchy. In some embodiments, the processor is configured to apply the high frequency impedance test first and then apply a re-ordered impedance test. In some embodiments, the processor is configured to apply a re-ordered impedance test first and then apply the high frequency impedance test.

In some embodiments, the command signal sends a display to a graphical user interface that provides a first field having a plurality of pre-populated choices for user selection. In some embodiments, the user selection is (1) disregard the results, (2) re-run the sample, (3) disable the bay, (4) associate the result with the detection report or (5) any combination of the above. In some embodiments, the pre-populated choices for user selection are updated via a remote software update.

In some embodiments, the fail criteria is displayed in a drop-down menu. The fail criteria may be edited by selecting the fail criteria from a rule table and changing a rule parameter.

In some embodiments, disclosed is a method and system for reducing the time it takes for an assay device to verify its connection to a PCB, thus decreasing the time-to-result for an assay device to produce a detection result. The time-to-result is decreased by increasing the frequency impedance is tested at (e.g., 100-1000 kHz).

In some embodiments, disclosed is a method and system for displaying on a graphical user interface (GUI) the status of the assay device. The system and method can include loading the assay cartridge into a detection instrument; establishing an electrical connection between the assay cartridge and the detection instrument; applying a voltage to the assay cartridge; measuring electrical signals to determine impedance values associated with at least two circuits between the assay cartridge and the assay processing device; and sending a command signal to the GUI indicating the status of the assay cartridge and detection instrument. In some embodiments, the command signal includes a GUI that guides the user to run the assay cartridge if the status of the assay cartridge and detection instrument is "pass" or guides the user to eject the assay cartridge if the status of the assay cartridge and detection instrument is "fail." In some embodiments, the GUI guides the user to run the assay by displaying a "run assay" button when the fail criteria factor is "pass." In some embodiments, the GUI guides the user to eject the assay by displaying an "eject" button when the fail criteria factor is "fail."

Examples

Various example embodiments in accordance the disclosed technology are described.

In some example embodiments in accordance with the disclosed technology (example O1), a method for assessing electrical connection integrity of an assay cartridge interfaced with an assay processing device includes establishing an electrical connection between the assay cartridge and the assay processing device; applying a voltage; measuring electrical signals to determine impedance values associated with at least two circuits between the assay cartridge and the assay processing device; analyzing the impedance values to identify (i) a short or (ii) an open caused by a contaminant, wherein, when the impedance values are below a predetermined standard, the assay processing device is electrically connected with assay cartridge.

Example O2 includes the method of example O1, including sending a command signal for initiating an assay procedure when the impedance value is below a predetermined standard.

Example O3 includes the method of example O1, wherein electrodes with high variability are excluded from the evaluation.

Example O4 includes the method of example O1, wherein the assay cartridge includes reagents to assay a panel of respiratory pathogens, central nervous system pathogens, gastrointestinal pathogens, fungal pathogens, HCV pathogens, gram positive bacteria, or gram negative bacteria from a patient sample.

Example O5 includes the method of example O1, wherein the voltage is between 10 kHz and 100 kHz.

Example O6 includes the method of example O1, wherein the voltage is between 100 kHz-1000 kHz.

Example O7 includes the method of example O1, wherein the method does not identify a true open.

Example O8 includes the method of example O1, wherein the contaminant is a liquid.

Example O9 includes the method of example O1, wherein the contaminant is a liquid, solid or a gel.

Example O10 includes the method of example O1, wherein the signal to noise ratio is about 11.

In some example embodiments in accordance with the disclosed technology (example P1), a method for identifying a contaminant on a cartridge interfaced with an assay processing device includes establishing an electrical connection between the assay cartridge and the assay processing device; applying a voltage; measuring electrical signals to determine impedance values associated with at least two circuits between the assay cartridge and the assay processing device; and analyzing the impedance values to identify an open caused by a contaminant wherein, when the impedance values is at and/or above a predetermined standard, the contaminant is on the cartridge.

Example P2 includes the method of example P1, including sending a command signal.

Example P3 includes the method of example P1, including sending a command signal, wherein the command signal is different if an open is detected or not.

Example P4 includes the method of example P1, including sending a command signal, wherein the command signal is the same if an open is detected or not.

Example P5 includes the method of example P1, including sending a command signal, wherein the command signal is to eject the cartridge whether or not an open is detected.

Example P6 includes the method of example P1, wherein four to six electrodes in a row have impedance values above the predetermined standard.

Example P7 includes the method of example P1, wherein four to one hundred electrodes in a row have impedance values above the predetermined standard.

Example P8 includes the method of example P1, wherein the voltage is between 100 kHz-1000 kHz.

Example P9 includes the method of example P1, wherein the method does not identify a true open.

Example P10 includes the method of example P1, wherein the contaminant is a liquid, solid or a gel.

Example P11 includes the method of example P1, wherein the signal to noise ratio is about 11.

Example P12 includes the method of example P1, wherein the command signal (1) indicates that the cartridge has a leak, (2) indicates that the results should be disregarded, (3) indicates that the bay may be compromised, (4) disables the bay, or (5) associates the detection result with a detection report, or (6) associates a fail result with a detection report, or (7) ejects the cartridge, or (8) any combination of the above.

Example P13 includes the method of example P1, wherein the command signal is a signal to an affiliated device informing the affiliated device of the cartridge failure.

Example P14 includes the method of example P1, wherein the command signal is a signal to an affiliated device informing the affiliated device of the cartridge failure, and wherein the affiliated device tracks and monitors all cartridge failures.

Example P15 includes the method of example P1, wherein the assay cartridge includes reagents to assay a panel of one or more of respiratory pathogens, central nervous system pathogens, gastrointestinal pathogens, fungal pathogens, HCV pathogens, gram positive bacteria, and/or gram negative bacteria from a patient sample.

Example P16 includes the method of example P1, wherein the electrical signal is applied at a frequency between 10 kHz and 100 kHz.

In some example embodiments in accordance with the disclosed technology (example Q1), a method for assessing the integrity of an assay cartridge after the assay cartridge has been processed by an assay processing device includes applying a voltage; measuring electrical signals to determine impedance values associated with at least two circuits between the assay cartridge and the assay processing device; and analyzing the impedance values to identify an open caused by a contaminant, wherein, when the impedance values are above a predetermined standard, the assay cartridge integrity has been compromised.

Example Q2 includes the method of example Q1, when the impedance values are below a predetermined standard, the assay cartridge integrity has not been compromised.

Example Q3 includes the method of example Q1, including sending a command signal.

Example Q4 includes the method of example Q1, wherein the voltage is between 100 kHz and 1000 kHz.

Example Q5 includes the method of example Q1, wherein the method does not identify a true open.

Example Q6 includes the method of example Q1, wherein the contaminant is a liquid, solid or a gel.

Example Q7 includes the method of example Q1, wherein the signal to noise ratio is about 11.

Example Q8 includes the method of example Q1, wherein the command signal (1) indicates that the cartridge has a leak, (2) indicates that the results should be disregarded, (3) indicates that the bay may be compromised, (4) disables the bay, or (5) associates the detection result with a detection report, or (6) associates a fail result with a detection report, or (7) eject the cartridge, or (8) any combination of the above.

Example Q9 includes the method of example Q1, wherein the assay cartridge includes reagents to assay a panel of one or more of respiratory pathogens, central nervous system pathogens, gastrointestinal pathogens, fungal pathogens, HCV pathogens, gram positive bacteria, and/or gram negative bacteria from a patient sample.

Example Q10 includes the method of example Q1, wherein the electrical signal is applied at a frequency between 10 kHz and 100 kHz.

In some example embodiments in accordance with the disclosed technology (example R1), an assay processing device includes an electronic unit to electronically interface with a printed circuit board (PCB); an impedance module comprising a signal generator and an impedance measurement device; and an analysis module comprising a processor and memory, wherein the analysis module comprises a qualifier module, wherein the qualifier module comprises a quality factor, wherein, when the quality factor is at or above a predetermined standard, the electronic unit is electrically connected with the PCB.

Example R2 includes the method of example R1, wherein the wherein the analysis module consists of a qualifier module.

Example R3 includes the method of example R1, wherein electrodes with high variability are excluded from the evaluation.

Example R4 includes the method of example R1, wherein the PCB includes reagents to assay a panel of one or more of respiratory pathogens, central nervous system pathogens, gastrointestinal pathogens, fungal pathogens, HCV pathogens, gram positive bacteria, and/or gram negative bacteria from a patient sample.

In some example embodiments in accordance with the disclosed technology (example R5), an assay processing device includes an electronic unit to electronical interface with a printed circuit board (PCB); an impedance module comprising a signal generator and an impedance measurement device; and an analysis module comprising a processor and memory, wherein the analysis module comprises a qualifier module, wherein the qualifier module comprises a quality factor, wherein the quality factor comprises a failure criteria factor and a QOF factor.

In some example embodiments in accordance with the disclosed technology (example S1), a method for processing a patient sample includes (a) loading the sample into a first cartridge; (b) loading the first cartridge into a first bay of a processing device; (c) establishing an electrical connection between the first cartridge and the first bay; (d) applying a voltage; (e) measuring electrical signals to determine impedance values associated with at least two circuits between the first cartridge and the first bay; (f) analyzing the impedance values to identify (i) a short or (ii) an open caused by a contaminant; (g) sending a command signal for ejecting the cartridge from a first bay; (h) loading the first cartridge into a second bay of a processing device; (c) establishing an electrical connection between the first cartridge and the second bay; (d) applying a voltage; (e) measuring electrical signals to determine impedance values associated with at least two circuits between the first cartridge and the second bay; (f) analyzing the impedance values to identify (i) a short or (ii) an open caused by a contaminant; (g) sending a command signal for processing the first cartridge in the second bay.

In some example embodiments in accordance with the disclosed technology (example S2), a method for processing a patient sample includes (a) loading the sample into a first cartridge; (b) loading the first cartridge into a first bay of a processing device; (c) assessing whether first cartridge has a proper electrical connection with the first bay; (d) sending a command signal for ejecting the cartridge from the first bay; (e) loading the first cartridge into a second bay of a processing device; (f) assessing whether the first cartridge has a proper electrical connection with the second bay; (g) sending a command signal for processing the first cartridge in the second bay.

Example S3 includes the method of example S2, wherein assessing whether the first cartridge has a proper electrical connection with the first bay comprises measuring electrical signals to determine impedance values associated with at least two circuits between the first cartridge and first bay and (1) comparing the impedance values to a predetermined standard wherein, when the impedance value is below a predetermined standard, the cartridge is electrically connected with the bay and/or (2) re-ordering the impedance values and determining a quality factor wherein, when the quality factor is at or above a predetermined standard, the assay processing device is electrically connected with the assay cartridge.

In some example embodiments in accordance with the disclosed technology (example T1), a method for assessing electrical connection integrity of an assay cartridge interfaced with an assay processing device includes establishing an electrical connection between the assay cartridge and the assay processing device before the assay cartridge is processed; applying a voltage; measuring electrical signals to determine impedance values associated with at least two circuits between the assay cartridge and the assay processing device; analyzing the impedance values to identify (i) a short or (ii) an open caused by a contaminant; sending a command signal for initiating an assay procedure when the impedance value is below a predetermined standard; after the assay cartridge is processed applying a voltage; measuring electrical signals to determine impedance values associated with at least two circuits between the assay cartridge and the assay processing device; analyzing the impedance values to identify (i) a short or (ii) an open caused by a contaminant; sending a command signal for ejecting the cartridge.

In some example embodiments in accordance with the disclosed technology (example T2), a method for assessing electrical connection integrity of an assay cartridge interfaced with an assay processing device includes (a) measuring impedance before processing the assay cartridge, and (b) measuring impedance after processing the assay cartridge.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

It is intended that the specification, together with the drawings, be considered exemplary only, where exemplary means an example. As used herein, the singular forms "a", "an" and "the" are intended to include the plural forms as well, unless the context clearly indicates otherwise. Additionally, the use of "or" is intended to include "and/or", unless the context clearly indicates otherwise.

The term "about" means encompassing plus or minus 10%. For example, about 90% may refer to a range encompassing, for example, between 81% and 99%. As used herein, the term "about" is synonymous with the term approximately.

The disclosed system and methods address device-centric challenges of physically testing electrical connections between circuit assemblies interfaced to operate an electronic device, such as an assay device. Embodiments of the disclosed methods are necessarily rooted in computer technology to specifically overcome problems arising when connecting two circuit assemblies and improve the functioning of the electronic device by using computerized analytical processing techniques to diagnose malfunctions or inefficiencies and/or dynamically alter an output produced by the electronic device.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described, and other implementations, enhancements and variations can be made based on what is described and illustrated in this patent document.

What is claimed is:

1. A method for assessing the integrity of electrical connections between interfacing electronic devices the method comprising:
   establishing an electrical connection between a first electronic device and a second electronic device;
   measuring impedance values for one or more electrodes on the first electronic device;
   reordering the impedance values to create reordered impedance values; and
   determining a quality factor of the reordered impedance values, wherein if the quality factor is above a predetermined threshold, the first electronic device is electrically connected to the second electronic device.

2. The method of claim 1, wherein the first electronic device is an assay cartridge and the second electronic device is an assay processing device.

3. The method of claim 2, further comprising sending a command signal for initiating an assay procedure when the quality factor is above the predetermined threshold.

4. The method of claim 2, further comprising sending a command signal for ejecting the assay cartridge from the assay processing device when the quality factor is at or below the predetermined threshold.

5. The method of claim 1, wherein determining a quality factor of the reordered impedance values comprises excluding one or more impedance values.

6. The method of claim 1, wherein measuring impedance values comprises applying a voltage to the first electronic device.

7. The method of claim 6, wherein the voltage is 100 kHz.

8. The method of claim 6, wherein the voltage is between 100 kHz-1000 kHz.

9. The method of claim 1, further comprising sending a display command signal for displaying, on a graphical user interface, a verification of the electrical connection between the first electronic device and the second electronic device.

10. A method for assessing the integrity of electrical connections between interfacing electronic devices the method comprising:
    establishing an electrical connection between a first electronic device and a second electronic device;
    measuring impedance values for one or more electrodes on the first electronic device;
    reordering the impedance values to create reordered impedance values; and
    determining a quality factor of the reordered impedance value, wherein if the quality factor is within a predetermined threshold range, the first electronic device is electrically connected to the second electronic device.

11. The method of claim 10, wherein reordering the impedance values comprises matching the impedance values to at least one reference order.

12. The method of claim 11, wherein at least one impedance value is adjusted to fit the reference order.

13. The method of claim 11, wherein the reference order is based on prior impedance values obtained from a previous qualified run on the second electric device or impedance values derived from devices of the same type as the second electronic device.

14. The method of claim 11, wherein the reference order is based on prior impedance values obtained from a previous qualified run on the second electric device and impedance values derived from devices of the same type as the second electronic device.

15. The method of claim 11, wherein the reference order creates a monotonic sequence of the reordered impedance values or does not create a monotonic sequence of the reordered impedance values.

16. The method of claim 11, wherein the reference order is created from the average of the highest and lowest impedance value at each electrode circuit from devices of the same type as the second electronic device.

17. The method of claim 11, wherein when the quality factor is at or below the predetermined threshold range there is an open or short caused by a contaminant.

18. A method for assessing the integrity of electrical connections between interfacing electronic devices the method comprising:
    establishing an electrical connection between a first electronic device and a second electronic device;
    measuring impedance values for one or more electrodes on the first electronic device;
    ordering the impedance values to match at least one reference order wherein the reference order is based on prior impedance values obtained from a previous qualified run on the second electric device or impedance values derived from devices of the same type as the second electronic device;
    determining a command for operating or terminating a procedure using the first electronic device and second electronic device; and
    actuating the first electronic device, the second electronic device or both in accordance with the determined command.

19. The method of claim 18, wherein determining a command for operating or terminating a procedure comprises determining a quality factor, wherein if the quality factor is above a predetermined threshold, the first electronic device is electrically connected to the second electronic device.

20. The method of claim 18, wherein prior to the actuating step determining if additional data should be analyzed.

* * * * *